United States Patent [19]

Hyatt

[11] 4,396,976

[45] Aug. 2, 1983

[54] SYSTEM FOR INTERFACING A COMPUTER TO A MACHINE

[76] Inventor: Gilbert P. Hyatt, 11101 Amigo Ave., Northridge, Calif. 91324

[21] Appl. No.: 291,394

[22] Filed: Sep. 22, 1972

Related U.S. Application Data

[63] Continuation-in-part of Ser. No. 288,247, Sep. 11, 1972, Pat. No. 4,121,284, Ser. No. 246,867, Apr. 24, 1972, Pat. No. 4,310,878, Ser. No. 229,213, Apr. 13, 1972, Pat. No. 3,820,894, Ser. No. 232,459, Mar. 7, 1972, Pat. No. 4,370,720, Ser. No. 230,872, Mar. 1, 1972, Ser. No. 135,040, Apr. 19, 1971, Ser. No. 134,958, Apr. 19, 1971, Ser. No. 101,881, Dec. 28, 1970, abandoned, and Ser. No. 879,293, Nov. 24, 1969, abandoned.

[51] Int. Cl.³ ............................................. G06F 15/46
[52] U.S. Cl. .................................... 364/167; 364/131
[58] Field of Search ............... 364/130, 131–136, 364/167–171, 174, 175, 183, 188, 189, 200 MS File, 900 MS File

[56] References Cited

U.S. PATENT DOCUMENTS

| | | | |
|---|---|---|---|
| 2,897,638 | 8/1959 | Maker | 364/474 X |
| 3,110,865 | 11/1963 | Scuitto | 235/151.11 |
| 3,122,691 | 2/1964 | Centner et al. | 235/151.11 |
| 3,142,820 | 7/1964 | Daniels | 364/200 |
| 3,174,367 | 3/1965 | Lukens | 235/151.11 |
| 3,187,321 | 6/1965 | Kemeny . | |
| 3,283,129 | 11/1966 | Kelling | 235/151.11 |
| 3,308,279 | 3/1967 | Kelling | 235/151.11 |
| 3,312,884 | 4/1967 | Gabor | 235/151.11 |
| 3,315,235 | 4/1967 | Carnevale et al. | 340/172.5 |
| 3,324,458 | 6/1967 | MacArthur | 340/172.5 |
| 3,346,853 | 10/1967 | Koster . | |
| 3,349,229 | 10/1967 | Evans | 235/151.11 |
| 3,389,404 | 6/1968 | Koster . | |
| 3,406,379 | 10/1968 | Palevsky . | |
| 3,462,742 | 8/1969 | Miller et al. | 364/200 |
| 3,465,298 | 9/1969 | Duke et al. | 364/200 |
| 3,548,172 | 12/1970 | Centner et al. | 364/200 |
| 3,566,365 | 2/1971 | Rawson . | |
| 3,569,814 | 3/1971 | Rosenberg | 364/107 |
| 3,573,738 | 4/1971 | Bottles et al. | 364/107 |
| 3,582,749 | 6/1971 | Wenzel | 318/571 |
| 3,587,044 | 6/1971 | Jenkins | 364/200 |
| 3,593,313 | 7/1971 | Tomaszewski | 364/200 |
| 3,596,256 | 7/1971 | Alpert . | |
| 3,602,994 | 9/1971 | Layman | 318/571 |
| 3,612,841 | 10/1971 | Kosem et al. | 235/151.11 |
| 3,626,385 | 12/1971 | Bouman | 340/172.5 |
| 3,629,560 | 12/1971 | Slawson | 364/107 |
| 3,633,011 | 1/1972 | Bederman et al. | 340/172.5 |
| 3,634,662 | 1/1972 | Slawson | 340/172.5 X |
| 3,634,664 | 1/1972 | Valek | 235/151.11 |
| 3,636,525 | 1/1972 | Inaba et al. | 340/172.5 |
| 3,646,522 | 2/1972 | Furman | 364/200 |
| 3,656,377 | 4/1972 | Kosem | 235/151.11 |
| 3,665,493 | 5/1972 | Glowzewski | 235/151.11 |
| 3,668,503 | 6/1972 | Lindner | 318/665 |
| 3,668,653 | 6/1972 | Fair et al. | 340/172.5 |
| 3,671,727 | 6/1972 | Rhoades | 235/151.11 |
| 3,684,873 | 8/1972 | Meyer et al. | 235/151.11 |
| 3,686,556 | 8/1972 | Anger et al. | 318/595 |
| 3,686,639 | 8/1972 | Fletcher et al. | 340/172.5 |
| 3,699,317 | 10/1973 | Middleditch | 235/151.11 |
| 3,701,888 | 10/1972 | McDaniel | 235/150.1 |
| 3,701,888 | 10/1972 | McDaniel . | |
| 3,702,989 | 11/1972 | Haney | 364/200 |
| 3,715,938 | 2/1973 | Ledergerber et al. | 235/151.11 |
| 3,720,120 | 3/1973 | Cutler | 235/151.11 |
| 3,731,177 | 5/1973 | Commander et al. | 318/603 |
| 3,739,158 | 6/1973 | Woodward | 235/151.11 |
| 3,745,532 | 7/1973 | Erwin | 445/1 |
| 3,746,845 | 7/1973 | Henegar et al. | 235/151.11 |
| 3,818,303 | 6/1974 | Rossel | 235/151.11 X |

OTHER PUBLICATIONS

Koster: "A Stored Program Display Console: Bunker Ramo Model 90" Sixth National Symposium on Information Display; Society For Information Display 1965.
Bauer et al: "DODDAC–An Integrated system for Data Processing, Interrogation, and Display"; Proceedings of the Eastern Joint Computer Conf; Dec. 12–14, 1961.
Booth and Booth; Automatic Digital Calculations (1953).
Computerized NC–A Step Toward the Automated Factory, by Budzilovich, Control Engineering, Jul. 1969, pp. 62–68.
Microprogramming Handbook by Microdata, 1971 pp. 208, 278 and 279.
"Three Machine Tool Shows–or Were They Control Show?" in *Control Engineering* Nov. 1970; pp. 53–56.
Mesniaeff, P. G.; "The Technical Ins and Outs of computerized Numerical Control" in *Control Engineering*, Mar. 1971; pp. 65–84.
"Microprogrammable Digital Computer" by Micro Systems Inc., *Computer Design*, May 1969, p. 69.
"Introduction to Microprogramming Concepts" by Micro Systems Inc. 14 pp., Apr. 18, 1969.
Hopkins–"Electronic Navigator Charts Man's Path to the Moon"–Electronics, Jan. 1967, pp. 109–118.
Levy–"System Utilization of LSI"–IEEE, vol. EC–16, No. 5, Oct. 1967, pp. 562–566.
Beelitz et al.–"System Architecture for LSI"–AFIPS Conf. Proc., vol. 31, Nov. 14–16, 1967, pp. 185–200.
Boysel–"Adder on a Chip"–LSI Helps Reduce Cost of Small Machine", Electronics–Mar. 1968, pp. 119–124.
Miller–"Microcircuits Boost Minuteman Capability'-'–Aviation Week & Space Tech., Oct. 1963, pp. 70–87.
Potter et al.–"Integrated Scratch Pads Give New Generation of Computers", Electronics–4/66–pp. 119–126.

*Primary Examiner*—Joseph F. Ruggiero
*Attorney, Agent, or Firm*—Gilbert P. Hyatt

[57] ABSTRACT

A machine control system employs a general purpose digital computer to directly interact with a machine, providing increased versatility and capability with reduced system cost. Machine control operations are performed under program control by the computer in real time and communicated to the machine through a minimal interface. Machine conditions are sampled under program control by the computer in real time through a minimal interface to the computer. Special system partitioning reduces interconnections and cabling to provide an improved machine interface.

50 Claims, 19 Drawing Figures

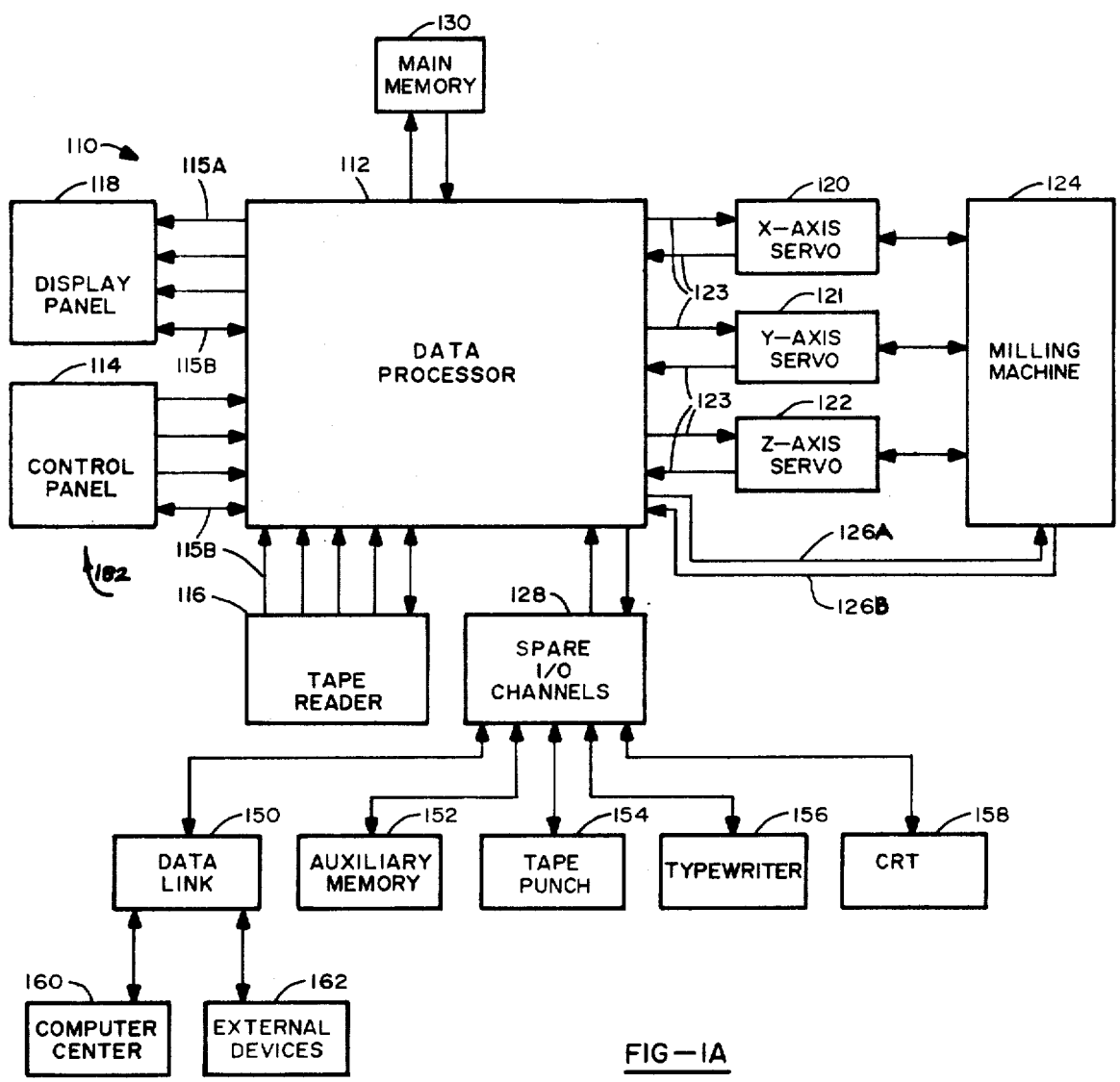
FIG—1A
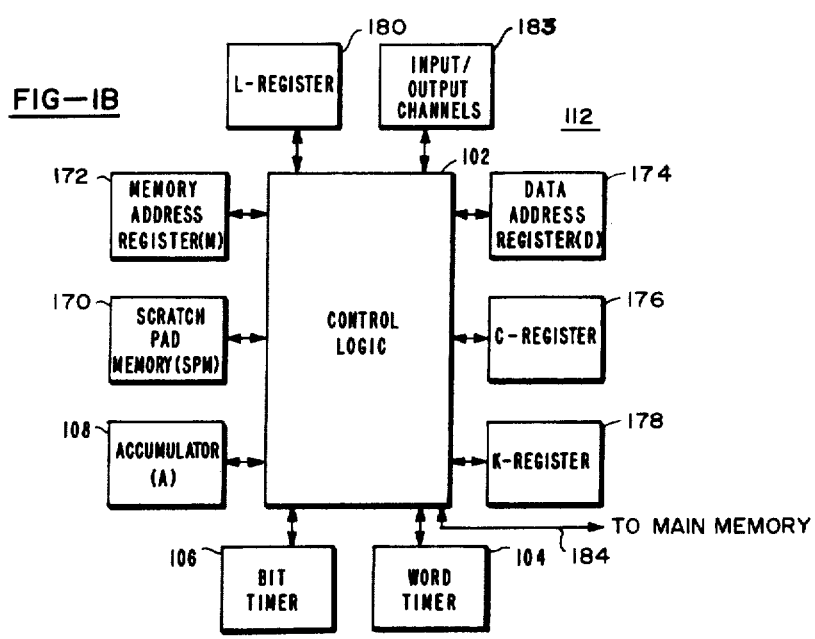
FIG—1B

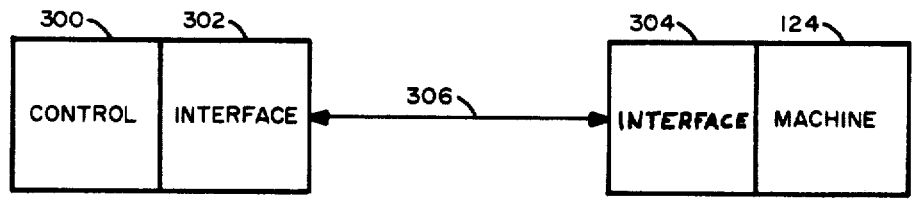
FIG—3A
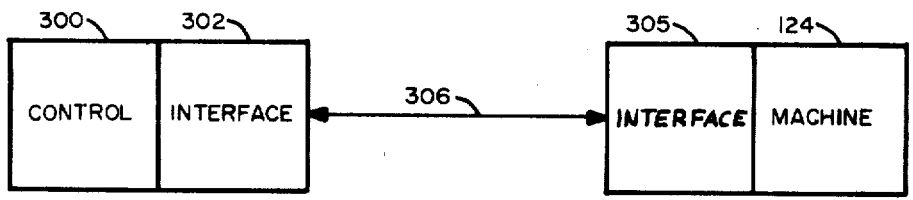
FIG—3B
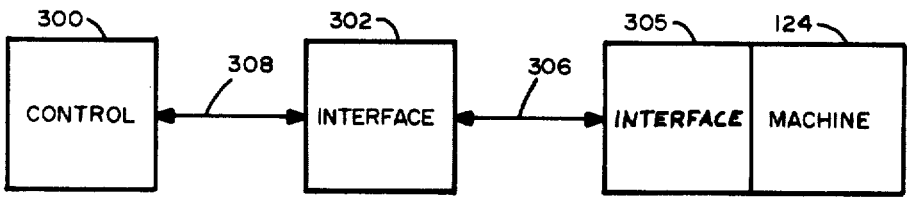
FIG—3C
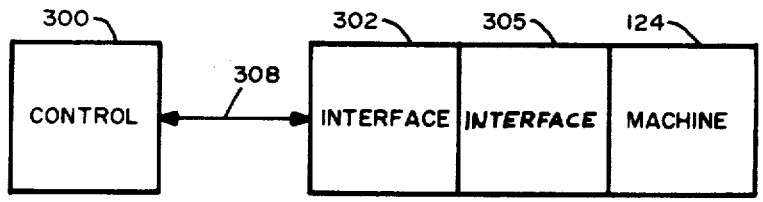
FIG—3D
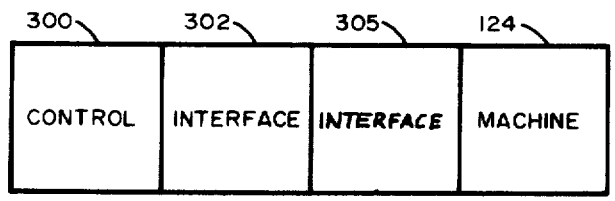
FIG—3E
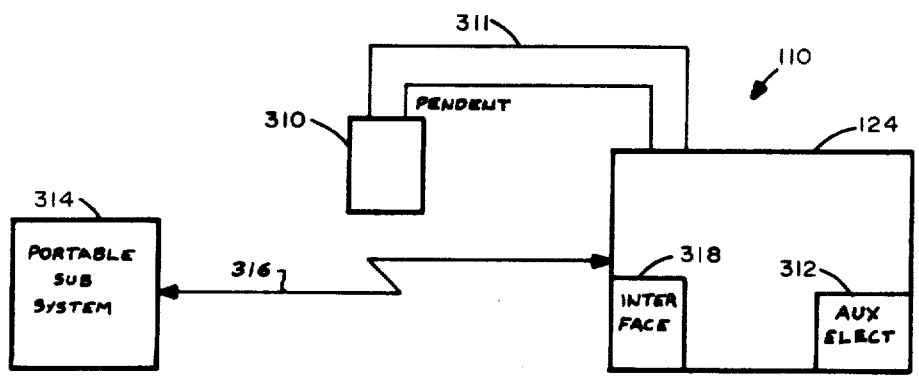
FIG—3F

SYSTEM FOR INTERFACING A COMPUTER TO A MACHINE

CROSS REFERENCE TO RELATED APPLICATIONS

This application is a continuation-in-part of the chain of parent applications:
1. METHOD AND APPARATUS FOR PROCESSING THE DIGITAL OUTPUT OF AN INPUT MEANS Ser. No. 879,293 filed on Nov. 24, 1969 now abandoned in favor of continuing applications;
2. FACTORED DATA PROCESSING SYSTEM FOR DEDICATED APPLICATIONS Ser. No. 101,881 filed On Dec. 28, 1970; proceedings therein having been terminated;
3. CONTROL SYSTEM AND METHOD Ser. No. 134,958 filed on Apr. 19, 1971;
4. CONTROL APPARATUS Ser. No. 135,040 filed on Apr. 19, 1971;
5. APPARATUS AND METHOD FOR PRODUCING HIGH REGISTRATION PHOTO MASKS Ser. No. 229,213 filed on Apr. 13, 1972 now U.S. Pat. No. 3,820,894 issued on June 28, 1974;
6. MACHINE CONTROL SYSTEM OPERATING FROM REMOTE COMMANDS Ser. No. 230,872 filed on Mar. 1, 1972; and issuing cotemporaneously with the instant application;
7. COORDINATE ROTATION FOR MACHINE CONTROL SYSTEMS Ser. No. 232,459 filed on Mar. 7, 1972 now U.S. Pat. No. 4,370,720 issued on Jan. 25, 1983;
8. DIGITAL FEEDBACK CONTROL SYSTEM Ser. No. 246,867 filed on Apr. 24, 1972 now U.S. Pat. No. 4,310,878 issued on Jan. 12, 1982; and
9. COMPUTERIZED SYSTEM FOR OPERATOR INTERACTION Ser. No. 288,247 filed on Sept. 11, 1972 now U.S. Pat. No. 4,121,284 issued on Oct. 17, 1978:

all by Gilbert P. Hyatt:
wherein the benefit of the filing dates of this chain of parent applications is herein claimed in accordance with 35 USC 120 and other authorities provided therefore: and
wherein said parent applications and the patents issuing thereon are herein incorporated by reference.

Said parent application Ser. No. 232,459 contains extensive disclosures on the data processor preferred embodiment originally disclosed in said parent application Ser. No. 101,881.

The instant application is related to applications:
10. DIGITAL ARRANGEMENT FOR PROCESSING SQUAREWAVE SIGNALS Ser. No. 302,771 filed on Nov. 1, 1972;
11. APPARATUS AND METHOD FOR PROVIDING INTERACTIVE AUDIO COMMUNICATION Ser. No. 325,933 filed on Jan. 22, 1973 now U.S. Pat. No. 4,016,540 issued on Apr. 5, 1977;
12. ELECTRONIC CALCULATOR SYSTEM HAVING AUDIO MESSAGES FOR OPERATOR INTERACTION Ser. No. 325,941 filed on Jan. 22, 1973 now U.S. Pat. No. 4,060,848 issued on Nov. 29, 1977;
13. DIGITAL SIGNAL PROCESSOR FOR SERVO VELOCITY CONTROL Ser. No. 339,817 filed on Mar. 9, 1973 now U.S. Pat. No. 4,034,276 issued on July 5, 1977;
14. CONTROL SYSTEM AND METHOD Ser. No. 339,688 filed on Mar. 9, 1973;
15. DATA PROCESSOR HAVING INTEGRATED CIRCUIT MEMORY REFRESH Ser. No. 402,520 filed on Oct. 1, 1973;
16. COMPUTERIZED MACHINE CONTROL SYSTEM Ser. No. 476,743 filed on June 5, 1974 now U.S. Pat. No. 4,364,110 issued on Dec. 14, 1982; and
17. HIGH REGISTRATION PHOTOMASK METHOD AND APPARATUS Ser. No. 752,751 filed on Dec. 20, 1976 now U.S. Pat. No. 4,120,583 issued on Oct. 17, 1978;

all by Gilbert P. Hyatt.

The instant application is further related to applications:
18. INTERACTIVE CONTROL SYSTEM by Barry T. Lee, Ralph V. Cole, Irving Hirsch, Gilbert P. Hyatt, and Gunther W. Wimmer Ser. No. 101,449 filed on Dec. 28, 1970; and abandoned in favor of continuing applications; and herein incorporated by reference and
19. INTERACTIVE CONTROL SYSTEM by Barry T. Lee, Ralph V. Cole, Irving Hirsch, Gilbert P. Hyatt, and Gunther W. Wimmer Ser. No. 354,590 filed on Apr. 24, 1973 now U.S. Pat. No. 4,038,640 issued on July 26, 1977.

Certain of said related applications that have matured or are maturing into U.S. patents have the same disclosure as-filed as contained in certain of said parent and related applications:
wherein said related application Ser. No. 402,520 has the same disclosure as-filed as said parent application Ser. No. 101,881;
wherein said related application Ser. No. 339,817 now U.S. Pat. No. 4,034,276 had the same disclosure as-filed as said parent application Ser. No. 135,040; and
wherein said related application Ser. No. 354,590 now U.S. Pat. No. 4,038,640 had the same disclosure as-filed as said parent application Ser. No. 101,449;
wherein said related applications Ser. No. 402,520; Ser. No. 339,817; and Ser. No. 354,590 having the same disclosures as-filed as said parent applications thereof Ser. No. 101,881; Ser. No. 135,040; and Ser. No. 101,449 respectively were filed as PTO Rule 60 continuing applications thereof;
wherein the PTO had copied the disclosures of said parent applications thereof Ser. No. 101,881; Ser. No. 135,040; and Ser. No. 101,449 to obtain the disclosures as-filed for related applications Ser. No. 402,520; Ser. No. 339,817; and Ser. No. 354,590 respectively in accordance with said PTO Rule 60; and
wherein said U.S. Pat. Nos. 3,820,894; 4,121,284; 4,364,110; 4,310,878; 4,034,276; and 4,038,640 have been provided to the U.S. Patent and Trademark Office for being included in the file wrapper of the instant application.

Certain of said parent applications have been partially incorporated in continuing applications therefrom;
wherein said parent application Ser. No. 101,881 has been partially incorporated in said parent application Ser. No. 232,459 and now issuing as a U.S. Patent;

wherein said parent application Ser. No. 134,958 has been partially incorporated in said parent application Ser. No. 246,867 now U.S. Pat. No. 4,310,878; and wherein said parent application Ser. No. 230,872 has been partially incorporated in said related application Ser. No. 476,743 now U.S. Pat. No. 4,364,110.

One skilled in the art will be able to combine the disclosures in said applications that are incorporated by reference with the disclosure in the instant application from the disclosures therein and the disclosures herein.

BACKGROUND OF THE INVENTION

1. Field of the Invention

This invention relates to computerized control systems and, more particularly, to numerical control systems for machines.

2. Description of the Prior Art

Machine automation has been widely used in the prior art such as with numerical controls for machine tools. These prior art controls are special purpose (non-computerized) devices with solid state electronics, relays, and other such devices; but without stored program digital computers. The special purpose devices do not fully utilize time sharing, therefore requiring special circuitry for each function implemented, resulting in a large number of expensive circuits each performing a special purpose function. For the numerical control of machine tools, these special purpose controls have been standardized for use with many different machines. The requirements of each type of machine are usually different, requiring a different interface to convert the standard control system signals into the special signals required by the machine. This interface is usually implemented with relays and mounted on the machine as an integral part of the machine, commonly known in the art as "the machine magnetics" or simply "the magnetics". The magnetics have been accepted in the numerical control field as a necessary part of the system, where the need for magnetics is not disputed in the prior art.

For numerical control systems that control machine tools, digital commands are input with a punched tape to describe the part to be cut on the machine such as a milling machine. These commands are accessed by the numerical control system and are executed to drive the machine to automatically cut the part.

Prior art numerical control systems have been designed around special purpose digital devices where operations such as logic, control, and computations are performed with special purpose logic. Because of the high cost and limited capability of these special purpose numerical control systems, the data is preprocessed with a remote, large scale computer using a parts program complier such as APT. The remote computer preprocesses the information and generates a punched tape in a control oriented language (EIA) containing the initial conditions and commands required by the special purpose numerical control equipment. These parts program tapes describe the part to be generated and are used as the command inputs to the numerical control system to cut the part.

Well known documents on numerical control are listed below and are incorporated herein by reference.

(1) Numerical Control by Nils O. Olesten for John Wiley and Sons.

(2) Numerical Control Users Handbood by Leslie for McGraw Hill (1970).

(3) Numerical Control, Practice and Applications by William J. Patton for Reston Publishing Company (1972).

(4) Automation Bulletin No. 3B Glossary of Terms For Numerically Controlled Machines by the Electronic Industries Association (1965) New York. N.Y.

(5) Interchangeable Perforated Tape Variable Block Format for Contouring and Contouring/Positioning Numerically Controlled Machine Tools (RS-274-A) by the Electronic Industries Association (1965) New York, N.Y.

SUMMARY OF THE INVENTION

The present invention provides an improved control system for physical systems such as machines and processes. The term physical system is intended to be illustrative of the broad scope of the present invention, where the present invention may be used to provide a broad variety of control arrangements. In a preferred embodiment, numerical control of a milling machine is used to exemplify the broader teachings and applicability of the present invention. Further, the term machine as employed herein broadly refers to any device performing work such as machine tools, process valves, optical devices, temperature regulators, motors, fluid controllers, etc. Still further, it should be recognized that machines are well known in the art and may take any of a variety of forms further including a vehicle such as an automobile and a structure for doing work. The teachings of the present invention are fully applicable to such other forms of machines as will become obvious to those skilled in the art from the teachings of the present invention.

The present invention provides an improved control system incorporating a stored program digital computer to perform control operations in conjunction with the physical system. The computer performs operations that were assigned to special purpose circuitry in prior art control systems and the computer performs operations that were assigned to special purpose relay logic such as in the prior art machine systems. Special purpose interfaces that are used in the prior art are eliminated, where the computer performs most of those prior art interface operations under program control and communicates with the physical system through an elemental interface. These improvements provide low cost by eliminating special purpose circuitry, flexibility by implementing interface operations in a stored program computer under program control thereby permitting ease of modification and improved capability by utilizing the computational power of a general purpose digital computer to provide interface operations.

The present invention provides an improved and simplified electronic data processing system which performs the necessary data processing functions at least as well as prior art non-computerized systems but which, because of its simplicity and inexpensive cost, is suitable for use in applications for which, because of economic reasons, the benefits of electronic data processing systems were previously unavailable. In particular, this invention presents a simple, inexpensive system and method to provide computerized capability for numerical control applications. It should be understood that any reference to such a numerical control system is intended to include any system wherein digital data processing capability is provided for control of a physical system such as a machine or a process. The particular system discussed herein is one class of such devices.

The preferred embodiment of this invention is a class of advanced, low cost nmerical control systems containing a general-purpose (stored program) digital data processor for high levels of capability and versatility. A computerized numerical control system can be provided at each machine for versatility and economy, where this system is cost competitive with prior art non-computerized systems. This system operates in conjunction with the machine in real time to provide self-contained data processing capability, where one computer per machine can be provided, "dedicated" to the individual machine on a stand-alone basis. Major assemblies in this system include a general purpose digital computer and can include an operator panel, memory, CRT display, servos, tape reader, power supply, and other equipment. The computer system of this invention includes a computer integrated into the system for versatility, economy, and performance. For example, the machine interface is integrated into the control system as an extension of the computer I/O section. This I/O section is physically partitioned so that many of the interface functions normally performed in a computer I/O are physically contained in an elemental machine interface. This system operates under program control where data processing, control, sensing, and other such functions are handled under program control by the computer. The executive routine permits time-share operation and self-contained diagnostics. Therefore, the system can be conveniently upgraded to incorporate additional features, primarily by reprogramming the computer.

In accordance with one of the features of the present invention it is recognized that in many computer applications such as the above-described dedicated computer system, because of the high speed at which the dedicated data processor subsystem performs its computations, only a fraction of the computer's time is required to perform the computational functions. With the system architecture of this invention, the prior art machine interface unit can be eliminated and the data processor subsystem can perform the functions previously performed by machine interface units under control of its stored program during those portions of its operating cycle which are not required for the primary computational task. Thus, the data processor subsystem performs not only the computational task, but also real time communication tasks and control tasks associated with the machine and machine interface.

In accordance with this feature of the present invention, an electronic data processing system is provided which includes a plurality of subsystems, one of which is a stored program data processor subsystem which performs computations in response to its stored program in a first signal format which is intrinsic to the data processor. At least one machine subsystem is provided which utilizes time-varying signals in a second signal format different from the first signal format of the data processor. The data processor, in response to its stored program, communicates on a real time basis with the machine subsystem in the second or machine subsystem signal format and performs any necessary conversions or preprocessing of rudimentary signals received from the machine subsystem prior to the performance of the primary computational task with respect to the data contained in those rudimentary signals, all under control of the stored program. Computerized capability is provided at a price competitive with prior art non-computerized systems, qualifying computerized numerical control (CNC) on only one machine. A major portion of the machine shop budget and production capability does not have to be committed to a limited capability, expensive central DNC multi-machine control computer. Capability includes complex contouring with linear, circular, and parabolic curves; curve fitting; automatic fairing contours; six axes of simultaneous contouring; digital resolution of 50 millionths (0.000 050) inch; departure range of 99.999 950 inches; contouring velocities of 1,200 inches per minute; and other features. Also provided are closed-loop DC servos with resolver feedback; INDUCTOSYN (FERRAND SCALE) feedback; full absolute position feedback with multi-speed pickoffs and other features.

Special features include automatic tool change with up to 99 tool offsets in core memory, spindle speed control, constant cutter chip load, and adaptive feeds and speeds. Tool history is automatically recorded for preventative maintenance. Thread cutting with direct IPR and RPI (pitch) feedrate programming is provided for lathes, and cutter compensation is available for milling and grinding machines.

Numerical control systems typically accept parts programs from a punched tape reader. The system of this invention provides access to parts programs from a tape reader, remote large-scale computer, internal memory, or other sources of parts programs. The input data format meets the requirements for "interchangeable perforated tape" as defined in EIA Standard RS-274. Block search and buffer memory features are provided. Data can be entered in either absolute or incremental coordinates, G code selectable, with the capability to mix both coordinate schemes in the same block of commands. Addressing is either variable block or tab sequential. Direct feedrate programming is standard. Full range floating zero and zero offsets are redefinable from the parts program. Other parts programming features include an unlimited number of M and G commands contained in one block, editing symbols such as decimal points, command sequence at the parts programmers convenience, and a full circle programmable in one block of commands.

This dedicated computer system includes a computer integrated into the system for versatility, economy, and performance. This system is under program control; where control, display, data processing, contouring, and machine control functions are handled under program control by the computer.

System checkout uses the computer to automatically check its own operation and the operation of the peripheral equipment including use of diagnostic routines, check-sum, and computer iteration timer. System self-check is accomplished under automatic computer control to verify system operation and isolate malfunctions. Self-check and system test programs are included, where these routines are executed upon system turn-on to verify operation or isolate malfunctions and provide continual system checkout and validity checks during system operation.

Prior art systems use remote computers to process parts program information, but have used local, non-computerized control systems for real time machine control operations. Problems associated with using a remote computer and the limitations of a non-computerized numerical control system have greatly limited their effectiveness. The system of this invention provides a local, dedicated computer contained in the numerical control system for performing the real time machine control functions such as contour interpolation, sequencing a spindle on or off, and other such machine control functions.

The data processor 112 can communicate with other subsystems through the spare I/O channels 128. The machine 124 is controlled with multiple axis servos 120, 121, and 122 operating from data processor real time command signals 123 and is controlled with various auxiliary command signals 126. These command signals are provided by the data processor 112 which accesses a parts program and computes the command signals required to command the machine 124 to execute the parts program.

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in parent application Ser. No. 134,958; and machine response time such as for tool change and spindle speed change requirements. These machine command requirements place a real time operation constraint on the data processor 112.

An object of this invention is to provide a practical computerized system to control a machine.

A further object of this invention is to provide an arrangement to eliminate interface electronics for control of a physical system.

A further object of this invention is to provide a versatile machine control.

Still a further object of this invention is to provide an improved partitioning arrangement for automatic control of a physical system.

The foregoing and other objects, features, and advantages of this invention will be apparent from the following detailed description of preferred embodiments of this invention, as illustrated in the accompanying drawings.

BRIEF DESCRIPTION OF THE DRAWINGS

A better understanding of the invention may be had from a consideration of the following detailed description, taken in conjunction with the following drawings.

FIG. 1 comprises FIGS. 1A and 1B, wherein FIG. 1A is a block diagram of the system and FIG. 1B is a block diagram of the data processor shown in FIG. 1A.

FIG. 3 is a diagram of system partitioning arrangements comprising FIGS. 3A-3F showing alternate partitioning embodiments.

FIG. 5, comprising FIG. 5A illustrates the manner in which FIGS. 5B and 5C are connected.

FIG. 8 shows program flow diagrams of sysstem operations comprising FIGS. 8A, 8B, and 8C wherein

FIG. 9, comprising FIG. 9A shows a first partitioning embodiment and FIG. 9B shows a second partitioning embodiment.

DETAILED DESCRIPTION OF THE INVENTION

Figure 2:
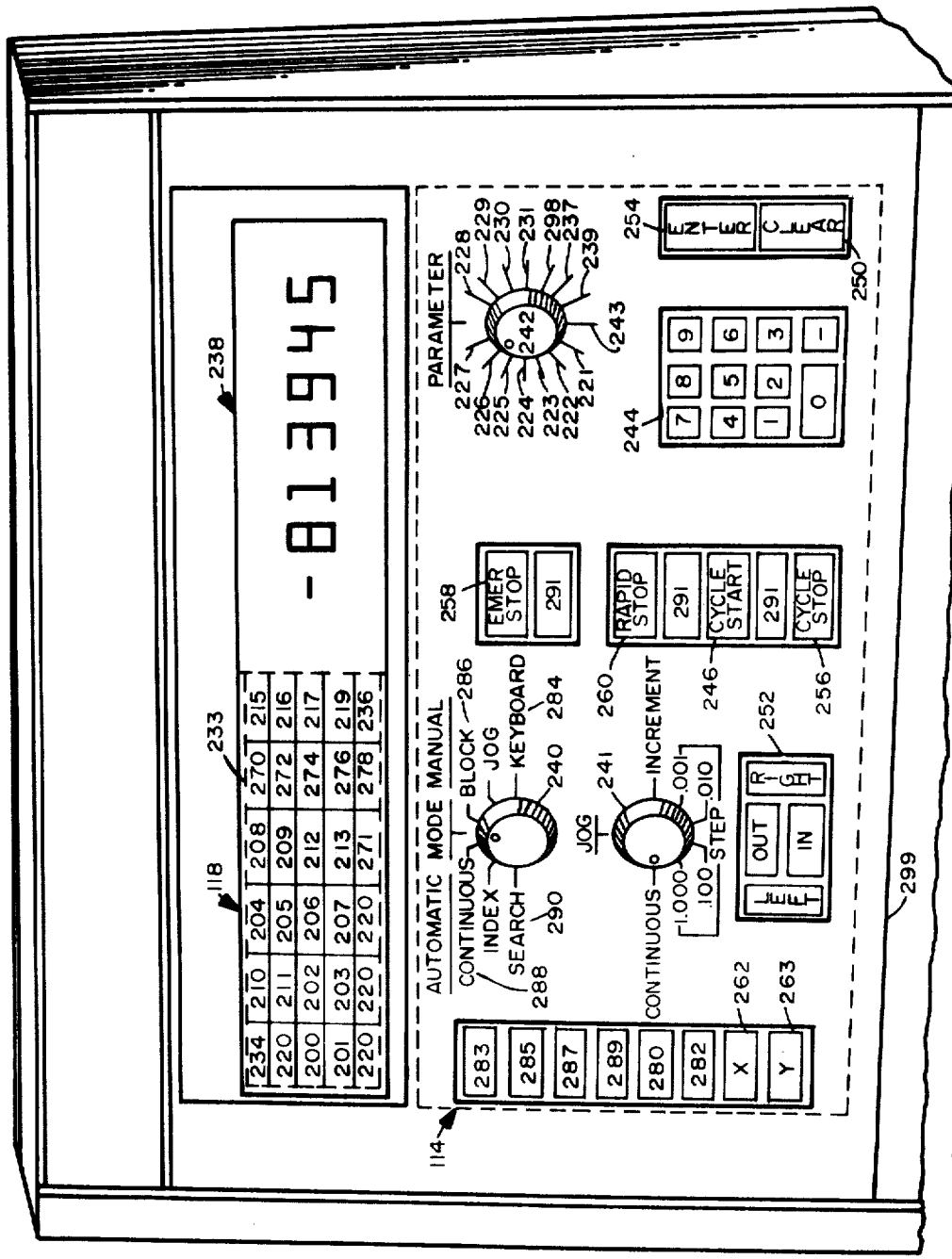
FIG. 2 is a diagram of the control and display panel.

The machine control system of this invention can take any of a number of possible forms. A preferred embodiment of the present invention is shown in FIG. 1A and will be described in detail hereafter.

By way of introduction of the illustrated embodiment, the components shown in FIGS. 1 through 9 of the drawings have been assigned general reference numerals and a brief description of such components is given in the following description. The components in each figure have in general been assigned three digit reference numerals wherein the hundreds digit of the reference numerals corresponds to the figure number. For example, the components in FIG. 1 have reference numerals between 100 and 199 and the components in FIG. 2 have reference numerals between 200 and 299 except that the same component appearing in successive drawing figures has maintained the first reference numeral.

This application is a continuation-in-part of parent applications Ser. No. 101,881 and Ser. No. 232,459 and Computerized Numerical Control System and relates more specifically to the machine control capability which may be achieved by applying the general teachings of the parent applications to the specific context of a machine control system.

The elements in FIG. 1A are either described in detail in the copending patent applications or are well known elements. The system 110 is described in the parent application Factored Data Processing System for Dedicated Applications at pages 1-16. Data processor 112 is described in detail in the parent application Factored Data Processing System for Dedicated Applications at pages 16-18 and 34-102. Input/output channels such as auxiliary channels 128 are described in detail in the parent application Factored Data Processing System for Dedicated Applications such as at pages 83-84. Tape reader 116 is described in detail in the parent application Factored Data Processing System for Dedicated Applications such as at page 32. Operator panel 182, comprising control panel 114 and display panel 118, is described in detail in the parent application Factored Data Processing System for Dedicated Applications at pages 19-31 and in the copending patent application Interactive Control System at pages 1-19. Servos 120-122 are described in the parent applications Factored Data Processing System for Dedicated Applications at pages 32-34 and 84-88, Control System and Method at pages 1-23, and Control Apparatus at pages 1-33. These disclosures are provided in detail in the copending applications and are incorporated herein by reference. Other elements such as data link 150, auxiliary memory 152, tape punch 154, typewriter 156, CRT 158, computer center 160 and various external devices 162 are well known in the art.

As shown in FIG. 14, the data processing system includes a data processor subsystem 112, a plurality of input and output peripheral subsystems through which input information is supplied to the data processor 112 and from which the output signals from data processor 112 are applied to output subsystems which the system 110 is controlling, and a main memory 130 in which the stored program of the data processor 112 is located. As is described in detail hereafter, this stored program is used to control not only the computational processes in data processor 112, but also the communication in the system 110 between the data processor 112 and the various other subsystems.

Since the data processing system 110 has been shown as a numerical control system for controlling a milling machine 124, input and output peripheral subsystems have been described which are suitable to perform this desired control function in parent application Ser. No. 101,881. However, those skilled in the art will readily recognize that the numerical control system is merely illustrative of the present invention and the principles of the invention are equally applicable to other machine control and process control systems in which different forms of input and output peripheral subsystems might be used to perform the particular task of such other systems.

Commands and displays may be provided with the control panel 114 and the display panel 118 using switches and displays illustrated in FIG. 2 and using spare switches and displays described in parent application Ser. No. 101,881 and related application Ser. No. 101,449. Still further capability is provided with the auxiliary input/output channels 128 described in parent application Ser. No. 101,881. These auxiliary input/output channels 128 provide access to alternate elemental extremities and peripherals as is discussed in greater detail hereafter.

Figure 4:
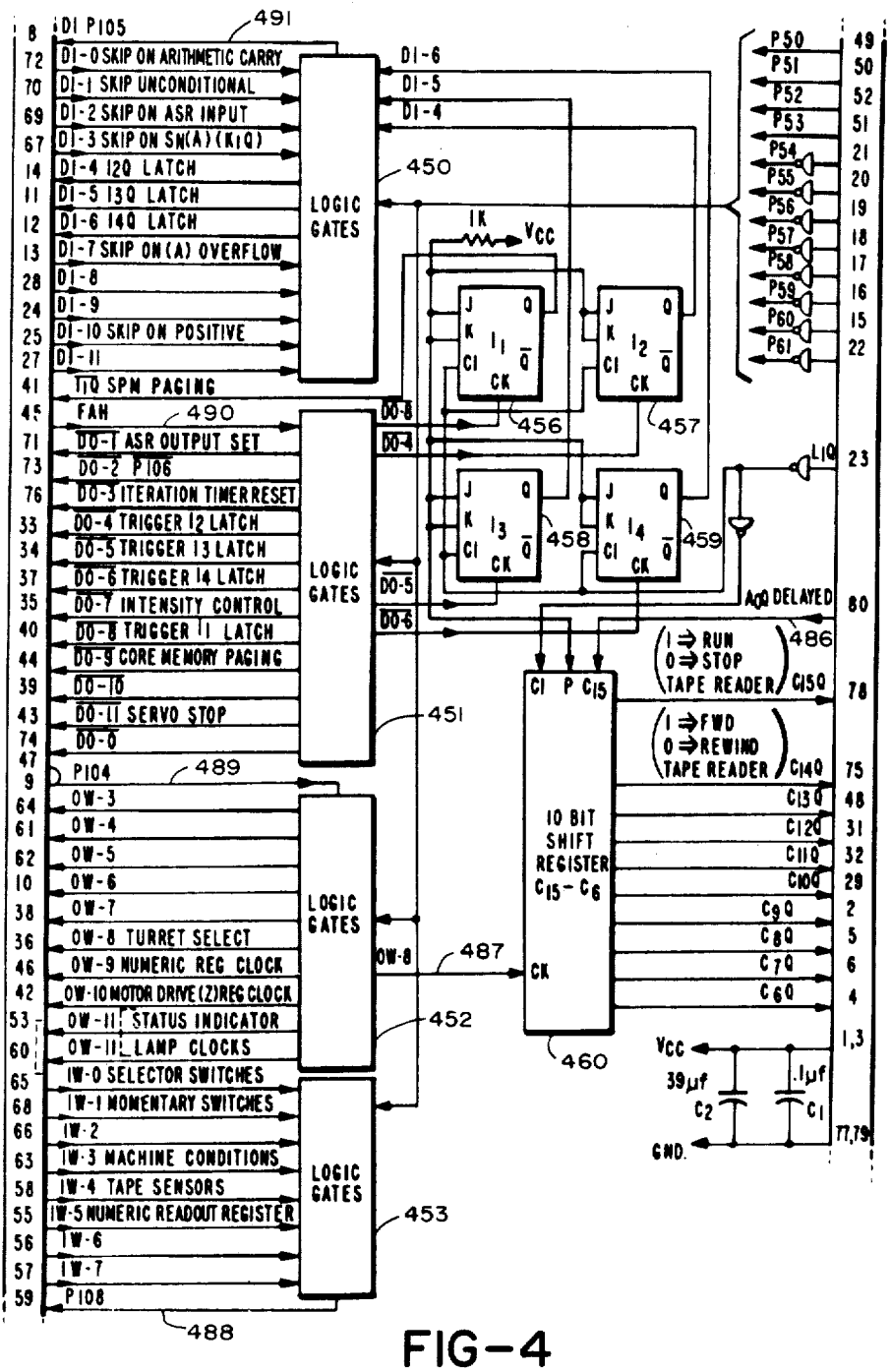
FIG. 4 is a schematic and block diagram representation of the IFA-1 circuit board.

FIGS. 1A, 1B and 2 of this application are generally the same as FIGS. 1, 4, and 2 in parent application Ser. No. 101,881, and FIGS. 4, 5, and 6 of this application are generally the same as FIGS. 13, 14, and 15 in parent application, Ser. No. 101,881; with minor changes such as with the reassignment of reference numerals to make those figures compatible with the form of this application.

The system of this invention will now be described, where parent application Ser. No. 232,459 provides the preferred embodiment of this invention. The system 110 is shown in FIG. 1A. The data processor 112 communicates with the control panel 114 and the display panel 118 over signal lines 115. The primary function of the main memory 130 is to contain the stored program for the data processor 112. In one embodiment, this main memory is a core memory and is also used to store a parts program. The tape reader 116 is primarily used to load a parts program. In one mode of operation, this tape reader 116 is used to access the parts program for execution by the data processor 112 to control the machine 124. In another mode of operation, this tape reader 116 is used to access the parts program for loading a parts program memory, which may be a portion of the main memory 130 or auxiliary parts program memory.

The data processor 112 may be any well known data processor arrangement such as a well known mini-computer; but, in a preferred embodiment, is the data processor described in detail in the parent application, Factored Data Processing System for Dedicated Applications. Because the specific data processor architecture is not a part of the invention described and claimed herein, the detailed design of the data processor will not be described herein, but is incoporated by reference from the parent application Factored Data Processing System for Dedicated Applications.

Computer programming techniques are well known in the prior art. Programs may be defined in a descriptive text form, in a compiler language such as Fortran, in an assembler language, or directly in the "machine language" of a particular computer. For illustrative purposes, flow charts are widely used to define computer programs. For simplicity of illustration, the program operations associated with one embodiment of this invention are exemplified with descriptions and flow charts. These descriptions and flow charts are in a form well known in the programming art and may be converted to other programming descriptions such as compiler, assembler, and machine languages by those skilled in the programming art. Such well known programming techniques are described in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference.

Prior art systems typically use remote computers to process numerical control data and use local, non-computerized systems for real time operations. Problems associated with using a remote computer and the limitations of non-computerized local numerical control systems have greatly limited their effectiveness. The system of this invention provides a local, dedicated computer contained in the system for performing real time machine control operations.

Terminology used in this description now will be defined to more clearly illustrate the intended meaning.

The terms "off-line" and "stand-alone" are terms that refer to the operation of a device in a self contained manner such as a prior art peripheral, without the requirement for interaction with the data processor in real time under program control.

The term "word" is intended to mean a generalized parameter comprising a plurality of digital bits or other conditions and may relate to letters, numbers, conditions, and combinations of the foregoing.

The term "computer" as used herein is intended to mean a stored program digital data processor. This includes the well known prior art general purpose digital computers such as mini-computers, but also includes the monolithic data processor and factored data processor disclosed herein and the extension of these data processor concepts to higher levels of integration; where the computer may be distributed throughout the system and may be physically and operationally associated with an extremity of the system, or the computer may be merged to such a degree that the component computer parts are individually indistinguishable.

A dedicated computer system may be dedicated to one or more tasks which may include a prime task such as numerical control, payroll processing, or calculator processing and one or more sub-tasks such as controlling extremities. Also, the data processor need not maintain its physical or operational identity. This invention is not limited to a single computer but may include a plurality of computers associated with various portions of the prime task and sub-tasks.

A data processing system can be structured with (1) extremities that may have a physical size and form and 2) monolithic data processors that may have relative nconsequential size and form; where the data processors can be totally distributed to the extremity for performance of the functions of the extremity under program control and may be dedicated to one or more extremities. In this case, a plurality of data processors may be distributed throughout the system, each dedicated to a data processor prime task, which may be a system prime task or sub-task.

The term "real time" should be defined since it is sometimes used or misused in the computer art to have a number of different meanings. As used in this application, a data processing system is said to be operating on a real time basis when time of occurrance of the computer operations in the data processing subsystem is dictated by the requirements of the machine subsystem rather than by the data processor operations.

Systems Architecture

The preferred embodiment of this invention is a factored computer system as disclosed in the referenced applications. To adequately describe the means and method of this invention, it is necessary to adapt terminology indicative of the new and unique inventive features. This terminology is defined by useage and by example herein to provide a basis for characterizing this invention.

Systems incorporating data processing capabilities distribute and disperse physical and operative properties with relation to external as well as internal system functions. Viewed in conceptual terms, such systems are "factored" in that they are structured as an entity from elemental terms encompassing both internal and external functions and physical as well as operative properties. Physical distribution of subsystems, extremities and circuits and/or the operative dispersion of programming and time-sharing capability are used in mutually interdependent fashion. Closely related to this, at least some of the subsystems or external units are not peripherals in the conventional sense, but are "elemental extremities" of the system itself, operating in what are termed "intrinsic" signal forms. The system, by its physical distribution or operative dispersion or both effects the preprocessing and signal conversion needed for translation to or from other subsystem signal forms.

Systems in accordance with the invention are characterized by a unique combination of high performance, versatility, and low cost. The versatility results from extension of the general purpose nature of a data processor to the entirety of the system, including its extremities. Consequently, the system can often be oriented to perform a significantly different task or tasks primarily with programming changes. The concurrent low cost is attained in large part by usage of elemental input and output units of ultimate simplicity. A mutual interdependence is employed, on a systems basis, between processor-dependent extremities and widespread operative dispersion to contribute significantly to these results. Of great importance, it is to be noted that this novel restructuring into factored systems does not unduly burden or inherently restrict the data processor capability. Instead, the system acquires a more general purpose capability.

An important aspect of the invention is that systems in accordance with it may be committed for best cost-performance characteristics to the performance of a given task or class of tasks by virtue of employment of only those extremities associated with the selected tasks. In such situations, only particular extremities are employed, extraneous data processor capability is reduced, and the physical distribution of the system may be optimally varied toward the chosen ends, while retaining the general purpose processor capability on a systems level. In a specific example given by way of illustrations hereafter; a factored numerical control system utilizes operative dispersion in conjunction with elemental extremities performing prime tasks.

Novel usage is made cojointly of operative dispersion of functions, where the data processor may be required to perform subsidiary subtasks under program control; thereby permitting communication between a data processor and an extremity in signal format intrinsic to that extremity and acceptable to the data processor. These relationships become most clear as they pertain to elemental extremities or appendages, which not only fulfill the functions of the prior art overstructured peripherals, but constitute generalized operators of much greater versatility. Such systems become "committed" to a particular task or family of tasks when the extremities or appendages are limited to those needed for that task and when computational and memory capabilities are similarly optimized.

A general purpose data processor is provided with digital portions fully implementable with integrated circuits. Thus, an integrated circuit read only memory (ROM) provides an example of a capability not found in present data processing systems. Other examples are a random access memory (RAM) and other types of flip-flop memories, which may be used alone or in combinations of integrated circuit memories for this data processing system.

In accordance with the basic concepts of a factored data processor system, the control system of this invention provides an illustration of this factoring process. The data processor 112 is used in conjunction with the various extremities of the system including elemental extremities. The data processor 112 has a distributed characteristic, where the raw instruction signals such as micro-operation and operand address signals are communicated in intrinsic signal form to the input/output structure which is physically distributed and set apart from the data processor 112 and the various extremities that communicate with the data processor 112 through this input-output structure.

The data processor 112 is shown by way of this example to be used in conjunction with the main memory 130. The basic architecture of this data processor permits the use of an integrated circuit memory, preferably a read only memory (ROM), but alternately a random access memory (RAM) or flip-flop memory can be used for the main memory 130 of this completely integrated circuit computer which might be called a monolithic computer.

The architecture of the data processor is oriented, towards a factored data processing system to permit the data processor to operate in close conjunction with the extremities. The special organization and instruction repertoire aid in implementing this factored data processing system.

As previously discussed, only those extremities associated with the selected tasks are employed. Therefore, the extremities and/or peripherals shown in FIG. 1A and the controls and displays shown in FIG. 2 may be selected as required. As an example, the machine 124 and associated axes servos 120, 121, and 122 are necessary for the numerical control system embodiment discussed in parent application Ser. No. 101,881; but are unnecessary for the business system embodiment discussed in parent application Ser. No. 288,247.

The machine is an extremity of the system which can be implemented as an elemental extremity in conjunction with the data processor. Direct control of the various machine functions, such as storing the tool positions, compensating for tool characteristics, and controlling a turret motor for tool selection will reduce the machine interface that is often implemented with relay logic and other such "magnetics". This elemental machine 124 may be considered to have physical distribution, operative dispersion, and operate with intrinsic signal forms in accordance with the invention. The operative dispersion of the system permits the elemental processor dependent machine 124 to operate in conjunction with other elements performing prime functions to accomplish a task, which may be the performance of various machine operations.

The present invention more particularly incorporates the normal data processor functions of controlling, computing mathematical functions, and storing data in a physically distributed, operatively dispersed system providing concurrent internal stored program control of coaction with associated extremities such as the machine extremity. Although interfacing is not prohibited, these systems utilize substantially direct communication with elemental subsystems as needed for a chosen class of tasks.

The data processor 112 can access other subsystems through the spare I/O channels 128 for alternate sources of CNC commands, alternate sources of parts programs, and alternate parts program memories. The machine 124 is controlled with multiple axis servos 120, 121 and 122 operating from data processor real time command signals 123 and is controlled with various auxiliary command signals 126. These command signals are provided by the data processor 112 which accesses a parts program and computes the command signals required to command the machine 124 to execute the parts program.

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in parent application Ser. No. 134,958; and machine response time such as for tool change and spindle speed change requirements. These machine command requirements place a real time operation constraint on the control system 110. Real time machine commands are herein intended to mean commands to the machine 124 with time constraints dictated by machine requirements.

Parts program information is typically accessed by a punched tape reader 116 but may be obtained from other sources; where the use of alternate sources of parts programs is presented in parent application Ser. No. 101,881, particularly page 22 lines 4 through 7 and other descriptions therein. One source may be a remote large scale computer system that generates the parts program with an APT compiler, then transmits this program over a data link 150 to the CNC system 110. The data link 150 could be a telephone line or other well known means with appropriate terminal devices such as modems that are well known in the art.

The data processor 112 accepts rudimentary data in the intrinsic signal form of an elemental machine 124, then processes the non-adapted or intrinsic signals, then provides output commands for the machine. The data processor in turn commands the machine 124 in a signal form which may be readily useable by or intrinsic to the machine 124. Use of the physical distribution and operative dispersion of the system in conjunction with processor-dependent elemental machine operating in non-adapted language modes permitting great versatility to be attained with low manufacturing cost. Furthermore, orientation of the system to a different class of tasks involves no significant redesign, but primarily involves changes in the data processor program.

A general purpose data processor in accordance with this invention may include multiple data and program registers, a random access memory and a scratch pad memory, and non-buffered, directly coupled input-output lines connected to elemental input-output manifesting devices. These elements perform basic or prime functions and are physically distributed at different locations in the system, with operative dispersion making them functionally available throughout the system. This system closely integrates various input and output functions into the the data processor tasks. Minimal structure input-output extremities in this particular example comprise an elemental machine, operator control panel, and operator display panel. The data processor concurrently monitors these extremities, pre-processes the external manifestations into extremity-adaptable or intrinsic data, and generates extremity intrinsic or extremity-adapted commands. The system concurrently operates under program control to perform the other aspects of the task, including carrying out complex computations, generating display commands, sequencing through the program, providing machine control operations.

In a typical, very generalized example of the operation of the system of FIG. 1, the data processor 112 accepts switch or other inputs from the machine 124 to define the computations for system tasks. As the machine is operated, the data processor 112 is under program control to monitor the operative states and pre-processes the rundimentary data itself. Concurrently and also under program control, the machine operations are commenced by exciting the passive interface elements to provide the machine oriented operations. These monitoring and pre-processing subtask functions concerned with the extremities continue to be carried out as needed while the processor 112 enters into its computational and processing functions concerned with its main task, such as numerical control operations. Thereafter, command data is translated into output commands for the individual outputs 126A in intrinsic signal form. Compatible feedback signals 126B in the intrinsic format may likewise be returned to the processor 112, pre-processed by the data processor under program control for conversion into the processor base language and utilized in further computations.

There are profound differences between systems thus arranged and operated and systems of the prior art. In the physical and operational sense, the data processor 112 is a much greater portion of the whole and the associated units may be extremities of the processor 112. Each elemental extremity has certain characteristic relationships to the system, although other differences necessarily exist. Each relies essentially upon the operatively dispersed program capabilities of the processor 112. Each further effectively relies upon the processor 112 for pre-processing nonadapted elemental signal forms for interpretation of signals and meaningful data transfer. In this respect, digital buffering, conversion, and signal conditioning functions ordinarily provided by interface circuits are also avoided. Furthermore, the processor 112 itself need not be tailored in configuration to cooperate with predetermined interface formats and requirements. In a further respect, system extremities communicate with the data processor in intrinsic signal forms such that the programming of the processor can determine the significance of particular terms in the intrinsic signals.

Elimination of physical identities are representative of what is herein termed physical distribution, where the processor 112 can be distributed throughout the preponderance of the task-performing system. Yet, by virtue of the operational dispersion of the system and other prime functions, this task-performing system may readily be modified with a minimum of hardware changes to perform another task. Such change entails the essential modification of the system program and also modification of the subtask programs and their relation to the task-pertinent program. It should be appreciated that the operative dispersion of the system encompasses and eliminates much of the interface circuitry that is redundant when used in conjunction with a data processor.

Data processor 112 operates in a particular base language signal format which is intrinsic to data processor 112, which is not a unique signal format to this particular invention, but is instead a common signal format in which many digital data processors operate for optimum efficiency in the computation processes. As is hereafter described in connection with the detailed description of the subsystems, the input and output subsystems may operate in signal formats that are intrinsic to the particular subsystems. Thus, the overall system 110 utilizes a number of different signal formats in various portions of the system. This is a common characteristic of most data processing systems. However, in accordance with one of the primary features of the present invention, peripheral subsystems communicate directly with the data processor 112 in the peripheral subsystems own signal format. Interface units need not be provided to convert these signals into the format of the data processor 112 or to otherwise digitally buffer or preprocess the rudimentary signals from the input peripheral subsystems or to convert the output signals signals from data processor 112 into the format of the output peripheral subsystems. Instead, the data processor 112, under control of its program stored in memory 130, interrogates the input peripheral subsystem such as machine 124, control panel 114, and tape reader 116 directly and these input peripheral subsystems provide input signals to the data processor 112 on a real time basis directly in the signal format of the respective input peripheral subsystems. Upon receipt of the real time rudimentary signals from the input peripheral subsystems, data processor 112, under control of its stored program in memory 130, performs the necessary conversion and other refinement operations on these input signals to provide the proper signal format for subsequent computations and performs the necessary preprocessing and elimination of time-ambiguous signal portions and the like which might be contained in the rudimentary input signals. Computations are then performed on the input data in the data processor 112 under control of the stored program. After the data processor computational process is completed, data processor 112 converts output signals into a signal format intrinsic to the particular output peripheral subsystem such as the machine 124 to which the signal is to be applied under control of the stored program. The output signals are then applied to subsystems in the respective intrinsic signal format of the peripheral subsystem, again on a real time basis. Details of the manner of application of these output signals are provided hereafter.

In a data processing system or computer system in accordance with the present invention, the data processor 112 and the various input and output peripheral subsystems are integrated together to eliminate redundant operations and to perform system functions in an optimum manner. The data processor 112 operating under the control of its stored program performs real time interface subtasks previously performed in the prior art with non-computerized control systems and special purpose logic circuits such as in interface units. In addition, the data processor 112 under control of its stored program performs the digital conversion, timing, sequencing, and controlling functions which, in the prior art, were performed in interface units unique to each peripheral subsystem. The system of this invention processes signals in a plurality of different formats from different portions of the system, permitting optimization of each subsystem while retaining system control by the data processor 112 under control of its stored program. The physical boundaries between the various subsystems can then be minimized or eliminated entirely. Because the subsystems are not now stand-alone subsystems, the components of the various subsystems can be physically located throughout the system in whatever manner is physically or mechanically optimum for the system design or manufacture. In addition, the performance of various functions may be dispersed to other subsystems operationally remote from the subsystem associated with the task. For example, in the system of this invention the conversion from the signal format associated with a particular subsystem can be performed by the data processor subsystem under program control. Thus, the data processor 112 may assume intimate control and operation of the other subsystems in the system. Therefore, this system 110 may be considered to be an integrated system.

Another characteristic of the system 110 just described as contrasted with the prior art systems is that subsystems which are known in the art as peripheral subsystems and which are identified as such in the description herein are no longer truly "peripheral" at least in the sense that the word is used in the prior art. They are no longer stand-alone subsystems which perform their assigned task in an off-line manner relatively independently from the rest of the system. Instead, they are an integral portion of the system completely bound-up with or integrated into the system. Thus, an elemental subsystem could equally well be termed merely the extreme elements of the system in which the data processor 112 is the central element and the subsystems could be elemental extremities. Thus, each element of the system; whether a central element, an intermediate element or an elemental extremity; is not required to and frequently is not able to independently perform all specific functions required of a prior art stand-alone peripheral subsystem which had performed a comparable task, where portions of the peripheral may have been eliminated or combined with portions of other elements in the system to achieve the advantages of an integrated data processing system. Such an integrated system may be deemed to be factored in that individual elements of the system are structured for coaction with the data processor. Each elemental extremity, when used in conjunction with the stored program data processor 112, performs an assigned task under direct control of the data processor 112 which in turn operates under direct control of the program stored in memory 130.

System communication and complexity is optimized with serial data communication, which significantly reduces interconnection and logic. In this preferred embodiment, serial communication is illustrated as the sequential processing of single bit bytes. It will become obvious that sequential processing of multiple bit bytes can also be provided. Processing is herein intended to mean not only data manipulation within the data processor 112, but also the transmission of data to and from the data processor 112. Serial data communication is exemplified with an input/output instruction labeled EX and described in the parent application Ser. No. 101,881, and as described hereafter for the low data rate serial communication with the elemental machine 124.

The architecture of the data processor 112 lends itself to a fully integrated circuit computer mainframe where first all of the logic may be implemented with integrated circuits in a conventional manner; second, the main memory 130 may be implemented with an integrated circuit read only memory; and third, an integrated circuit scratch pad memory may be provided in a unique manner; thereby yielding a data processor having the digital portions thereof constructed wholly of integrated circuits. The physical distribution and integration characteristics of the system 110 may also be extended from the system level to the subsystem level and applied to the elements of the data processor, where the data processor elements may be integrated or physically distributed in such a manner so as to obscure the prior art distinction between these elements.

As discussed herein, one of the characteristics of a dedicated computer is that, during its entire lifetime, it performs only a single set of tasks or functions in response to its stored program. Thus, there is usually no need to change the program once it is stored in the memory of the computer. In accordance with yet another feature of the present invention, a computer system of the general type described is provided which includes two separate and independent memory portions. The first memory is a monolithic read only memory in which the desired program is permanently written and stored at the time this memory is made. In the preferred embodiment, this memory is a large-scale integrated circuit unit in which the desired program is "written" at the time the integrated circuit is manufactured by providing an appropriate mask in the manufacturing process to store the appropriate one of the two possible binary digits in each of the memory cells in the array. Other embodiments and the manner of making them will be obvious to those skilled in the integrated circuit art. This program stored in the monolithic read only memory is the program which controls the dedicated computer. A second independent memory unit is provided which is independently addressable and controllable by the data processor subsystem, which is an electrically alterable memory. This second memory may be termed the intermediate memory or a "scratch pad" memory. Preferably, this memory is also an array of memory cells on a monolithic integrated circuit chip, but is one which can be electrically altered by the data processor subsystem. This scratch pad memory is used to store operands which might be generated and used during the computational process by the computer and which need to be stored for subsequent retrieval for future use by the data processor subsystem. This two memory arrangement has been found to be particularly applicable to dedicated computers. By placing the stored program in a read only memory, it is stored in non-volatile form and cannot be changed or destroyed either by power failure, error by the machine operator or the like. The electrically alterable scratch pad memory provides the necessary intermediate storage during operation of the system. If the information in this memory is for any reason destroyed or damaged by power failure, operator error or the like, no permanent damage is done, since the stored program is still available in the read only memory and the information in the scratch pad memory can easily be regenerated by the system.

Data Processor

A general purpose data processor is provided with the digital portions fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this processing system.

As shown in FIG. 1A, the data processor 112 receives data from the various input sources, performs calculations or otherwise manipulates data in accordance with the input information and outputs processed information to control the milling machine 124 through servos 120, 121 and 122 and auxiliary control signals 126A and 126B. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor with the digital portion constructed wholly of integrated circuit components.

In a somewhat simplified block diagram, the data processor 112 is shown in FIG. 1B as control logic 102 interconnecting registers, timers and communication channels. Signal definitions are provided to permit those knowledgeable in the art to identify the various connections between boards.

The basic timing functions of the data processor 112 are performed by a word timer 104 and a bit timer 106. The fundamental synchronization of the central processor 112 is provided by an 8 MHz clock signal which is included as part of the control logic 102. The synchronizing clock signal is an asymmetric square wave, the positive portion of which is designated $\overline{P_3}$ and the negative portion of which is designated P₃. The asymmetrical character of the clock signal permits a longer clock period for stabilization of propogation delays without sacrifice of processing speed. The word timer 104 is a three-bit counter with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104. These output signals are used by the control logic 102 for sequencing the data processor through the micro operations associated with an instruction. The bit timer is a four-bit binary counter with associated decode logic. The bit timer 106 counts down from 15 thru 0 and consequently the associated decode logic has 16 output lines, each going true during a different one of the 16 possible counts of the bit timer 106. The bit timer 106 provides sequencing and timing within a given micro operation or word time.

An accumulator (A-register) 108 is the basic arithmetic register and is used as the repository of the results of arithmetic and logical operations. It is also the source and destination of the input/output (I/O) parameters. The A-register is a 16 bit serial in, serial out shift register. Associated with the A-register 108 is a serial full adder which in FIG. 1B is included within the control logic 102.

A scratch pad memory (SPM) 170 provides storage for intermediate parameters such as computational results, return addresses, indexes and other pertinent information. The SPM 170 provides rapid internal storage without the need for transferring data to the main memory 130. It is a group of 32 16 bit serial in, serial out registers which are divided into two pages with 16 registers on each page. Paging is accomplished by toggling a flip-flop, which is automatically set to page 0 when the power is turned on. When the SPM is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The SPM₀ register is generally used as a TX instruction register (decrement and transfer on non-negative) where the index byte to identify the SPM₀ register is automatically assumed and need not be programmed in conjunction with the TX instruction. The SPM₂ register is used for the return address associated with the execution of transfer-type instructions. In addition the SPM₂ register is used as the intermediate register for operands obtained from the constant memory portion of the main memory. The first eight SPM registers can be used for index or TX instructions in addition to scratch pad operations.

A memory address register (M-register) 172 holds the 12 bit address of an eight-bit byte to be accessed from the program memory. The M-register is a 12 bit shift register having the capability to address up to 4,096 different memory locations. It has a serial input and both serial and parallel outputs. Associated with the M-register but representated as being within the control logic 102 is a serial full adder which increments the M-register to access sequential instructions or, as applicable, the next two bytes of in-line instructions. The M-register is incremented by two for a TX instruction when the condition for that transfer is not met, resulting in a skip of two bytes. The M-register is incremented by three for a skip-on-discrete (SD) instruction. The M-register is exchanged with the SPM₂ register for transfer type instructions and exchanged with a data address register (D-register) 174 to access operands from the main memory. The M-register is also exchanged with the SPM₂ register at the start of an ST instruction which causes the contents of the A-register to be stored in the main memory when implemented with a core memory.

The data address register (D-register) 174 is a 12 bit shift register that usually contains an operand address and is used to select: (a) SPM register, (b) I/O channel, and (c) number of shifts, depending upon the type of instruction being executed. The D-register has a serial input and serial output, with the eight least significant bits ($D_0$–$D_7$) having parallel outputs in addition.

A C-register 176 is composed of six flip-flops designated $C_3$, $C_2$, $C_1$, $C_0$, $K_{11}$, and $K_{10}$ which store the six most significant bits of an eight-bit instruction byte obtained from program memory. The flip flops $C_3$ through $K_{10}$ store the instruction bits designated $I_7$, $I_6$, $I_5$, $I_4$, $I_3$ and $I_2$, respectively as received from the main memory interface lines (I). These instruction bits are held by the C-register during the performance of an instruction to control the sequence of micro operations executed during the performance of the instruction.

An element designated K-register 178 is not a single register but rather a group of miscellaneous flip-flops for various functions. The $K_6$ and $K_9$ flip flops are not mechanized. The $K_0$, $K_1$ and $K_2$ flip-flops are used primarily to control sequencing through the micro operations. The $K_1$ flip-flop is also used to store the sign of the operand in the A-register and the sign of a decremented number during a TX instruction. The $K_2$ flip-flop is also used to extend the A-register during a shift left operation where the $K_2$ register acts as the $A_{-1}$ stage of the A-register. The $K_3$, $K_4$, and $K_5$ flip-flops may be grouped together and designated the KA-register and may be used to store the address of the index. The KA-register is also used as an extension of the A-register during a shift left operation with $K_3$ as the $A_{-2}$ stage, $k_4$ as the $A_{-3}$ stage, and $K_5$ as the $A_{-4}$ stage of the A-register. The $K_7$ flip-flop is primarily used as a carry flip-flop in conjunction with the A-register full adder. It is also used in the FK micro operation in the transfer of the D-register contents to the M-register as a shift left operation to multiply the D-register word address by two to obtain the M-register byte address. The $K_8$ flip-flop is used as a carry flip-flop in conjunction with the M-register full adder. As previously described, the $K_{10}$ and $K_{11}$ flip-flops form the two least significant bits of the C-register.

An element designated L-register 180 is, like the K-register, a group of miscellaneous flip-flops performing control functions. The most significant is the $L_1$ flip-flop which controls turn-on and turn-off of the data processor.

Input/output (I/O) channels 183 include whole number and discrete channels. The whole number channels connect the A-register with the various entities and extremities. The whole number I/O channels are arranged in pairs so that as the output from the least significant bit ($A_0Q$) of the A-register shifts information to an output channel with a corresponding input channel simultaneously shifting information into the A-register through the input to the most significant bit ($A_{15}D$).

A data path 184 provides two-way communication between the data processor and the main memory. This path carries the main memory address stored in the M-register and transfers operands to or from the main memory.

Instruction Repertoire

The program instructions for the numerical control system 110 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier type preceding the instruction whose operand address is to be indexed. Operands can be located in any of the SPM Registers, the constant memory part of the program memory, or in the two program memory bytes following an instruction (in line.)

EX (input/output word) $1010\text{-}I_3I_2I_1I_0$

This is a one-byte indexable instruction wherein the four most significant bits identify the operation code and the four least significant bits identify and I/O channel address. The contents of the A-register are output to the addressed channel while the contents of the addressed channel are simultaneously loaded into the A-register. A shift enable signal is output to gate 16 clock pulses to the selected channel.

$FAB - C_3Q \cdot \overline{C_2Q} \cdot C_1Q \cdot \overline{C_0Q} \cdot W1.$

The FAB micro-operation occurs in word time 1 and has a duration of 16 bit times. The contents of the A-register are shifted to a selected output channel while the contents of a selected input channel are simultaneously shifted into the A-register.

The data processor can generate discrete outputs (DO) to meet specific requirements under program control. The DO assignments are:
DO-0 Set interrupt enable.
DO-1 Provide clock pulses to ASR-33 (TELE-TYPEWRITER).
DO-2 Provides a clock to set the power turn-on interrupt, $L_1$. A DO-2 instruction (1100–0010) will be contained in program memory location $40_{16}$ to reset $L_1$ during power turn-on.
DO-3 Iteration timer reset.
DO-4 Trigger to $I_2$ latch, the discrete input 4(DI-4) toggle. The $I_2$ flip-flop is automatically zero set during the power on sequence.
DO-5 Trigger to $I_3$ latch, the discrete input-5(DI-5) toggle. The $I_3$ flip-flop is automatically zero set during the power turn-on sequence.
DO-6 Trigger to the $I_4$ latch, the discrete input-6 (DI-6) toggle. The $I_4$ flip-flop is automatically zero set during the power turn-on sequence.
DO-7 Intensity control (2 line) (not implemented).
DO-8 Toggles the $I_1$ flip-flop causing scratch pad memory paging.
DO-9 Main memory paging.
DO-10 Spare.
DO-11 Servo set.
DC (discrete output) $110I_4\text{-}I_3I_2I_1I_0$ This is a one-byte indexable instruction wherein the three most significant bits define the operation code and the five least significant bits define an output channel address. A discrete output signal, an inverted 3 microsecond pulse is generated on the addressed output channel.

The data processor can operate on a discrete input (DI) with a skip-on-discrete instruction under program control. The discrete inputs are various low frequency digital signals. The purpose of the discrete inputs is to define a status or condition. The DI assignments are:
DI-0 Spare
DI-1 Skip unconditional.
DI-2 Skip on ASR-33 (TELETYPEWRITER).
DI-3 Skip on the sign of (A).
DI-4 Skip on $I_2Q$ latch (DO-4 trigger).
DI-5 Skip on $I_3Q$ latch (DO-5 trigger).
DI-6 Skip on $I_4Q$ latch (DO-6 trigger).
DI-7 Skip on logical overflow in A-register.
DI-8 Used for troubleshooting.
DI-9 Skip on arithmetic carry from A-register.
DI-10 Skip on positive.
DI-11 Skip on servo ready.
SK (skip on discrete) $111I_4\text{-}I_3I_2I_1I_0$ This is a one-byte indexable instruction wherein the three most significant bits identify the operation code and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction.

$FAG - C_3Q \cdot C_2Q \cdot C_1Q \cdot W1$

The FAG micro-operation occurs in word time 1 and has a duration of 12 bit times. It is used for the skip on discrete instruction. If the selected discrete is true, the M-register is clocked and incremented by three. If the selected discrete is false, the M-register is not clocked and is therefore not incremented.

Interactive Control System

Interactive control systems in accordance with the invention provide bidirectional communication between an operator and a data processing system via intermediary binary digital words. The interactive control system is an elemental extremity of the data processing system, providing unprocessed rudimentary data for a data processor and receiving preprocessed data for control of display illumination from the data processor. This elemental control system is dependent on processor coaction for performance of the task of interactive communication with an operator. The data processor operates under the control of a selected stored program to interpret input words and produce an appropriate system response, and provide output words having an appropriate format.

An elemental panel for use in systems of the type disclosed herein are processor dependent structures having means for receiving panel elements and having circuit conductors for coupling elements, and having electronic means in the conductive paths for signal processing. By this arrangement, uncommitted elements can be added or changed and the significance of given panel positions can be determined at processor option under program control without being previously committed through wired operation. The outputs of operator controllable selector switches and momentary switches are transformed to binary codes for greater efficiency. The coded outputs from the momentary switches may be gated to latches which hold the information until sampled by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is then sampled and interpreted by the data processor.

A display panel is composed of both lamp displays and numeric displays. Each lamp display driver is connected to a different bit of a lamp display register such that when that bit stores a binary "1" or is "set" the lamp display is lighted. The data processor provides an output word to the lamp display register comprising packed discrete lamp control bits to cause appropriate lamp displays to be lighted.

The numeric display elements may be segmented tubes, Nixie tubes, or similar devices displaying a selected character. A single numeric character display register is used to control all of the numeric displays. Output words are transferred to the numeric display register at a rapid periodic rate. One portion of these words contains a tube (element) select code identifying a particular element and a second part of the word contains a code identifying the character to be displayed. Appropriate decoding logic responsive to the numeric display register causes the appropriate segment drivers of the selected numeric display tube to be activated to display the output character. Each numeric display is then driven in turn to display a selected character. In order to refresh the numeric display at a flicker-free rate of 30 times per second, the processor places a new word in the numeric register at a cyclic rate of 30 times the number of numeric word displays desired each second. Assuming 8 numeric displays, the rate would be 240 times per second and would consume only a small part of the operating time of a modern high speed data processor.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting switches and displays and by changing associated captions in the interactive control system. Corresponding changes in data processor responses are accomplished by making appropriate changes in the stored program.

This invention provides an interactive control system establishing bidirectional communication between an operator and a data processing system. All control and data information passing between an operator and the system passes through an electronic data processor via the medium of intermediary binary digital words.

As shown in FIG. 1A an electronic data processing system 110 includes an electronic data processor 112 and an interactive control system 182. In general, the electronic data processing system may be any such system but the full advantages of this invention are best realized when used in conjunction with a system which has been committed or dedicated to a specific task or family or tasks, such as numerical control, payroll, accounting, or inventory control. It will be assumed herein, however, that the electronic data processing system 110 is committed to the task of numerical control of a milling machine.

The interactive control system 182 (FIG. 7) includes a control panel 780 as well as gates 624 and latches 620 which are physically located on available space of a printed circuit board within the electronic data processor 112 but functionally operate as part of the interactive control system 182.

As illustrated in FIG. 2, the control panel 114 and the display panel 118 are mounted in a single rectangular plane with the display panel occupying the upper portion of the plane and the control panel occupying the lower portion of the plane. The lefthand portion of the display panel is occupied by status indicator lamp displays 233 such as the Power On indicator lamp 213 and an error indicator lamp 236. These lamp displays provide feedback to the operator by indicating system modes and conditions. All status indicator lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays. Included within the status indicator lamp displays 233 are a bank of troubleshooting lamps such as an error indication lamp 236, which are normally obscured behind the filter, but become flashing displays if a malfunction or error should occur. The righthand portion of the display panel 118 is composed of eight numeric displays 238 which may be used to identify the magnitude of system parameters.

As described more fully in copending application "Interactive Control System", Ser. No. 101,449, filed Dec. 28, 1970, by Lee et al, and incorporated herein by reference, each lamp display 233 is driven by a well known lamp driver circuit which is controlled by one bit in a lamp display register 700. The lamp display register 700 stores an intermediary output word output from the data processor 112 which defines the status of the lamp displays 233. In contrast, the numeric displays 238 are driven sequentially in accordance with an intermediary output word stored in a numeric display register 798.

Each numeric display lamp 238 is excited at a 30 cycle per second flicker free rate under program control in accordance with information contained within a numeric display register. Since the numeric display register controls the excitation of all eight numeric display tubes 238, its content must change at a cyclic rate of $8 \times 30 = 240$ times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The control panel, which is also described in copending application Interactive Control System, Ser. No. 101,449, filed Dec. 28, 1970, by Lee et al, has three selector switches and a plurality of momentary switches as shown in FIG. 2. The three selector switches, a Mode switch 240, a Jog switch 241 and a Parameter switch 242, are multiple position rotary switches. The Mode selector switch 40 defines one of the six operating modes of the system, the Jog switch 241 defines the machine displacement for each jog command executed when in the jog mode, and the Parameter switch 242 defines the parameter to be displayed on the numeric displays 238 and, when in the keyboard mode, defines the address of the parameter to be entered through the keyboard 244. The remaining switches are momentary switches which maintain contact only so long as they are held down. The Mode selector switch 240 defines the major operating conditions of the system which are: (1) Search, (2) Index, (3) Continuous, (4) Block, (5) Jog, and (6) Keyboard. The Search position 290 of the Mode selector switch 240 permits an operator to identify a desired part program block of commands from a punched tape or from a self-contained parts program memory such as the core memory 130 in systems where this capability is provided, and then initiate an automatic search for that block of commands. A sequence number, which is used to identify the selected block of commands, is entered through a keyboard 244 made up of momentary switches. The number which is entered through the keyboard 244 is displayed on the numeric displays 238 to permit the operator to verify the number which has been entered.

The numerical control system 110 uses a zero synchronization or index point with respect to which all positions of the machine tool are defined. The Index position of the Mode selector switch 240 causes the machine tool to return to the previously defined index point. When in the index mode, depression of the Cycle Start switch 246 will cause the numerical control system 110 to drive the machine tool precisely to the index point.

The Continuous position of the Mode selector switch 240 is used only after system initialization and initial work piece setup. Depression of the Cycle Start button 246 while in the Continuous mode initiates fully automatic operation as commanded by the part program from the tape reader 116 or other source of part programs.

The Block position 286 of the Mode selector switch 240 permits an operator to control the numerical control system 110 in a semi-automatic mode for operations such as part program checkout. In this mode, the system will access a single block of commands from a part program, execute those commands, and then enter the Cycle Stop condition. When in this mode, a part program can be executed one block at a time by refraining from depressing the Cycle Start switch 246 until subsequent to the completion of execution of the previous block of commands.

The Keyboard position 284 of the Mode selector switch 240 permits operator control of the system in a semi-automatic mode. A block of part program commands can be entered through the keyboard 244, and then executed when the Cycle Start switch 246 is depressed. When commands are loaded through the keyboard the parameters will automatically appear on the numeric displays 238. Data input errors can be easily corrected by depressing a Clear switch 50 and reentering the parameter through the Keyboard.

The Jog position of the Mode selector switch permits an operator to reposition the machine tool in a semi-automatic manner for operations such as initial work piece setup or index definition. The Jog selector switch 241 and the Jog Direction switches 252 may be used by the operator to conveniently reposition the machine tool. With these basic controls, the machine can be positioned precisely to within the resolution of a system (0.0005 inch) with a minimum of effort, fixtures, readouts, and optics. The numerical control system 110 executes precision positioning commands in accordance with the distances and directions selected without burdening the operator with tedious measuring functions. In addition, the numeric displays 238 will show the machine position for positive verification while in this mode.

The Jog selector switch 241 becomes operative only when the Mode selector switch 240 is in the Jog position, and defines the machine displacement for each jog command executed. The selectable positions are: (1) Continuous, (2) 1.0000 inch step, (3) 0.1000 inch step, (4) 0.0100 inch step, (5) 0.0010 inch step, (6) Increment.

The Continuous position of the Jog selector switch 241 will cause the system to drive continuously in a direction commanded by one of four Jog Direction switches 252. These direction switches cause the machine tool to move left, right, in, or out depending upon which one of the four switches is depressed. While in the Continuous Jog position, the machine tool is driven continuously in the commanded direction for the duration of time that a Jog Direction switch is maintained in a depressed state. Electronic detents are implemented causing the machine to decelerate and accelerate subsequent to each one inch of translation of the machine tool. This action graphically defines and permits the operator to observe the magnitude of motion for convenient operation. In addition, continuous jogging will always terminate a precise number of inches from the starting point for accurate control of displacement.

The four step positions of the Jog selector switch cause the system to drive the machine tool a precise step distance selected each time a Jog Direction switch is depressed.

The Increment position of the Jog selector switch 241 causes the system to drive the machine tool a single precise least significant increment of distance each time a Jog Direction switch 252 is depressed, 0.0005 inch in this embodiment of the invention. When in the Step or Increment positions, regardless of whether the Jog direction switch is maintained in a depressed state for an instant or continuously, the machine will still execute only the single commanded step and then halt. Additional motion can only be initiated by releasing and again depressing a Jog Direction switch 252. This eliminates the need for rapid operator response, since the precise step commanded will be executed independent of the duration of time that a direction switch 252 is depressed.

The position of the Parameter selector switch 242 defines the parameter to be displayed on the numeric displays and, when the Mode selector switch 240 is in the Keyboard position, the block of commands being entered through the keyboard 244 is displayed. The selectable parameters for this numerical control system 10 are: (1) Sequence No. —N, (2) Absolute Position −X, (3) Absolute Position −Y, (4) Arc Center −I, (5) Arc Center −J, (6) Auxiliary Command −M, (7) Auxiliary Command −G.

The Sequence Number position causes the numeric displays 238 to show the address of a block of punched tape commands being read from the punched tape while in the Continuous or Block mode. The Sequence Number position of the Parameter selector switch 242 also causes the numeric displays 238 to show the sequence number being entered through the keyboard 244 while the Mode selector switch is in the Keyboard position. This is done prior to initiating a tape search in the Search mode.

The Absolute Position location of the Parameter selector switch 242 causes the numeric displays 238 to monitor the position of the machine tool relative to the floating zero or index point. When the Mode selector switch 240 is in the Keyboard location and the Parameter selector switch 242 is in one of the Position locations, the system enters and the numeric displays 238 show the position commanded by the operator to be entered through the keyboard 244. For instance, suppose the operator wishes to position the machine tool at an X coordinate of 05.6000. To do this, he turns the Mode selector switch 240 to the Keyboard position and the Parameter selector switch 242 to the Absolute Position X, and then enters the numbers 05.6000 through the keyboard 244. At this point, the numeric displays 238 are showing the number 05.6000 and the system is ready to move the machine tool to this X position when the Mode selector switch 240 is in the Keyboard location and the Cycle Start button 246 is depressed.

In similar manner the Arc Center and Auxiliary Command locations of the Parameter selector switch 242 are used in the Keyboard mode to enter the commands from the keyboard.

There are several momentary switches in addition to the Keyboard switches 244, Cycle Start switch 246, Jog Direction switches 252 and Clear switch 250 whose functions have previously been described. All of the momentary switches are hermetically sealed reed relay switches. A latching interlock is provided, making the system insensitive to dynamic switch conditions such as switch bounce. In addition, operation is independent of operator action such as the duration of switch depression and additional switch commands which might result in ambiguities are automatically locked out as long as one of the momentary switches remains depressed.

For operator convenience the momentary switches are grouped into functional arrays, for example, the Keyboard switches 244 and the Jog Direction switches 252.

The keyboard 244 is composed of ten numeric keys defined as 0 through 9 and a negative sign key. The zero key can be used for the plus sign when required. The numeric and sign keys of the keyboard 244 are used to enter data in the Keyboard mode and a Clear key 250 adjacent to the keyboard 244 blanks the numeric displays 238 prior to the entering of the data. An Enter key 254 causes a parameter to be accepted by the numeric control system after it has been entered through the keyboard 244 and verified by the operator's observation of the numeric display 238. In the Keyboard mode the various parameters can be varied or entered as required. Parameter verification is achieved by rotating the parameter selector switch 242 to the respective position and monitoring the numeric display 238. Parameter modification is accomplished by depressing the Clear key 250, resulting in the blanking of the numeric display 238, and the sequential depression of the sign and numeric keys of the keyboard 244, resulting in a presentation on the numeric display 238 of the newly keyed numbers. The entered parameter will automatically be accepted by the computer for processing and for display under program control.

The Cycle Start switch 246 and the Cycle Stop switch 256 are used to initiate or terminate automatic operation, respectively. When in the cycle off condition, as identified by the Cycle Off status indicator lamp 271, the operator can initiate automatic operation by depressing the Cycle Start switch 246. The system will automatically execute commands until detecting a condition that defines cycle stop which is:

(1) In the Search mode, detecting the required tape location.
(2) In the Index mode, repositioning the machine to the floating zero point.
(3) In the Continuous mode, completing the execution of a block of tape commands in response to appropriate G or M commands contained therein, or if the operator has depressed the Cycle stop switch 256.
(4) In the Block mode, completing the execution of a single block of tape commands.
(5) In the Jog mode, completing execution of the Jog command.
(6) In the Keyboard mode, completing execution of a single block of keyboard commands.

When in the Continuous mode with the cycle on condition as identified by the Cycle On status indicator lamp, the operator can discontinue automatic operation by depressing the Cycle Stop switch 256. The system will complete the execution of the block of commands in process and then enter the cycle off condition as identified by the Cycle Off lamp.

When the system is in a mode other than the continuous mode with the cycle on condition, it is not necessary for the operator to depress the Cycle Stop switch to discontinue automatic operation, because all modes other than the Continuous mode execute a single set of commands and then automatically enter the cycle off condition. An Emergency Stop switch 258 is used to discontinue automatic operation rapidly and to force the system into a reinitialization condition. It will then be necessary to perform the system initialization sequence prior to operating the system. The system initialization sequence involves:

(1) position the Mode selector switch 240 to the Jog position.
(2) jog the machine tool to the index position.
(3) position the Mode selector switch 240 to the Index location.
(4) depress the Cyclwe Start switch 246 to load the index position of the machine tool.
(5) if required, load the punched tape in the tape reader 116.

The Jog Direction switches 252 are used by the operator to define the direction of motion and to initiate this motion, but only if the system is in the Jog mode. In addition, the position of the Jog selector switch 241 will define the type of motion, i.e. Continuous, Step, or Increment. The jog directions of (1) Right, (2) Left, (3) In, and (4) Out, are defined by facing the machine from the control panel side.

The rapid stop switch 260 causes all machine motion to stop immediately, but permits operation to be resumed with the Cycle Start switch.

A pair of Mirror Image switches 262, 263 are used to selectively reverse the commanded directions of motion. Alternate depression of the X or Y mirror image switches 262, 263, respectively, will cause the mirror image status indicator lamps contained in the bank of lamp displays 233 to change state from +X or +Y to −X or −Y and conversely. The operational condition presented on the mirror image status indicator lamps defines to the operator system conditions.

The control switches of the control panel are not hard wired directly into the control panel lamps and other functions. Instead, the central data processor periodically samples the status of the various switches under program control. The data processor then further acts under program control to operate the various entities of the system in accordance with the status of the control switches. Because the switches are sampled in this way as opposed to being hard wired, the basic numerical control system can be used for a different but related application by merely providing different extremities, changing the designations associated with the various switches, and changing the program which interprets the various switch positions and causes the system to react accordingly. In addition, existing switches can be easily deleted or, if desired, spare capacity permits the addition of either extra momentary switches or extra selector switches or even additional positions of existing selector switches.

In order to reduce the number of wiring connections and facilitate convenient processing, the individual switches and switch positions are first encoded into a binary format before being presented to the central processor 112. The six positions of the Mode selector switch 240 are encoded into three binary bits as follows:

TABLE I

| M2 | M1 | M0 | |
|---|---|---|---|
| 0 | 0 | 0 | Spare |
| 0 | 0 | 1 | Block |
| 0 | 1 | 0 | Continuous |
| 0 | 1 | 1 | Search |
| 1 | 0 | 0 | Keyboard |
| 1 | 0 | 1 | Jog |
| 1 | 1 | 0 | Index |
| 1 | 1 | 1 | Spare |

Similarly, the six locations of the Jog selector switch 241 are encoded as follows:

TABLE II

| J2 | J1 | J0 | |
|---|---|---|---|
| 0 | 0 | 0 | Spare |
| 0 | 0 | 1 | Continuous |
| 0 | 1 | 0 | 1.000 inch |
| 0 | 1 | 1 | 0.100 inch |
| 1 | 0 | 0 | 0.010 inch |
| 1 | 0 | 1 | 0.001 inch |
| 1 | 1 | 0 | Increment |
| 1 | 1 | 1 | Spare |

The seven positions of the Parameter selector switch 242 are encoded into four binary bits as follows:

TABLE III

| P3 | P2 | P1 | P0 | |
|---|---|---|---|---|
| 0 | 0 | 0 | 0 | Spare |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-Arc Center |
| 0 | 1 | 1 | 0 | J-Arc Center |
| 0 | 1 | 1 | 1 | Spare |
| 1 | 0 | 0 | 0 | Spare |
| 1 | 0 | 0 | 1 | M-Auxiliary Command |
| 1 | 0 | 1 | 0 | G-Auxiliary Command |
| 1 | 0 | 1 | 1 | Spare |
| 1 | 1 | 0 | 0 | Spare |
| 1 | 1 | 0 | 1 | Spare |
| 1 | 1 | 1 | 0 | Spare |
| 1 | 1 | 1 | 1 | Spare |

In a similar manner, all of the momentary switches are encoded into five binary bits designated S0, S1, S2, S3 and S4 (Table IV). These five bits can accommodate up to 31 momentary switches. In addition, a sixth bit, $V_s$ provides a verify function for the stop switches.

The encoded selector switch bits are then combined into a single sixteen bit word having the format of P3, P2, P1, P0, Spare, J2, J1, J0, M2, M1, M0, Spare, and four zero states with logic gates. This word is serially scanned into the central processor 112 with logic gates whenever the selector switches are to be sampled under program control. Similarly, the encoded outputs of the momentary switches make up a separate word which is periodically sampled under program control with logic gates.

As shown in FIG. 2, a master panel board 182 supports components and circuits, including a display portion 118 of the control system. The panel board 182 may be a printed circuit board having conventional spaced apart apertures or receptacles 252 (FIG. 2) on the front side into which selector switches and momentary switches may be inserted. Printed circuit wiring to each of the element positions and a minimal amount of electronic circuitry is mounted on the back of the panel board 182 to facilitate error free communication with the data processor. By placing this circuitry in close proximity to the switches and displays, signal lines are held to a minimum length, thereby minimizing costs and errors.

Three multi-position selector switches, a mode selector switch 240, a jog selector switch 241 and a parameter selector switch 242 provide primarily control type functions. Because hardwiring of switch controls is avoided by having intermediary output words communicated to and interpreted by the data processor, the number of selector switches as well as the number of contacts on each selector switch can be easily varied to meet the requirements of a specific application. In this embodiment the interactive control system can accommodate a maximum of 4 selector switches, each having 15 positions. However, even the 7 switch positions on the mode selector switch 240 and the jog selector switch 241 and the 15 switch positions on the parameter selector switch 242, are not fully used in this application.

The selector switches are implemented by grounding the wiper arm and connecting each switch contact to a positive voltage through a resistor. This arrangement causes the signals from the contact outputs to represent the inverse of the selector switch position, a condition particularly suitable to modern integrated circuit logic gates.

The 7 signals from the contacts of the mode selector switch 240 and the 7 signals from the contacts of the jog selector switch 241 are each converted by encoders, into 3-bit binary coded signals. Similarly, the 15 signals from the contacts of the parameter selector switch 242 are converted by an encoder to 4-bit binary coded signals. These encoded signals are connected to Scanout and I/O Channel-0 which converts the parallel signals to a serial intermediary binary digital word as they are shifted into the A-Register of the data processor 112.

Although each of the decoders can accommodate one more input signal, the binary coded output represented by all zeros is not implemented to permit the data processor to detect a switching error. If the wiper arm of a selector switch 240, 241, or 242 is between contacts or fails to make proper contact with a contact the associated encoder provides an all zero output as an error condition and causes an "error" display lamp to be illuminated after a short delay to allow for normal switching time.

24 momentary switches typified by switches 262 are shown mounted on the panel board. As with the selector switches, the number of momentary switches can be easily varied to meet the requirements of a specific application. The circuitry of the present embodiment can accommodate up to 31 momentary switches with locations for possible additional switches.

Reed switches which are mounted in apertures in the panel board are used exclusively in the preferred embodiment for the momentary switches to insure the highest level of reliability, versatility and cost effectiveness, but other well known switches may also be used. As with the selector switches, the momentary switches are implemented by grounding the wiper contacts and connecting the stationary contacts through a pull down resistor to a positive voltage.

TABLE IV

| $V_s$ | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

Once an intermediary input word is within the A-Register it is manipulated and interpreted by an arithmetic and control unit operating under control of program instructions stored in a memory 130. After an input word has been interpreted, the data processor generates appropriate system responses.

The data processor also generates preprocessed intermediary output words having selected formats and transfers them from the A-Register to a numeric display register and a lamp display register through I/O Channel-5 and I/O Channel-6, respectively. These channels provide bidirectional communication of intermediary output words with the A-Register, permitting previously output words to be returned to the A-Register to check for errors occurring during transmission. The interpretation and processing of intermediary words takes place within the data processor.

The displays include both lamp displays 233 and numeric displays 238. As shown in FIG. 2 both the lamp displays 233 and the numeric displays 238 are mounted on the display subpanel board which is in turn mounted on the mother panel board 182. The lamp displays may be conventional bayonet type lamps and the display subpanel board contains a batch fabricated block of lamp sockets which receive the lamps. These lamp sockets provide the multiple functions of mounting, electrical connection and heat sink. Each lamp may be selectively connected to ground either directly or through a flasher bus. The lamp displays are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements are conventional 9 segment displays capable of displaying all numerical characters and some alphabetic characters. However, the interactive control system has sufficient data capacity to accommodate 13 segment tubes capable of displaying all numeric and alphabetic characters if desired. The eight numeric display elements of this embodiment are mounted horizontally on the display subpanel board.

Coupled to the lamp displays 233 are lamp drivers which are coupled to the lamp display register. With the exception of a few lamp drivers which are hardwired to respond to special functions such as over temperature, P/S error, Power on and input hold, each lamp driver responds to a selected bit of an intermediary binary digital output word stored in the lamp display register.

The implementation of the 8 numeric display elements 238 is considerably more complex than that used for the lamp displays. Because each numeric display element requires multi-bit control signals a cyclic technique is used to drive all eight numeric display elements from a single numeric display register, thereby greatly reducing the amount of circuitry required. To accomplish this the eight numeric display elements are sequentially excited at a flicker-free 30 cps rate. In order to excite each numeric display element at a rate of 30 cps the contents of the numeric display register must change at a cyclic rate of 240 cps.

The numeric display functions are performed in the data processor 112 under program control and include the numeric display counter, the update control, the refresh control, and the data registers. These functions are not physically identifiable, but are implemented under program control of the data processor. The display parameter is converted from a binary to a BCD code, then modified for the special segment code requirements of the numeric display tube. The tube identification code is packed into the word, which is output to the numeric display register in the interactive control system.

In order to excite one of the numeric display elements the data processor 112 utilizes the count of the numeric display counter implemented under program control, for example, binary 3 indicating that the third numeric display element is to be excited, to access a location in the memory 130 storing information to excite the third numeric display with the proper character. This information is transferred from the memory 130 to a least significant portion of the A-Register where it is joined by the binary count from the numeric display counter parameter (3) stored in memory in the most significant portion to form the intermediary digital output word.

This output word is transferred from the A-Register through I/O Channel-5 to the numeric display register. As the word is output the numeric display counter is incremented so that the fourth numeric display element will be excited next. In addition to providing intermediary output words to the numeric display register at a rate of 240 cps, the data processor also updates the locations in the memory 130 which store the information determining the character to be displayed by each numeric display element. This updating occurs at a cyclic rate of 16 cps or twice per second for each memory location. This is about as fast as the eye of the operator can follow changes in the characters displayed by the numeric display elements.

The contents of the three numeric display select bits in the most significant portion of the numeric display register are communicated by three pairs of lines, each pair representing the Q and $\overline{Q}$ outputs from a flip-flop, to a decoder. The decoder activates one of eight select drivers, the third select driver in this instance. Simultaneously, nine segment drivers are selectively excited according to the character information stored in the least significant portion of the word in the numeric display register, each driver being responsive to a different bit. In some circumstances, it may be desirable to convert the character information to a binary code, thereby reducing the number of bits required to define a character, but necessitating the use of a decoder between the numeric display register and the segment drivers. However, such a coded technique is not used in this application.

The segment drivers present drive signals forming the stored character to the appropriate segments of all eight numeric display elements. However, only the third numeric display element, which receives a select signal from the select drivers, displays the selected character.

The elemental nature of system subsystems and the related data processor coaction under program control may be utilized to simplify system setup procedures, thereby minimizing setup time as well as errors. One of the major problems that every user of sophisticated control equipment has is that of familiarizing a new operator with the complex maze of switches, lights and other controls. This is particularly important to a company which has a high turnover of personnel. Even experienced operators, on occasion will neglect to set a switch properly or overlook a procedure which could have a disastrous result.

This control panel provides a means for interactivity between the data processor and an operator. Included in this interactivity is a unique feature which permits the data processor to "lead the operator by the hand" through various operations and procedures the operator must perform for proper machine operation.

For this purpose, an operator's manual may be used in conjunction with the numeric displays on the control panel and a special program in the data processor. The operator's manual is divided into several sections, each pertaining to a particular mode of machine operation. The parameter switch would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears, showing whether the last step was properly performed until the system can be started. This permits a totally inexperienced operator to sequentially perform the entire system set up or initialization.

Servo Command Structure

An apparatus and method is presented wherein a digital device precisely controls a path of a physical system such as a multi-axis analog servo for control of a machine. By providing successive integral path defining commands with an independent variable resolution finer than the resolution of the analog device with respect to that variable, the digital device is able to drive the analog device along a smooth but precisely controlled path substantially without discontinuities associated with the digital commands.

An integral command is so designated in contrast to an incremental command. An incremental command has only a single value which is usually the desired resolution value of the commands. An integral command may be a whole number command having a range of values to permit a particular parameter to be resolved with a single command. Integral number commands are exemplified with binary coded delta parameters as will be discussed hereafter. Integral number commands may include other number commands, but specifically exclude incremental commands. Integral time domain commands are exemplified hereafter with the command parameter defined by the time position of a signal.

In a servo control system in accordance with the invention, a general purpose stored program computer generates integral commands in response to predetermined desired system conditions such as temperature, pressure, position, velocity or acceleration to control a multi-axis servo system. The computer can operate open loop to command the execution of predefined commands as in a numerical control system or can operate closed loop to provide a response to parameters such as position, velocity or temperature of controlled analog devices. The analog device itself may operate open loop or may have a closed servo loop using analog or time domain feedback signals.

The use of integral commands and time domain signals intrinsic to both the digital and analog domains permits the elimination of expensive analog to digital converters, digital to analog converters and digital differential analyzers. When a time domain integral command signal is compared with a time domain feedback signal, a very precise time domain error signal is attained from which an analog control signal may be generated simply and inexpensively. As used herein a time domain signal is one in which the magnitude of information carried thereby is proportional to a time related characteristic of the time domain signal, such as the pulse width of a squarewave signal or the time between corresponding transitions of a squarewave time domain signal and a squarewave reference signal.

The use of integral commands provides substantial advantages when applied to a servo control system. Because each integral command can substantially resolve the relative slopes of the controlled axes, the commands can be presented in real time at a rate commensurate with the response rate of cutoff frequency of the controlled mechanism and substantially independent of the slopes being resolved. In contrast, presently known systems require a data rate commensurate with the resolution of the system, as for instance, one part in 10,000, which is substantially greater than the rate required for integral commands.

Stored program counters operate in "computer time", having peripheral equipment such as magnetic tape drives "slaved" to the time related requirements of the computer. In order to directly control a physical system having specific time requirements such as response time, a computer may be constrained to the time requirements of the physical system, herein referred to as real time.

A stored program digital computer in accordance with the invention provides intermediate integral commands between path end points in an iterative manner to command a precisely defined path. These integral commands may be provided directly as a time domain signal in the form of a phase referenced squarewave. Alternatively, the computer may provide digital integral commands from which the time referenced squarewave command signal is readily generated. The phase referenced squarewave command signal is compared with similar feedback signals to produce a very precise time domain error signal which may take the form of an asymmetrical squarewave. By providing the successive integral commands at a rate which exceeds the time resolution or response rate of the servos, a smoothing or filtering effect is attained wherein the servos follow the discontinuous integral commands with a smooth path closely following the intermediate command points.

A system is presented wherein a digital device controls an analog device to cause system variables to define precisely controlled paths substantially free of the discontinuities associated with the digital commands. This freedom from discontinuities will exist when the resolution of the independent variables is finer than the resolution of the system with respect to those variables. The dependent variables are system conditions which are being controlled and the independent variables are controlling system conditions. A dependent variable might be a system condition such as pressure or temperature or it might be the status of a mechanism with respect to an axis, such as position, velocity or acceleration. An independent variable might be time, a system condition or the status of a mechanism.

In accordance with the invention, a data processor operates under program control to generate integral commands precisely controlling the position of a multi-axis servo with respect to time. Each integral command completely defines the relationship of each axis with respect to the other axes and with respect to time. By generating path defining commands with a time resolution equal to or finer than the time resolution of the analog device, the discontinuous integral commands are smoothed by the integrating or filtering effect of the physical inertia and electronics of the analog device. As long as the rate at which an analog system can respond to a command is substantially equaled or exceeded by the rate at which integral commands are generated, and if the magnitude of the commands does not exceed the response capability of the system, the actual path will closely follow the integral commands and the commands will be actual path defining.

Communication between digital and analog devices is provided with time domain signals intrinsic to both the digital and analog domains. These time domain signals contain a very precise information content and can be manipulated with relatively simple equipment without loss of precision. They may also be used to easily generate signals in the analog or digital domains. As disclosed herein, integral time domain command signals may be generated directly by a computer or by a command structure in response to digital integral number commands generated by the computer. Time domain position feedback signals are generated directly by a properly excited analog resolver.

Although many different arrangements will become obvious to those skilled in the art, in the preferred embodiment of this invention a phase referenced squarewave signal is generated directly by a digital computer under program control. The phase referenced squarewave signal is a time domain signal and provides integral path defining commands to a closed loop squarewave servo.

As an alternative arrangement the data processor 112 receives a squarewave position signal, a position error signal and a velocity signal to form a closed digital loop. The computer is responsive to discrete inputs with the skip on discrete instructions to precisely measure the duration or phase of these feedback signals and process them as digital integral numbers. Because the data processor is now in a closed loop it can utilize the feedback signals to modify the integral commands and control an adaptive controller. Use of adaptive control permits precise control over the instantaneous position error of each axis by varying the gain of the power amplifier.

Independent of the advantages attained by placing the data processor in a closed loop, direct communication between the data processor and the servo in the time domain permits most components and functions of the command structure to be eliminated. By using the data processor to perform additional real time functions, the command structure may be reduced to a reference squarewave generator and a flip-flop, which serves a function similar to the flip flop $N_{30}$. All squarewaves including the reference and command squarewaves may be derived in this manner.

The data processor is responsive to the reference squarewave $\phi B$ as well as the feedback signals as discrete inputs and clocks the toggling flip-flop with discrete outputs. These discrete outputs as synchronized with the reference signal $\phi B$ and have a selected phase relationship indicating a commanded position just as position command signal.

Additionally, the data processor may be programmed to provide a time domain error signal by toggling a flip-flop using a technique similar to that used to generate the position command signal in conjunction with flip-flops. The pulse width squarewave signal is communicated to the digital to amplitude converter which generates the servo control signal. The time domain error signal may be provided either as an override of the normal time domain error signal under appropriate circumstances or in lieu thereof with the comparator circuits being completely eliminated.

Additional circuits may be used to reduce the task of the computer in generating command signals and sensing feedback signals. For instance, a counter may be used to measure or control the time between squarewave transitions for phase or pulse width signals.

OPERATION

The operation of the CNC system will be generally described with reference to parent applications Ser. No. 101,881; Ser. No. 230,872; and Ser. No. 232,459; and in related application Ser. No. 101,449. Operation is determined by modes, conditions, and commands such as defined by the control panel 114, display panel 118, source of parts programs such as the tape reader 116, and other devices.

Preparatory (g) and miscellaneous (m) commands are parts program auxiliary commands used to set internal control conditions and external machine conditions, respectively. The g and m commands are defined in Table V and described hereafter. The data processor 112 receives these auxiliary commands from a source of parts program commands such as the tape reader 116, parts program memory 130, control panel 114, auxiliary I/O channels 128, or other sources. The data processor 112 sets operating conditions such as packing discrete bits into a digital word or other well known techniques to set the system conditions, providing available system condition information for executing these commands when required. Nomenclature used in Table V is defined, hereafter. The "COMMAND" column defines the command symbol. The "RELATED" column defines the relation between these commands and implies whether they are mutually-exclusive, resulting in the reset of the command. The "EXECUTE" column defines whether this particular command is executed immediately or at the end of a block. If executed immediately, the motion commands in that block will be executed in conjunction with this new auxiliary command. If executed at the end of that block, the motion commands in the block will be executed as if this new auxiliary command had not been programmed, where this new command will then be executed at the completion of the other commands in that block. The "MODAL" column defines whether the command is modal or not modal. If the command is only used in that block, it is automatically reset after the execution of the block and must be reprogrammed in subsequent blocks when required. If the command is modal, it is stored until changed; where it will operate on every subsequent block of commands until it is changed. The "INITIALIZE" column identifies the condition of this command when the system is turned-on, identified with the INITIALIZE light. The "NOTES" column briefly describes the functions of these commands. The commands defined in Table V are further described in EIA STANDARD RS-274-B, incorporated herein by reference. Many of these commands are defined in greater detail hereafter to illustrate the operation of this CNC system.

The machine home position is a fixed absolute position on the machine that may be used as an absolute position reference. The ability of the data processor 112 to sense the absolute position of the machine axes such as described in parent applications Ser. No. 101,881 and Ser. No. 134,958 and Control System permits the data processor 112 to keep track of the precise positions of the machine axes. The data processor senses the machine axes conditions from servos 120, 121, and 122 with signals 123 or directly with signals 126, then controls the machine 124 to perform the commanded operations. In one embodiment, the machine home position is an absolute position point, the general location of the home position is defined by a switch on each axis and the precise location of which is defined by the pickoff null. The data processor will drive the selected axes until the discrete switch closure is detected with signals 123 or 126, then the data processor will creep the selected axes into the pickoff null positions. The machine home position is commanded with m codes. Various parameters are selectable with the data processor stored programs, such as axes (with associated m codes), direction of slew for each axis, slew velocity, and home position coordinates.

TABLE V

| COMMAND | RELATED | EXECUTE IMMED. | EXECUTE AT END OF BLOCK | MODAL | INITIALIZE | NOTES |
|---|---|---|---|---|---|---|
| g01 | A | Yes | — | Yes | 1 | Linear Interpolation |
| g02 | A | Yes | — | Yes | 0 | Circular Interpolation CW |
| g03 | A | Yes | — | Yes | 0 | Circular Interpolation CCW |
| g04 | — | Yes | — | No | | Dwell From Tape |
| g07 | — | Yes | — | No | 0 | Rapid Traverse |
| g08 | B | Yes | — | No | 0 | Acceleration |
| g09 | B | — | Yes | No | 0 | Deceleration |
| g12 | | Yes | — | No | 0 | Full Circle In One Block |
| g17 | D | Yes | — | Yes | 1 | Circular Interpolation, xy Plane |
| g18 | D | Yes | — | Yes | 0 | Circular Interpolation, zx Plane |
| g19 | D | Yes | — | Yes | 0 | Circular Interpolation, yz Plane |
| g27 | — | Yes | — | No | | Floating Zero Definition |
| g28 | R | Yes | — | Yes | 0 | Axis Rotation On |
| g29 | R | Yes | — | Yes | 1 | Axis Rotation Off |
| g33 | J | Yes | — | No | 0 | Threading |
| g40 | C | Yes | — | Yes | 1 | Cutter Compensation Cancel |
| g41 | C | Yes | — | Yes | 0 | Cutter Compensation Left |
| g42 | C | Yes | — | Yes | 0 | Cutter Compensation Right |
| g50 | V | Yes | — | Yes | 1 | Absolute-All axes |
| g51 | V | Yes | — | Yes | 0 | Incremental-All Axes |

TABLE V-continued

| COMMAND | RELATED | EXECUTE IMMED. | EXECUTE AT END OF BLOCK | MODAL | INITIALIZE | NOTES |
|---|---|---|---|---|---|---|
| g52 | V | Yes | — | Yes | 0 | Incremental-x axis |
| g53 | V | Yes | — | Yes | 0 | Incremental-y axis |
| g54 | V | Yes | — | Yes | 0 | Incremental-z axis |
| g55 | V | Yes | — | Yes | 0 | Incremental-b axis |
| g80 | W | Yes | — | Yes | 1 | Canned Cycle Cancel |
| g81–89 | W | Yes | — | Yes | 0 | Canned Cycle Select |
| g90 | H, | Yes | — | Yes | 1 | IPM Feedrate |
| g91 | H,J | Yes | — | Yes | 0 | IPR Feedrate |
| g92 | H,J | Yes | — | Yes | 0 | RPI Feedrate |
| m00 | g | — | Yes | No | 0 | Program Stop |
| m01 | g | — | Yes | No | 0 | Optional Stop |
| m02 | g | — | Yes | No | 0 | End of Program |
| m03 | e | Yes | — | Yes | 0 | Spindle CW |
| m04 | e | Yes | — | Yes | 0 | Spindle CCW |
| m05 | e,g | — | Yes | Yes | 1 | Spindle Off |
| m07 | f | Yes | — | Yes | 0 | Coolant 2 On |
| m08 | f | Yes | — | Yes | 0 | Coolant 1 On |
| m09 | f | Yes | — | Yes | 1 | Coolant Off |
| m21 | k | Yes | — | No | 0 | x Axis Home Position |
| m22 | k | Yes | — | No | 0 | y Axis Home Position |
| m23 | k | Yes | — | No | 0 | z Axis Home Position |
| m24 | k | Yes | — | No | 0 | 4th Axis Home Position |
| m25 | k | Yes | — | No | 0 | 5th Axis Home Position |
| m30 | g | — | Yes | No | 0 | End of Tape |
| x | — | Yes | — | Yes | +00.00000 | x Absolute Position |
| y | — | Yes | — | Yes | +00.00000 | y Absolute Position |
| z | — | Yes | — | Yes | +00.00000 | z Absolute Position |
| b | — | Yes | — | Yes | +00.00000 | b Absolute Position |
| t | — | Yes | — | Yes | 00 | Tool Change |
| s | — | Yes | — | Yes | 0000 | Spindle Speed |
| f | — | Yes | — | Yes | 30.00 | Feedrate |
| FRO | — | Yes | — | Yes | 100% | Feedrate Override |
| a | — | Yes | — | Yes | 5 | Acceleration Ramp |
| d | — | Yes | — | Yes | 5 | Deceleration Ramp |
|  | — | — | Yes | — | Selected | Cycle Off |
|  | — | Yes | — | — | Not Selected | Cycle On |
|  | — | — | — | — | Selected | Initialize |
|  | — | — | — | Yes | Not Selected | Mirror Image |
|  | — | — | — | Yes | Not Selected | DNC |
|  | — | — | — | Yes | Not Selected | Block Delete |
|  | — | — | — | Yes | Not Selected | Optional Stop |
|  | — | — | — | — | — | Spindle Interlock |
|  | — | — | — | — | — | Drive Interlock |
|  | — | Yes | — | — | ASCII | Tape Code |

The data processor 112 executes the slew routine to drive the selected axes with signals 123 in the specified direction at the specified velocity, with continued testing of the discrete home position switch signals 126 to define the stopping point. A drive resolution of 0.004 inches or better is desired to insure repeatable detection of the home position switch closure condition. Acceleration and deceleration are often not required, where the specified velocity is usually low enough to permit velocity step functions without loss of synchronization. The slew feedrate is conveniently modifiable under stored program control to accomodate different machine characteristics. When the discrete home position switch is detected, zero synchronization is initiated to position the axis to the precise resolver null. Because the applicability of this feature is a function of the type of machine, it is programmed as a subroutine for ease of incorporation or deletion. Program execution speed is of little consequence so memory utilization is a primary consideration. An automatic fixed cycle is provided to selectively return each machine axis to the home position. The home position fixed cycle is initiated with m commands m21 through m25 (defined in Table V), where each m command will cause the computer to translate the associated axis to the home position for that axis. Caution should be exercised to prevent interference between the tool, workpiece, and machine during this positioning operation.

Spindle commands consist of spindle speed, spindle direction, and spindle off commands. These commands are modal, where they need not be reprogrammed until a new condition is required. Spindle speed is programmed directly in rpm (Table V). All spindle speeds are accepted by the data processor regardless of the value. When a spindle speed can't be achieved due to speed range or discrete speed steps of the spindle control, the programmed speed is rounded-off by the data processor 112 to the speed that can be achieved immediately below the programmed speed. Spindle clockwise (CW) and counterclockwise (CCW) directions are commanded with an m03 and an m04, respectively, to start the spindle rotating in the commanded direction at the beginning of the block to which they are programmed, therefore permitting the spindle direction change to be programmed in the same block with the motion commands that require this new spindle direction. Spindle off is commanded with an m05 to stop the spindle from rotating at the completion of the block in which it is programmed so this spindle off command can be programmed in a block containing the last motion commands that require spindle motion.

Physical Organization

The prior art controls and interfaces are relatively large devices that are often contained in a large cabinate that is set apart from the machine. This arrangement is illustrated in FIG. 3A, where the control 300 and control interface 302, which is typically part of the control, are set apart from the machine 124 and machine interface 304 and are interconnected with cables 306. The control 300 provides machine commands to the control interface 302 which communicates with the machine interface 304 over cabling 306. The machine interface 304 is typically composed of magnetic relays which perform computational operations to process and execute the commands from the control system 300. Various physical embodiments of the system of this invention are shown in FIGS. 3B through 3E, where the interface 304 may be an elemental interface 305. In the preferred embodiment, the machine interface relays used for computational operations that can be performed in the data processor under program control are eliminated. Certain relays that are used as "amplifiers" to provide high power signals, such as for motor excitation, obviously can't be eliminated with computer processing, where such relays or their equivalents are still required in the system. To practice this invention it is required that machine control operations be performed with the data processor, but it is not necessary to perform all machine control operations with the data processor. Therefore, some or all of the discrete machine interface computational type operations would be performed with the data processor.

The terms computational operations or computational processing used herein are intended to mean machine control operations or processing including timing, sequencing, and logical operations.

The terms "discrete" and "static" such as with discrete machine control operations and static machine control operations are used to define what may also be termed on-off type operations. These terms may be contrasted to contouring operations which can be termed "dynamic" operations.

FIG. 3B illustrates an embodiment where the interface 302 is mounted with the control 300 and communicates with the machine 124 with parallel discrete condition signals over cabling 306. FIG. 3C illustrates an embodiment where the interface 302 is set apart from both, the machine 124 and the control 300. The control 300 may communicate with the interface 302 with serial discrete condition words over cabling 308 and the interface 302 may communicate with the machine 124 with parallel discrete condition signals over cabling 306. FIG. 3D illustrates an embodiment where the interface 302 is mounted with the machine 124 and set apart from the control 300. The control 300 may communicate with the interface 302 with serial discrete condition words over cabling 308. Communication between the interface 302 and machine 124 is internal to the machine structure and therefore does not pose the cabling problems described herein and therefore may be in serial or parallel discrete word form. FIG. 3E illustrates an embodiment where the control 300 and interface 302 are both mounted on or in the machine structure 124. Although the serial and parallel communication may be the same as discussed for FIG. 3C, communication internal to a single structure does not pose the cabling problems described herein and, therefore, may be in either serial or parallel form.

In the preferred embodiment shown in FIG. 3E and in more detail in FIG. 3F, the control 300 is integrated into the machine structure 124. The machine 124 may be an elemental extremity of the computer system as described in parent Ser. No. 101,881. One form of this embodiment is illustrated in FIG. 3F, where a block representation of a machine 124 is shown with a pendent 310 on a movable structure 311 to permit the operator to position the pendent 310. This pendent 310 contains a control panel 114 and a display panel 118 and may also contain other parts of the system such as the computer 112 and other electronics. An auxiliary electronics subsystem 312 containing devices such as power supplies and motor drives may be set apart from the pendent 310 and physically mounted in conjunction with the machine 124 as part of the machine structure or may also be positioned under the machine or behind the machine. A portable subsystem 314 may be provided containing equipment that is only required occasionally and, therefore, is not an integral part of the machine-control system. This portable subsystem 314 may, therefore, be used in a shared manner with many machine systems. The portable subsystem 314 may contain special equipment that is required only for machine setup and not for production operation of the machine. This special equipment may be a tape reader 116, a typewriter 156, a CRT 158, a control panel 114, a display panel 118 and other such setup equipment.

One embodiment of this system would incorporate a parts program memory located in the machine related control units such as pendent electronics 310 and auxiliary electronics 312. The controls necessary to operate the system from the parts program in the parts program memory would be contained in this system, such as with pendent electronics 310. The tape reader 116 or other parts program loading device would be contained in the portable subsystem 314, because this parts program loading equipment would only be required for special operations such as for setup. Similarly, the control equipment used to edit the parts program could be contained in the portable subsystem 314. The stored parts program capability and the associated loading and editing equipment are described in parent application Ser. No. 230,872. When a new production run is to be set-up, the portable system 314 would be brought to the machine 124 and plugged in with cables 316. A parts program would be loaded into the computer 112 contained in the machine units 310 and 312 and used to run the machine 124 to cut the part for checkout. Parts program errors would be corrected by the operator with the portable equipment 314 or alternately with the machine units 310 and 312. After the parts program has been checked out, the portable equipment 314 would be removed and the machine would be turned over to production.

Figure 5B:
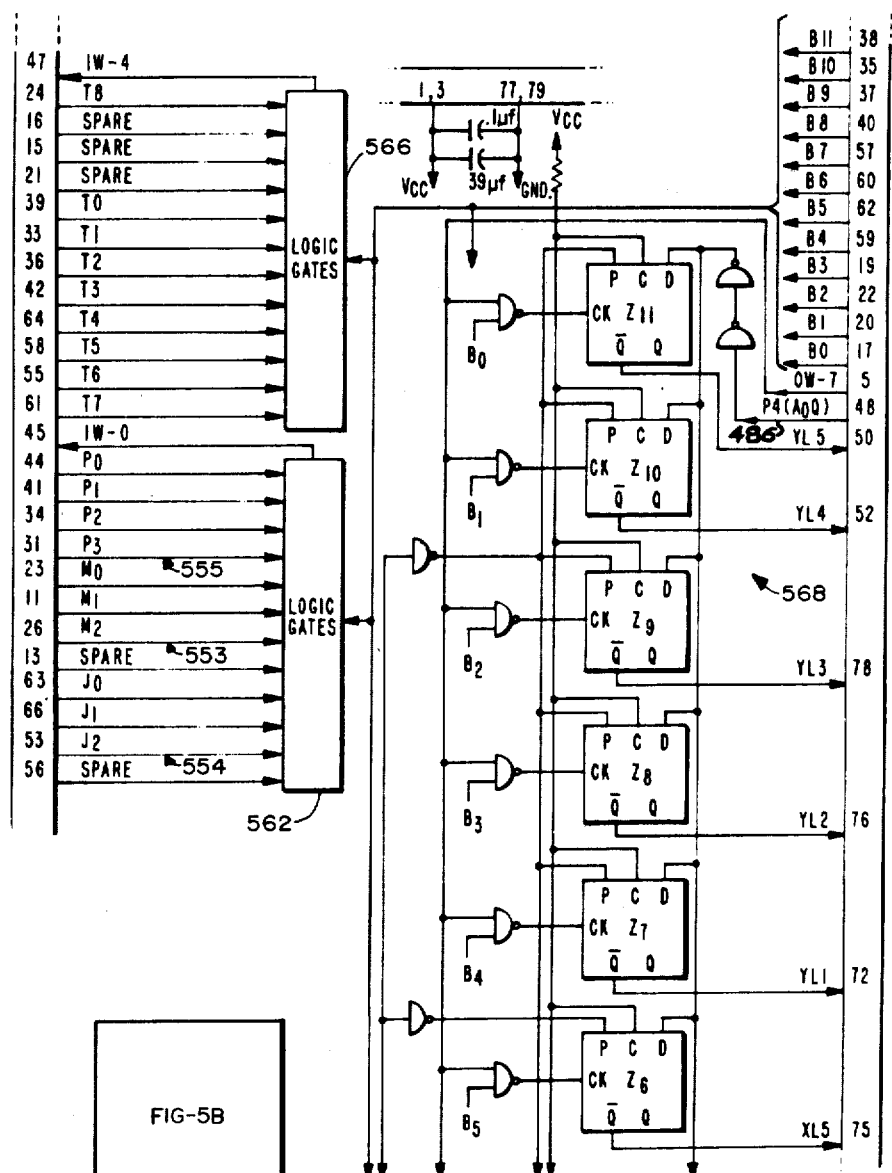
FIGS. 5A, 5B and 5C is a schematic and block diagram representation of the IFA-2 circuit board, where
Figure 5A:
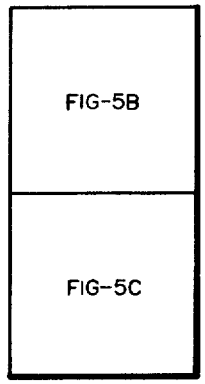
Figure 5C:
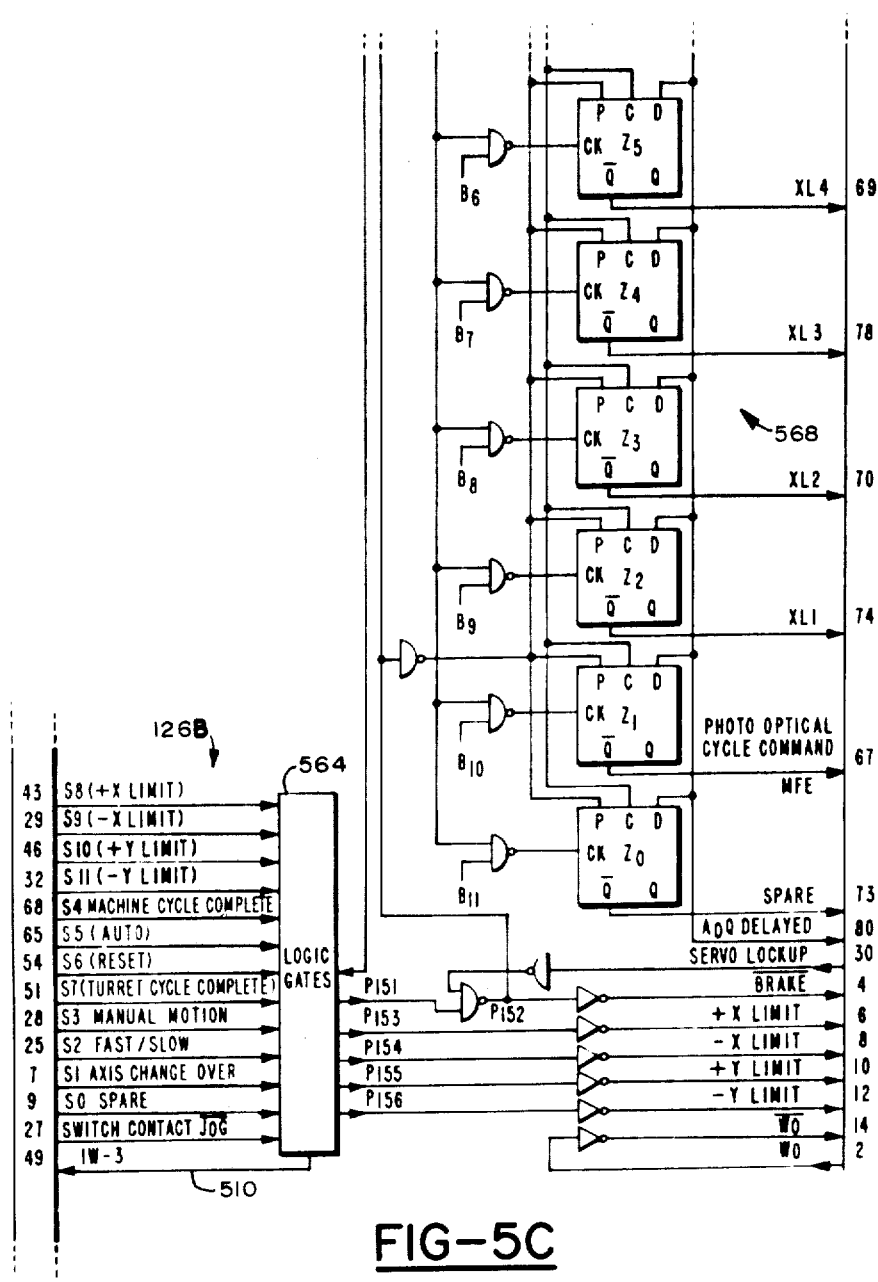
Figure 6:
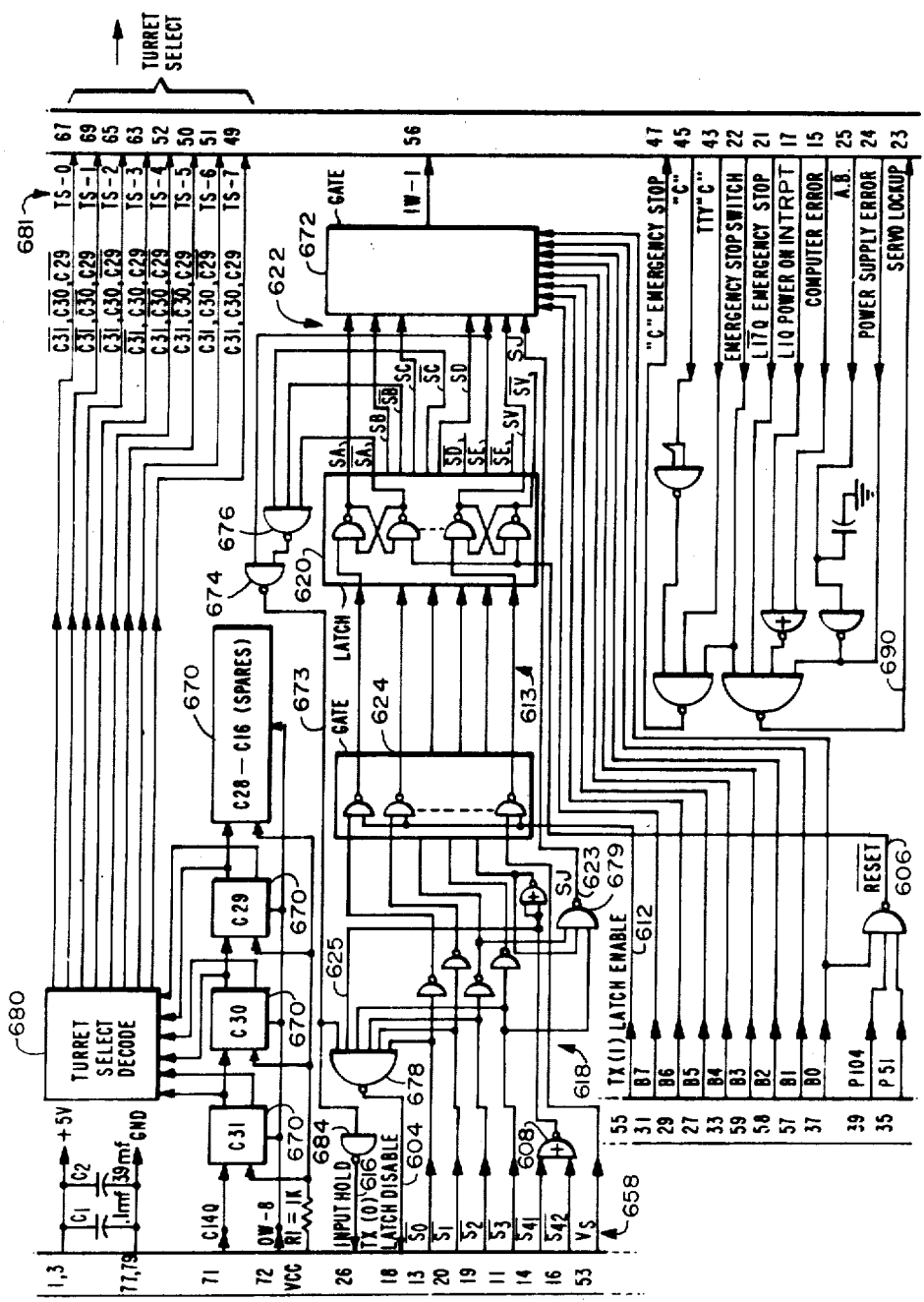
FIG. 6 is a schematic and block diagram representation of the IFA-3 circuit board.

In one embodiment, the interface electronics shown in FIGS. 4, 5, and 6 can be physically mounted in the machine subsystem, apart from the control subsystem. In another embodiment, portions of the interface electronics shown in FIGS. 4, 5, and 6; particularly the C-Register 460 and 670; can be physically mounted in the machine subsystem, apart from the control subsystem.

It will become obvious to those skilled in the art that the machine interface shown in FIGS. 4, 5, and 6 and described herein can be partitioned as illustrated in FIG. 3F, where the machine interface electronics 302 can be physically contained in the pendent 310 or in the auxiliary electronics 312 or alternately in separate machine mounted modules 318.

The terms interface assembly and IFA relate to the computer I/O structure, machine interface and various auxiliary devices. This interface assembly is not an interface in the prior art terminology, but is an elemental interface. It may be considered to be a distributed collection of communications devices such as the computer I/O and interface registers. This elemental interface operates in an on-line manner, dependent on computer co-action, operating with computer intrinsic signals, and performing it's operations in response to the computer stored program operations.

The interface assembly (IFA-1, IFA-2, and IFA-3) is not an interface in the conventional sense but constitutes a distributed group of circuits that are normally associated with the data processor and the various system entities. The interface assembly also performs the function of signal distribution between the data processor and various system extremities.

The IFA-1 printed circuit board is shown in FIG. 4 and contains logic gates 450, 451, 452, and 453 providing input/output functions. The IFA-1 board accepts input and output type instruction micro-operation signals as well as address signals to encode or decode the various inputs and outputs. The input and output words are exchanged with the A-Register in the data processor 112, discussed in parent Ser. No. 101,881. The input words (IW) are multiplexed by logic gates 453 into signal P108 which is input to the A-Register. Information is output from the A-Register to the various system extremities by connecting the extremities to the A-Register output signal ($A_oQ$) 486 and clocking a selected extremity with a gated clock (P104) 489 as determined by logic gates 452. Discrete inputs are multiplexed into discrete input signal (P105) 491 by logic gates 450. Discrete outputs are decoded and gated by logic gates 451 with micro-operation signal FAH 490 providing the gating. The discrete input signals are accessed with skip on discrete decision instructions, providing a short negative going pulse when selected with a discrete output instruction. The I-Register flip-flops 456, 457, 458, and 459 perform the functions of latches which are toggled or set with the discrete outputs DO-4 through DO-8. The $I_1$ flip-flop 456 is used to directly provide a Scratch Pad Memory paging function. Outputs from the flip-flops $I_2$ 457, $I_3$ 458 and $I_4$ 459 are fed back to the computer 112 as discrete inputs. The signals P50–P61 are decoded operand addressed from the data processor 112.

The C-Register 460 is loaded with the $A_oQ$ signal 486 from the computer 112 A-Register when clocked with the OW-8 gated clock pulse 487 to synchronize this data transfer. The C-Register output signals C15Q–C6Q are then used to control functions such as machine interface functions. The C-Register illustrates the "data pipe" concept discussed in detail hereafter, where the C-Register may be extended without limit such as shown in FIG. 6 as the C-Register extension (C31–C16) 670. The computer 112 packs together or assembles the discrete conditions in the A-Register as described hereafter, then outputs this packed discrete word to the interface register (C) 460 and 670 to command system conditions.

The IFA-2 printed circuit board is shown in FIGS. 5B and 5C and provides for the scan-in of input words "zero", "three", and "four" to convert the parallel input lines to a serial input that can be processed with the input word multiplexer 453 on the IFA-1 card. Logic 562 scans control panel selector switch signals into input word −0, logic 564 scans non-adapted machine condition signals into input word −3 and logic 566 scans rudimentary intrinsic tape reader input signals into input word −4. The Z-Register 568 includes flip-flops $Z_{11}$ through $Z_o$ and is a static register loaded with output word −7 for system discrete interface commands. It should be noted that this register does not have ambiguous outputs during the shift frame due to selective clocking of the flip-flops in this register.

The machine interface arrangement and logic, illustrated in FIG. 5C with logic gates 564, packs a plurality of machine feedback signals S0 through S12 into computer input word −3 (IW-3) 510. The computer 112 unpacks these signals under program control, as described hereafter. The manual machine controls S1, S2, and S3 provide the computer with operator commands from machine mounted switches which may be on a machine control panel 114 or a pendant control panel 310 hanging from a machine overhead structure 311. These operator controls may be mounted on the machine to give the operator the capability to command the functions while he is close to the machine such as for set-up operations.

The machine signals S4 through S7 relate to feedback from the machine. The cycle complete signal S7 can be used for a turret or a spindle condition for automatically controlling machine operations. The machine cycle complete signal S4 is a generalized machine cycle signal used to detect machine conditions such as the machine spindle stop condition described hereafter. The machine limit switches S8 through S11 are used by the computer to detect whether the machine has exceeded the physical translational dimensions, causing the computer to take the required action such as entering a slide hold condition to stop machine translation.

The scan-in logic 562, 564, and 566 provides serial data inputs to the computer A-Register. The scan-in logic acts as a multiplexer, which multiplexes parallel input conditions with the sequential bit time signals B0–B11 of the computer to provide a sequence of input conditions such as with IW-0, IW-3, and IW-4 from scan-in logic 562, 564, and 566, respectively. When an EX instruction is executed, the corresponding IW signal is selected with IW logic gates 453 for loading the input word into the A-Register with the input signal (P108) 488. The system input signals such as the machine conditions S0–S11 from scan-in logic 564 constitute packed discrete conditions assembled into a word with the scan-in logic for loading into the A-Register.

The IFA-3 printed circuit board is shown in FIG. 6 and provides an extension of the C-Register ($C_{31}$ through $C_{16}$) to perform auxiliary functions such as to excite the turret decode logic for machine turret select 681. Logic gates 672 provide the input gating and logical functions associated with the momentary switch logic conditions from the control panel 114 and multiplex those conditions into input word −1. Special gating is also provided for computer interrupts. The servo lockup signal 690 is used to disable the machine drives when a detrimental condition is sensed.

Control of a machine turret such as for tool change will now be described with reference to FIGS. 5 and 6. When the computer 112 receives a turret change command such as from tape reader 116, the computer will test the system conditions as interlocks such as limit switch signals S8–S11 with scan-in logic 564 and will proceed with the turret change if the interlocks are properly set. The computer will then determine the required code for the commanded turret position, pack this code into the discrete command word in the A-Register, then output this command word to the C-Register 460 and 670. The turret command will be stored in the C31, C30, and C29 stages of the C-Register 670 to excite the turret select decode logic 680, to select the desired turret output line (TS-0 through TS-7) 681. The machine turret motor will drive until the appropriate machine position switch is actuated, thereby switching off the selected drive signal 681 and stopping the turret at the selected position. The computer 112 will monitor the turret cycle complete signal S7 with scan-in logic 564 such as for an interlock to disable other machine commands until the turret cycle is complete.

Figure 7:
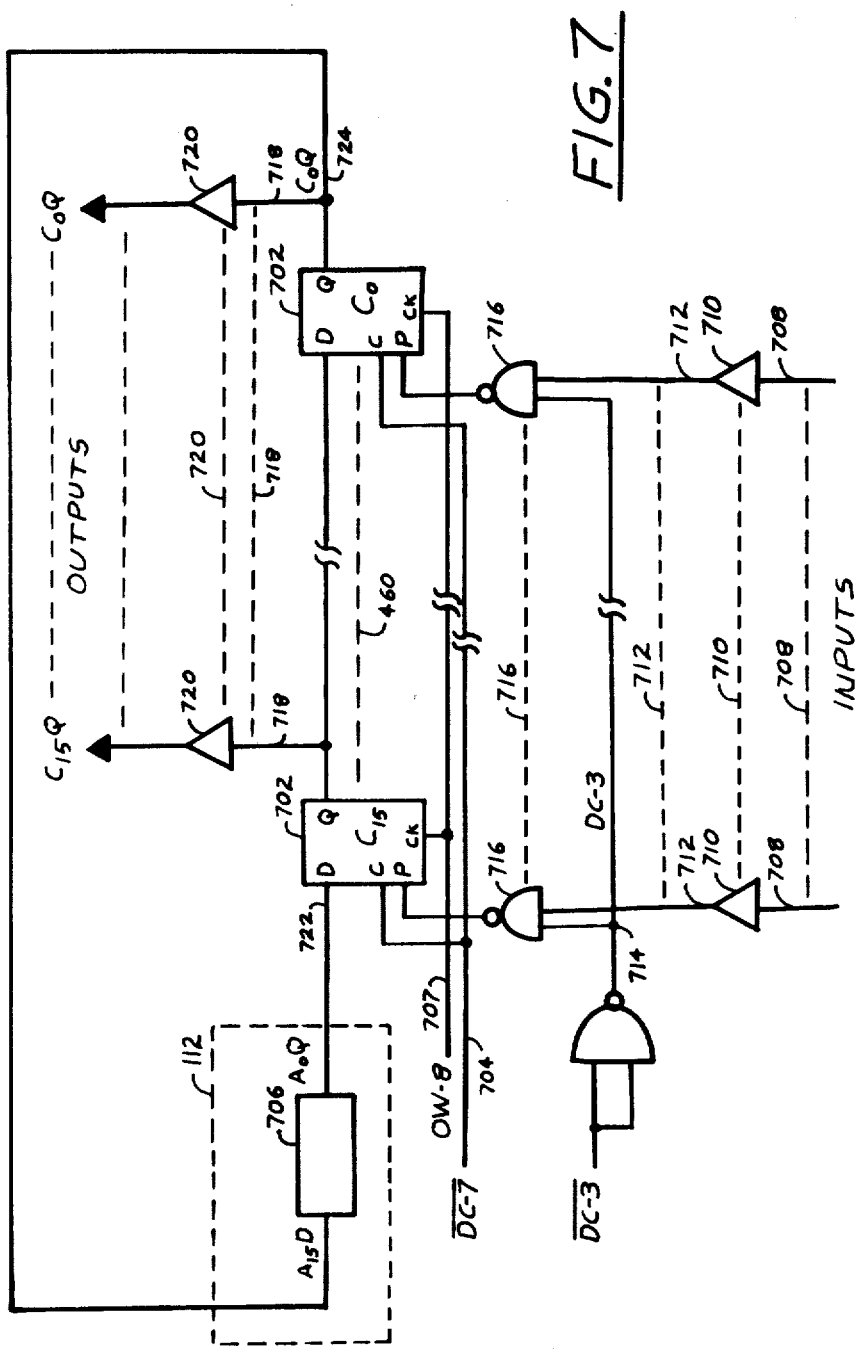
FIG. 7 is a logical schematic diagram of an interface register arrangement.

An alternate embodiment of the interface register (C) 460 is illustrated in FIG. 7 as a multi-function register to provide both, input conditions to the computer 112 and output conditions to the machine 124. Although this register is illustrated using what is commonly known to those skilled in the art as small scale integration such as SN7474 flip-flops and S/B 7400 gates, medium scale integration such as SN 74199 registers and large scale integration devices can also be used. The machine interface register (C) 460 is composed of sixteen stages ($C_0$ through $C_{15}$) 702 and is similar in mechanization and function to the C-Register illustrated in FIGS. 4 and 6, but performs not only output command functions but also input sampling functions.

When it is necessary to change the output machine commands and/or sample the input machine conditions; the computer 112 under program control will fetch from memory where stored or assemble the output machine command word in the A-Register, then the computer 112 under program control will perform a sequence of operations such as with a subroutine. One form of this sequence is first to execute a discrete output-7 instruction (DO-7) to clear the C-Register 460 with the DC-7 signal 704; then to execute a discrete output −3 (DO-3) instruction to selectively preset the C-Register 700 to the machine conditions 708 enabled with the DC-3 signal 714; then to execute an Input/Output −8 instruction (EX-8) to simultaneously clock the A-Register 706 in the computer 112 and C-Register 460 in the interface to exchange the contents of these two registers to transfer the new machine commands from the A-Register 706 into the C-Register 460 and to transfer the machine conditions 708 from the C-Register into the A-Register for computer processing.

The load mode is asynchronous and is controlled with the discrete output −7 instruction (DO-7) 704 to first clear the C-Register and with the discrete output −3 instruction (DO-3) 714 to next preset the C-Register to those machine input conditions that are "one" set. These input conditions 708 may be from relays, switches, or other sources and are often processed with line receivers 710 to provide integrated circuit voltage levels which are well known in the art. The input signals 712 are gated with the DO-3 signal 714 through gates 716 to selectively preset the C-Register flip-flops 701 to the one state if the corresponding input conditions 708 are true.

The shift mode is synchronous and is controlled with an instruction such as EX-8, where the OW-8 gated clock 707 provides a 16 clock pulse shift frame, as described in parent application Ser. No. 101, 881. The contents of the A-Register 706 are shifted into the C-Register 460 as the $A_0Q$ signal 722 and the preloaded contents of the C-Register 460 are shifted into the A-Register 706 as the $C_0Q$ signal 724 from the C-Register, also shown as the $A_{15}Q$ signal. This exchange operation between the C-Register and the A-Register provides a simultaneous input/output operation for loading a new set of output commands into the C-Register and/or sampling a new set of machine conditions from the C-Register and discussed in parent application Ser. No. 101,881. Other such arrangements will become obvious to those skilled in the art such as independent input and output registers for either an output command operation or an input sampling operation or with a scan-in for input samples as shown in FIG. 5 with scan-in logic 562, 564, and 566 and FIG. 6 with scan-in logic 672.

The word shifted into the C-Register 460 is maintained in a latched condition until changed with another Input/Output −8 (EX-8) instruction. The logic level output signals ($C_{15}Q$ through $C_0Q$) 718 may be processed with well known line driver circuits 720, such as to provide sufficient excitation to actuate relays, motors, or other devices.

In the preferred embodiment, an interface register such as the C-Register 460 and 670 is physically located in the machine subsystem. In one embodiment, the control subsystem is physically separate from the machine subsystem and connected to the machine subsystem by cables. The interface data is communicated between the control subsystem and the interface electronics in the machine subsystem in serial data form over the interconnecting cables, thereby reducing the cabling over that of a prior art control system that uses parallel data communicated through the cables. In this embodiment, the various operations are performed under program control in the control subsystem, but multiplexed or packed serial data 126 is communicated with the machine subsystem 124 to reduce interconnections. Multiplexing and demultiplexing are the primary functions performed in the machine in the form of serial-to-parallel and parallel-to-serial conversions. Secondary functions that may be performed in the machine include power drives for output signals and line receivers for input signals, illustrated in FIG. 7. This physical partitioning with logic and computational operations performed in the control and with drive, receiving, and parallel/serial conversion operations performed in the machine has been found to have particular advantages over prior art systems, such as for reduced cabling and increased reliability. The various partitioning arrangements have previously been described in detail in conjunction with FIG. 3.

The interface described herein is not limited to a machine interface, but can provide similar advantages when used with other arrangements such as a control panel 114 and a display panel 118 described in detail in parent application Ser. No. 101,881 and in related application Ser. No. 101,449.

Switch Control

Machine conditions are usually provided to the control subsystem with switch type devices as discrete inputs such as signals 126B a shown in FIGS. 1A and 5C. These switch type devices may be operator toggle switches, selector switches and momentary switches; machine limit switches; relay contacts and other well known switch devices. These switch devices are discussed herein as a group of switch devices and as a distributed switch subsystem which may include distributed groups of switches on the control panel 114, the machine 124, and on other subsystems.

The switch subsystem may be an elemental extremity for the preferred embodiment of this invention; wherein the switch subsystem does not provide for the usual interface operations such as elimination of switch bounce, which may be performed by the data processor 112 in response to the stored program contained in the main memory 130. This switch subsystem is processor dependent and requires data processor coaction for operation.

The data processor 112 provides processing and signal translating capability, yielding versatility and low cost. The switch subsystem is a processor dependent extremity that is elemental in form and communicates with the data processor 112 in signal formats intrinsic to the switch subsystem. Operative dispersion is used to fulfill system requirements including signal translation and communication; where the data processor 112 processes the data in a time format intrinsic to the elemental switch subsystem.

This elemental switch subsystem may be a part of a factored computer system 10, wherein the prime functions have been factored and separated from this switch subsystem The factored prime functions of the switch subsystem may be redundant, where these prime functions can be performed by the data processor 112. The data processor 112 is considered to be in a non-redundant, irreducible form. Factored prime functions of the switch subsystem that are redundant are eliminated in the switch subsystem and performed with the data processor 112, thereby reducing the hardware associated with the switch means and providing a minimal structured or elemental switch subsystem, dependent on this operational dispersion of the data processor 112 in the performance of the switch control operations. This system 110 may also be considered an integrated computer system, wherein the factored prime functions that are merged into the data processor causes an overlapping of switch subsystem functions as if the data processor and switch subsystems were integrated together. For example, the elimination of switch bounce is associated with the switch subsystem, but is performed by the data processor 112. Switch control operations have been assumed by or integrated into the data processor 112, where these switch subtasks are performed by the data processor 112 with the resultant elimination of switch circuitry.

The elemental switch subsystem has a passive nature, where switch control operation is dependent on data processor coaction to actively provide switch functions. This passivity results from the factoring and reduction of redundant prime functions. As an example of this passivity, the activation of a switch such as the mode selector switch 240 will have no effect on the system except through the data processor under program control.

The data processor 112 communicates with the elemental switch subsystem in a signal form intrinsic to the elemental switch subsystem and acceptable to the data processor 112. These intrinsic signal forms are rudimentary signals comprising ambiguous portions such as switch bounce in addition to the data portions such as the switch condition.

The general purpose nature of the data processor is thus extended to the elemental switch extremity. A change can often be made in the operation of this elemental switch device with merely a change in the stored program of the data processor, thereby eliminating the requirement for a major redesign in the switch subsystem. For example, well known table look-up operations permit defining switch related program operations by storing appropriate parameters in a table of parameters stored in main memory 130. The conditions sensed by the switches can be redefined merely by changing the data processor stored program, such as described for the parameter selector switch 242 in the numerical control system for both a milling machine and a lathe. For a milling machine, the assignments can be X Axis 227, Y Axis 226, Z Axis 225, B Axis 224, Sequence Number 223, Spindle Speed 222, I Arc Center 228, J Arc Center 229, K Arc Center 230, M Command 231, G Command 232, Feedrate 237, Feedrate Override 239, Cutter Compensation 243, and spare 221. For a lathe the assignments can be X Axis 227, Z Axis 226, Sequence Number 225, Spindle Speed 224, Turret Select 223, Tool Offsets 222, I Arc Center 228, K Arc Center 229, M Command 230, G Command 231, Feedrate 232, Feedrate Override 237, and spares 221, 239, and 243. These selector switch assignments can be changed and the execution can be defined under data processor program control. It will become obvious that this flexibility in defining switch identification and control functions under program control extends to the other switches such as the machine condition switches, as will be described with the following example for the numerical control DNC commands hereafter.

The use of several switch controls and lamp displays, as provided for in the panel design, will permit DNC operation to be controlled from the panel. Use of the control panel 114 to process the internally stored parts program blocks of commands is presented in parent application Ser. No. 101,881 particularly page 21 lines 12 through 16 and other descriptions therein.

The operation of one embodiment of the panel DNC functions, shown in FIG. 2, will next be described. The switches that control the DNC operation are the DNC Source Select switch 280 and the DNC Mode switch 282. Lamp displays may be used to define the DNC modes. In one embodiment, these are the DNC lamp 270, the Execute lamp 272, the Edit lamp 274, the Delete lamp 276, and the Record lamp 278. Activation of the DNC Source switch 280 will alert the data processor to an operator command to change the source of parts program commands. The data processor 112 will alternately toggle the DNC lamp 270 to the on state, then to the off state, then to the on state and so forth in response to each activation of the DNC Source Select switch 280, alternately selecting the parts program memory and the tape reader as sources of parts program commands. When the DNC lamp 270 is illuminated, the system is in the DNC condition; where the data processor will operate on the parts program commands stored in the parts program memory. When the DNC lamp 270 is extinguished, the system is in the Tape condition where the data processor will operate on the parts program entered through the tape reader 116.

The flexibility in defining the operation of the control panel switches and the display panel lamps with the data processor under program control is described in parent application Ser. No. 101,881; particularly page 4 lines 29 through 30, page 5 lines 1 through 6, page 29 lines 1 through 17, page 19 lines 24 through 28 and other descriptions therein.

In one embodiment of DNC operation, the lamp displays 218 are used to define system conditions. One of the DNC mode lamps 272, 274, 276, and 278 will be illuminated to define which of the four DNC modes has been selected. The DNC Mode switch 282 will permit the operator to sequence the system through the modes until the DNC mode that is displayed satisfies the operator. Each depression of the DNC Mode switch 282 by the operator will cause the DNC Mode lamp that is illuminated to be extinguished and will cause the next DNC Mode lamp in sequence that is extinguished to be illuminated. Each depression of the DNC Mode switch 282 will cause the next one and only that one DNC mode lamp to be illuminated in the sequence of first the Execute lamp 272, next the Edit lamp 274, next the Delete lamp 276, next the Record lamp 278, and then back to the Execute lamp 272.

The control panel has three selector switches and a plurality of momentary switches as shown in FIG. 2. The three selector switches; a Mode switch 240, a Jog switch 241, and a Parameter switch 242; are multiple position rotary selector switches. The remaining switches are momentary switches which maintain contact only so long as they are held down. Because hardwiring of switch controls is avoided by having intermediary output words communicated to and interpreted by the data processor 112, the number of selector switches as well as the number of contacts on each selector switch can be easily varied to meet the requirements of a specific application.

Several alternate embodiments of the switch subsystem are presented for illustration. Machine switch signals 126B are shown as directly interrogated by the data processor in FIG. 5C, where switch signals S0 through S11 126B are accessed with an EX-3 instruction through scan-in logic 564 on signal line IW-3, pin 49. These switch signals are rudimentary signals containing the switch bounce characteristics and are not logically preprocessed. Selector switches 240, 241, and 242 on the control panel 114 provides input signals which are shown in FIG. 5C as signals P0 through P3 555 representing inputs from the parameter switch 242, M0 through M2 553 representing inputs from the mode switch 240, and J0 through J3 554 representing inputs from the jog switch 241; accessed by the data processor 112 with an EX-0 instruction through scan-in logic 562 on signal line IW-0, pin 45. These selector switch signals are rudimentary signals containing the switch bounce characteristic but are encoded to reduce interconnections. Momentary switches such as with the cycle start switch 246 on the control panel 114 are shown as interrogated by the data processor in FIG. 6, where switch input signals SA through SE 622 are accessed with an EX-1 instruction through scan-in logic 672 on signal line IW-1, pin 56. These momentary switch signals may have logical preprocessing to remove switch bounce, provide encoding, and provide buffering. In the preferred embodiment, the direct interrogation of the rudimentary switch signals such as described previously for the machine switch signals S0 through S11 126B is used. All switch signals will herein be considered to be unprocessed rudimentary switch signals as with that preferred embodiment.

Switches are well known input devices and can take many forms such as momentary switches, rotary switches, relays, and others. Also, other input devices provide input conditions that can be processed as described herein for switches such as with a typewriter and an electromechanical punched tape reader.

The data processor under program control loads a digital word 126B comprising rudimentary switch signals and processes those switch signals to obtain appropriate switch information. Various transitionary conditions such as electrical noise, switch bounce, and other such effects can cause erroneous switch information. Therefore, an embodiment is shown which requires that the transient nature of the switch condition stabilize before the switch command is executed. This is achieved by providing for multiple samples by the data processor 112 with a prescribed period between samples. The occurance of a number of sequential samples where the samples compare is required prior to executing the operation commanded by that switch.

The description of panel operations performed with a computer incuding switch sampling, switch processing and lamp commands using discrete input samples and discrete output commands provides an arrangement similar to that used with the machine interface discrete conditions. It will be obvious to those skilled in the art that this description of panel operations is similar to machine operations with discrete condition processing and is intended to illustrate machine interface operations.

Figure 8C:
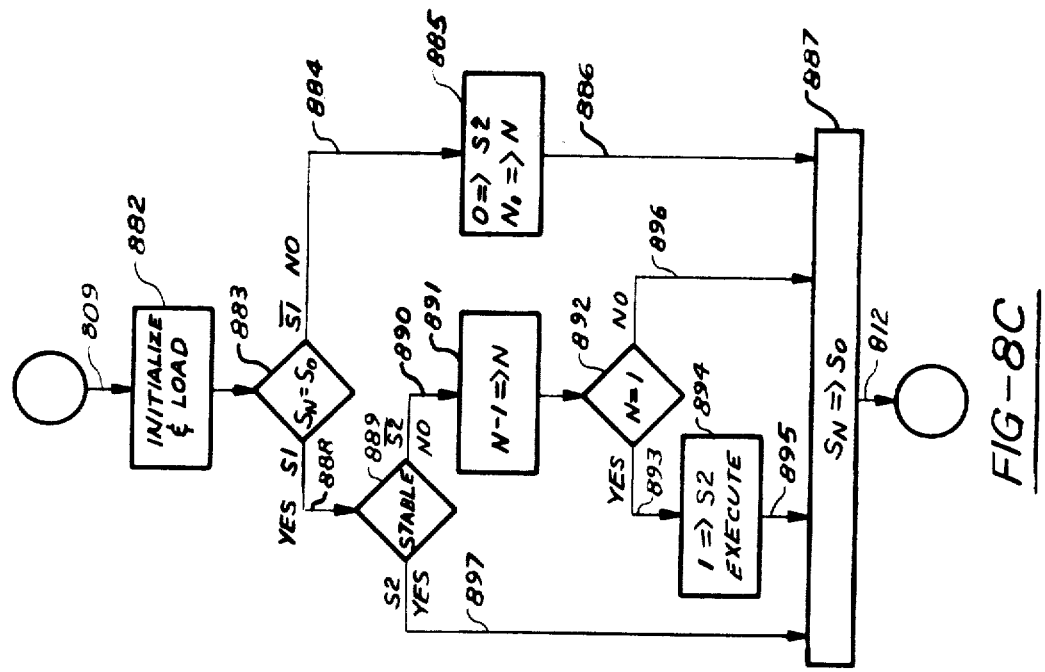
FIG. 8C shows a switch input routine.
Figure 8A:
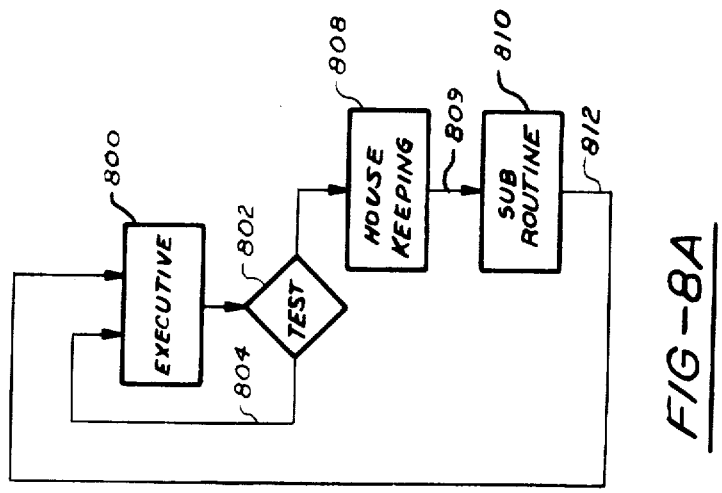
FIG. 8A shows an executive routine.

One embodiment of the data processor stored program operations that can be used to process rudimentary switch inputs is described hereafter in conjunction with FIG. 8C.

Program Operations

The data processor 112 executes an executive routine to control program operations and provide for time sharing with program subroutines. The data processor detects inputs and conditions with the executive routine, then transfers to the various program subroutines necessary to perform the computations and generate the outputs. The data processor can execute programs on a time shared basis by branching out of subroutines such as on a sequential, interrupt, or priority basis in a manner well known in the art. For simplicity of description, relatively complex program operations such as time sharing operations are not shown in the flow diagrams in FIG. 8; but will become obvious to those skilled in the art.

The data processor stored program operation will be described hereafter. The data processor 112 is responsive to a stored program contained in main memory 130 to provide this processing capability. Operation of the data processor 112 is controlled by the executive routine 800 to access subroutines to be executed, set the priority of these subroutines, define the timing, and other such well-known operations. The executive routine 800 controls the data processor to periodically test the real time parameter in operation 802 to determine if it is time to enter one of the real time subroutines; where the real time parameter may be derived from a real time clock, a program timer in the executive routine 800, or other well known means and methods for deriving this parameter. In one embodiment, this timer may be implicit in the stored program, where a transfer to the appropriate subroutine is provided after a certain number of instructions have been executed, thereby implying the required real time period. If the required periods have not expired, the data processor will return to the executive routine along path 804. If one of the required periods has expired to within the required tolerance, the data processor will preserve the return address and other parameters for reentry to the executive routine 100 and perform other required housekeeping functions in operation 808, then the data processor will enter the subroutine 810 along path 809 to perform the required program operations. The data processor will exit the subroutine by fetching the return address preserved in operation 808, then transferring back to the executive routine 800 along path 812.

The data processor can process the subroutines in an iterative manner, where the data processor repetitively enters the subroutine to perform a part of the programmed operations, then exits the subroutine. The data processor will successively enter, then process, then exit the subroutine providing the iterative characteristic.

Figure 8B:
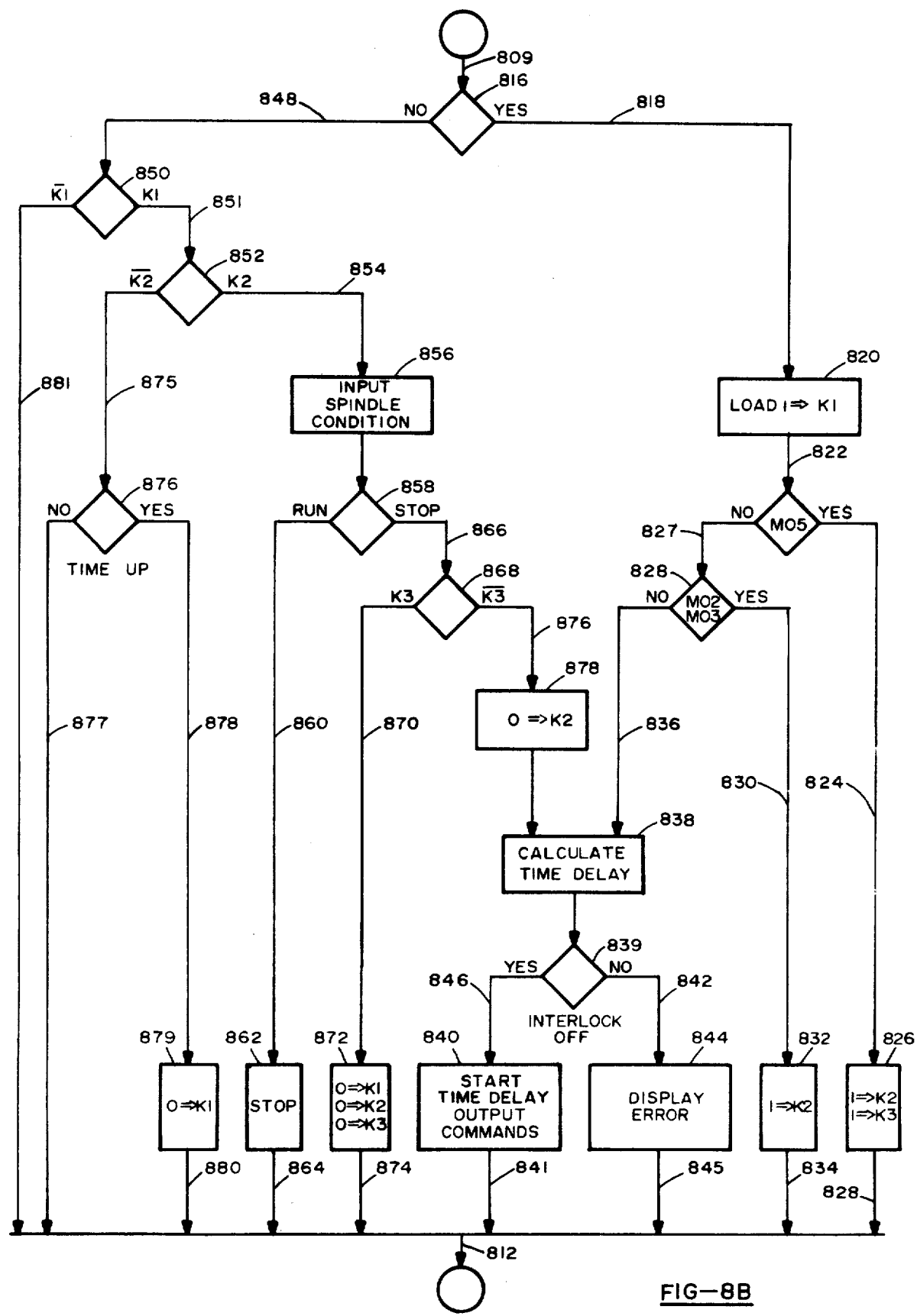
FIG. 8B shows a spindle control routine.

FIG. 8B shows a program flow diagram to illustrate one embodiment of machine control program operations. This illustrated operation controls the spindle and is typical of the other discrete control operations.

The data processor responds to the real time executive routine to provide entry to the machine control routine along path 809 as previously described and iteratively executes this routine to perform the required machine control operations. The data processor tests for a new spindle command in operation 816 such as from a parts program input or operator command input. If there is a new spindle command, the data processor will follow path 818 to operation 820, where the data processor will load the new commands and set the K1 condition to identify a spindle processing operation for subsequent iterations. The data processor will next test the input command to determine if it is a spindle stop command (M05) in operation 822. If it is a spindle stop command, the data processor will branch along path 824 to operation 826 and will set the K2 and K3 conditions to identify a spindle stop command condition for subsequent iterations. The data processor will next exit the routine along paths 828 and 812, as previously described.

If a spindle stop command (M05) is not detected in operation 822, the data processor will branch along path 827 to operation 828 to test for a spindle direction command (M03 or M04), indicative of a change in spindle direction; which would require bringing the spindle to a stop, then accelerating the spindle in the other direction. If a new spindle direction is commanded, the data processor will branch along the path 830 to operation 832 and set the K2 condition, which will command the spindle to first come to a complete stop before accelerating up to speed in the other direction. The data processor will then exit the routine along paths 834 and 812, as previously described.

If a spindle direction command is not detected in operation 828, the data processor will branch along path 836 to operation 838 to calculate the required time delay for the spindle to accelerate from the prior speed to the new speed. It should be noted that the K2 condition is not set because it is not necessary to bring the spindle to a complete halt to change between spindle speeds in the same spindle direction. The data processor will next exit operation 838 to test for the various interlocks in operation 839 prior to changing the spindle speed. If any of the interlocks are set, the data processor will branch along path 842 to operation 844 to perform the required operations associated with interlocks such as disabling system operation. These operations can include setting the slide hold condition to preclude machine motion, setting a lamp indicator to alert the operator to this interlock condition, and other such conditions. The data processor will then exit the subroutine along path 812 as previously discussed. If no interlocks are detected in operation 839, the data processor will branch along path 846 to operation 840 to calculate a time delay to permit the spindle to change speeds, then will output the interface commands to the interface register to command the spindle and then will exit the routine along paths 842 and 812 as previously described.

On subsequent iterations, the presence of additional spindle commands will be tested in operation 816. If there are no new spindle commands, the data processor will branch along path 848 to operation 850 to test for the spindle processing condition (K1) to determine if a spindle command is in the process of being executed. If the K1 condition is set indicating that a spindle command is being processed, the data processor will branch along path 851 to operation 852 to test for the requirement to bring the spindle to a stop. As previously described, the K2 condition is set to bring the spindle to a stop by either a spindle stop command (M05) as detected in operation 822 or a spindle direction change (M03 or M04) as detected in operation 828, each of which will set the K2 condition. If the K2 condition is set, the data processor will branch along path 854 to operation 856 to input the machine interface conditions as a packed discrete word, then to unpack the spindle stop condition bit such as the S4 or S7 condition bits shown in FIG. 5C, then to determine whether the spindle is stopped. The spindle stopped condition is tested in operation 858, where operation will branch along path 860 to operation 862 if the spindle is still running. In operation 862, the data processor will command the spindle to stop by fetching the interface command word from memory and packing a spindle stop condition bit into the appropriate bit position, then outputting this command word to the interface register as previously described. The data processor will then branch along paths 864 and 812 to exit the subroutine as previously described. The data processor will continue to iterate through this path under control of the real time executive routine until the spindle has stopped, as detected in operation 858, causing the data processor to branch along path 866 to operation 868 to test for the K3 condition. The K3 condition was set in operation 826 for a spindle stop command (M05), where the detection of a spindle stop condition in operation 868 will cause the data processor to branch along path 870 to operation 872 to reset the K1, K2, and K3 conditions that set the program logic for stopping the spindle, indicative of the completion of this spindle stop command. Operation will then branch along paths 874 and 812 to exit the subroutine.

If the K3 condition was not set in operation 868, the data processor will branch along path 876 to operation 878 to reset the K2 condition, indicative of the spindle having come to a stop. Because the K3 condition was not set, the spindle was stopped only to permit reversal of the spindle direction. The spindle must now be accelerated up to speed in the commanded direction. The data processor will branch to operation 838 to calculate the time delay, then branch to operation 839 to test for the interlocks, and then branch to operations 844 or 840 to either interlock operation or command the spindle to the new speed, respectively, as previously discussed.

On subsequent iterations, the requirement to accelerate the spindle to the new speed is detected in operation 852 with the $\overline{K2}$ condition, causing the data processor to branch along path 875 to operation 876 to test the time delay condition to determine if the time delay has expired for the spindle to accelerate to speed. If the time delay has not expired, the data processor will branch along path 877 and 812 to exit the routine. On subsequent iterations, the data processor will continue to test for the time delay in operation 876 until the time delay has expired, then will branch along path 878 to operation 879, where the K1 condition will be reset, indicative of the completion of the execution of the spindle commands. The data processor will then branch along paths 880 and 812 to exit the subroutine.

On subsequent iterations, the completion of the execution of spindle commands will be detected in operations 850 with the $\overline{K1}$ condition, which will cause the data processor to branch along paths 881 and 812 to exit the routine. This path will be followed on subsequent iterations until new spindle commands are input, as detected in operation 816.

Many important inventive features are embodied in the flow diagram of FIG. 8B. One important feature is the closed loop operation of the data processor 112 and the machine 124, illustrated herein with the sensing of the spindle stop condition bit as described in operation 856 and the continued iterations through the program until the computer detects the spindle stop condition. It is inconsequential as to the duration of time required for the spindle to stop because the data processor will continue to iterate through the program waiting until the spindle stop condition from the machine is detected.

Another feature illustrated herein is the open loop command of the spindle to accelerate up to speed with a data processor generated time delay, the expiration of which is indicative of the spindle achieving the speed. The time delay is set in operation 840 and continually tested in operation 876 as the data processor iterates through this routine. When the time delay has expired, the data processor will assume that the spindle has achieved the commanded speed and exit the time delay subroutine path 877 as described.

Still another feature illustrated is the optimization of time delays associated with spindle operations to minimize the time required to execute spindle commands. This optimization of time delays is accomplished with special logic that eliminates excessive or redundant time delays and with special computations that minimizes time delays. As an alternate embodiment, the spindle could be brought to a complete stop for each spindle command and then accelerated up to speed, providing a simpler program than that shown in FIG. 8B, but requiring excessive spindle time delays such as for conditions where a speed change is commanded without a direction change. The minimization of time delays is also achieved by the data processor calculating the optimum time delay in operation 838 rather than using a fixed, worse-case time delay as is used in the prior art magnetics interface devices. It will now become obvious that the time for the spindle to accelerate from one speed to a second speed is a function of the change in spindle velocity and the portion of the operational envelope that the spindle is on. The data processor can calculate the precise time delay required for the commanded spindle speed change as contrasted to the simplified alternatives of commanding a worst-worst case time delay for each spindle change.

The packing and unpacking program operations will now be discussed.

A packed discrete word may be considered to be a word with a plurality of condition bits representing command conditions or status conditions. For example, the data processor can output a discrete packed word with command conditions to an interface register to command various discrete machine functions and the computer can input a packed discrete word with status conditions from an interface register to define various discrete machine status conditions. The packing an unpacking of condition bits is performed under program control and provides interface hardware efficiency. It should be noted that a discrete condition may be a single binary bit either in the one or zero state located in a particular bit position of a digital word or may be a plurality of bits set in an array of one or zero states to define a more complex condition. As an example, a single bit may be sufficient to control the spindle on or off condition but a plurality of spindle speed bits may be required to define the various spindle speeds that can be commanded.

Status bits can be unpacked from an input word by logical ANDing or masking the input word with a control word, where the control word contains zeros in all of the non-related bit positions and ones in the related bit positions. The resultant masked word contains only the related conditions. Next, various program shifting operations are used to arrange the bit positions in the word, then various testing and processing operations detect the states of these condition bits for further processing.

Command bits can be packed into an output word by logical ANDing that word with a first control word; containing zeros in the bit positions to be modified to zero set the related bits in the command word, then logically ORing that command word with a second control word to pack command bits into the appropriate positions of the command word. The new command word is output to the interface register to generate machine commands and also stored in the computer as a record of the current machine command conditions.

In this manner, condition bits can be packed into or unpacked from digital words for the interface arrangement described herein. Other interface arrangements and programming methods will become obvious to those skilled in the art.

Processing of the rudimentary status condition signals to eliminate erroneous signal portions such as switch bounce will now be described.

A program flow diagram is shown in FIG. 8C to illustrate one embodiment of the switch processor operation. The real time executive routine provides entry to this switch control subroutine along path 809. Machine response time is in the order of a few tenth seconds so execution of this subroutine approximately every one tenth second will insure detection of a proper command. Other real time periods would be provided for switch occurances faster or slower than machine switches, such as for relays that operate faster than a machine.

The data processor 112 will enter the switch input subroutine through operation 882, which initializes the algorithm parameters and loads the new switch input condition. This condition may be an encoded condition, a discrete non-encoded condition, or other such input. The data processor compares this new condition (SN) with the old condition (SO) in operation 883, where the old condition (SO) was the last prior sample. If the old and the new switch conditions don't compare, then the switch condition has changed due to an operator action, electrical noise or other such cause. Data processor operation then branches along the non-compare ($\overline{S1}$) path 884 to program operation 885, where the data processor resets the stability condition bit (S2) to the unstable state ($\overline{S2}$) and preloads the stable sample program count parameter (N) to a predetermined count (No). This unstable state ($\overline{S2}$) identifies a change in switch condition. The count (No) in the stable sample counter defines the number of stable samples required to define a stable condition. The data processor will next follow path 886 to program operation 887 which stores the various program conditions and exits to the executive routine along path 812 as previously described.

If the old and new switch conditions do compare (S1) in operation 883, then the switch condition has not changed from the last prior sample. Data processor operation then branches along path 888 to program operation 889 where the data processor checks to determine if the switch condition is a stable condition. If the check in operation 889 shows that an unstable condition ($\overline{S2}$) exists, the data processor branches along path 890 to operation 891, where the data processor decrements the stable sample count parameter (N), indicative of the switch condition remaining stable for another sample period. The data processor then makes a check in operation 892 to determine if the stable sample count parameter (N) has been decremented down to one, indicating a sufficient number of stable samples to define a stable condition and to then execute the switch command. If the stable sample count parameter (N) is one, then the data processor branches along path 893 to operation 894, where the data processor sets the unstable condition ($\overline{S2}$) to the stable condition (S2) and executes the switch command. It should be noted that the data processor executes this operation 894 only once for each change in a switch input condition. The data processor then transfers to operation 887 along path 895 and exits the subroutine as previously discussed. If the stable sample count parameter (N) in operation 891 has not counted down to one, then the data processor branches along path 896 directly to operation 887 and exits the subroutine as previously discussed. This path 896 bypasses the operation 894 and, therefore, preserves the unstable condition that exists for at least one more sample period.

If the check performed in operation 889 shows that a stable condition exists (S2), where the last prior swtich command had been executed in operation 894, then the data processor branches along path 897 to operation 887 and exits the subroutine as previously described because there has been no new switch input to be processed.

Communication

Transmission of data through cabling and across an interface may cause problems for high speed digital data. Therefore, an arrangement is discussed that provides low frequency data and clock signals between a computer 112 and an interface register. These low frequency data channels can be provided with various arrangements such as (1) auxiliary registers and (2) discrete input and discrete output computer instructions.

In prior art computers, data transfers are performed in parallel to enhance computer speed. Also, in prior art machine control systems shown in FIG. 3A, the machine condition signals 306 are communicated between the machine 124 and the control 300 in parallel data form. Parallel data transfers require an excessive number of lines and associated electronics such as line receivers and line drivers. Therefore, the preferred embodiment of this invention uses serial data transfers between electronic subsystems and also provides a serial data transfer arrangement between the control subsystem and the machine. Serial data transfers are intended to mean sequential data transfers of a plurality of bytes, where the preferred embodiment discussed herein provides serial data transfers of sixteen single-bit-bytes per word.

Figure 9A:
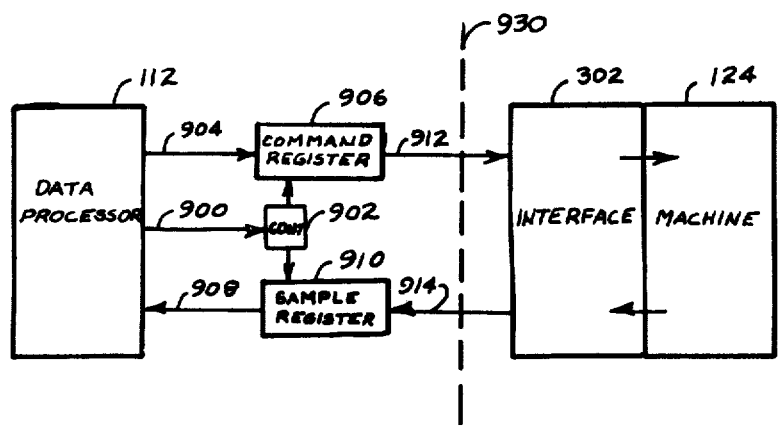
FIGS. 9A and 9B, is a block diagram of interface register and interface communication arrangements; where

The auxiliary register embodiment, illustrated in FIG. 9A, provides buffer registers 906 and 910 that are loaded at a first data rate and unloaded at a second data rate. For example, computer output command words 904 are loaded into the auxiliary register 906 at the high computer clock rates and are unloaded at low interface clock rates while computer input sample words 908 are loaded into the auxiliary register 910 at the low interface clock rates and are unloaded at the high computer clock rates. The data processor 112 provides command signals 900 to an auxiliary register control 902 to control the transfer of high data rate output command words from the computer 112 along line 904 to the command register 906 and to control the transfer of high data rate input sample words from the sample register 910 along lines 908 to the computer 112. Also, the auxiliary register control 902 controls the transfer of low data rate output command words from the command register 906 to the machine interface 302 along lines 912 for machine control and also the transfer of low data rate input sample words from the interface 302 to the sample register 910 along lines 914 to define machine conditions.

This auxiliary register interface embodiment can be similar to that described for the servo commands in parent application Ser. No. 134,958 where the computer loads servo commands into the auxiliary register and/or unloads servo data from the auxiliary register, then generates a discrete output instruction such as a DC-13 instruction to initiate the off-line operations at the servo clock rates.

For parallel computer input/output structures, the function of parallel-to-serial and serial-to-parallel conversions can also be provided with the auxiliary registers 906 and 910, as discussed herein with reference to FIG. 7, in addition to the data rate conversion for the communication function.

Discrete output and discrete input instructions can be used to communicate with an interface register in much the same manner as discussed for the 110 baud auxiliary channel for communication with a typewriter described in parent application Ser. No. 230,872 at page 15 line 14 through page 19 line 3 and also described in parent application Ser. No. 288,247.

For this interface embodiment, the computer 112 will clock the selected interface register with a discrete output, which can be the signal 707 in place of the previously discussed OW-8 clock signal, to load each command bit into that interface register, which may be the $A_oQ$ bit as described for the typewriter embodiment, and/or to a new bit available at the output at that interface register which can be sampled with a discrete input instruction.

Figure 9B:
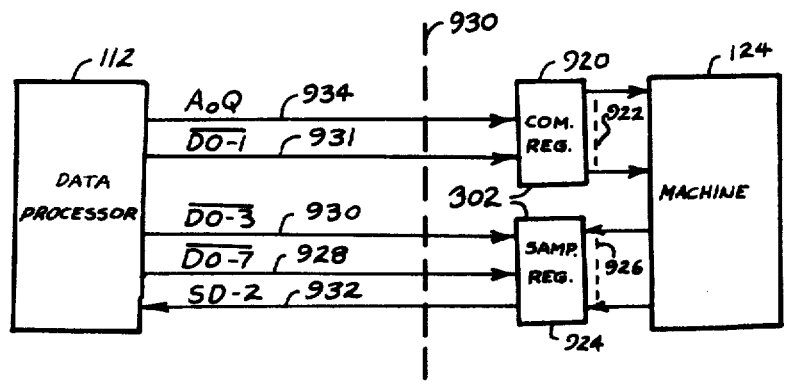

This embodiment is illustrated in FIG. 9B. The interface command register 920 is used to provide command conditions 922 to the machine 124 and the interface sample register 924 is used to sample machine conditions 926 and provide these conditions to the computer 112.

The computer 112 initiates an input sample operation with a discrete output instruction which generates a DO-7 command pulse 928 to command the loading of the machine conditions 926 into the interface sample register 924; then the computer 112 clocks the sample register 924 with discrete output instructions which generate DO-3 command pulses 930. The computer samples the output 932 of the sample register 924 with a skip-on-discrete-2 (DI-2) instruction after each discrete output clock instruction and packs the new machine sample condition 932 into a machine sample word under program control. The computer 112 samples all of the machine conditions in register 924 in sequence in this manner.

The computer 112 initiates an output command operation by packing the discrete command conditions into a discrete command word, then loading this packed discrete command word into the interface command register 920. This loading operation is performed by placing the command word in the A-Register so that the least significant bit of the A-Register ($A_oQ$) 934 is presented as the input to the command register 920, then executing a discrete output −1 instruction which generates a DO-1 command pulse 931 to clock the register 920 to shift-in the $A_oQ$ 934 command bit. The computer then executes a shift right instruction to place the next command bit in the $A_oQ$ position and then sequentially executes combinations of discrete output −1 instructions and shift right instructions until the command word in the A-Register has been clocked into the command register 920.

In another embodiment, the discrete output −3 (DC-3) pulse 930 can simultaneously clock both, the command register 920 and the sample register 924 to simultaneously input a sample bit and output a command bit. The computer 112 interleaves the input sample operations and the output command operations as will be obvious to those skilled in the art.

With reference to FIGS. 9A snd 9B, it can be seen that a low data rate interface 930 and serial multiplexed communication exists for each embodiment discussed, thereby providing the advantages of few interconnections and low data rate signals between the computer subsystem 112 and the machine subsystem 124.

The "data pipe" arrangement will now be discussed. A data pipe concept is illustrated in FIGS. 4 and 6 with the C-Register 485 and C-Register extension 670. The computer A-Register is a 16 bit register; described in parent application Ser. No. 101,881; yet the interface registers such as the C-Register that communicate with the A-Register may be of greater length. The combination of the A-Register and the C-Register comprises a data pipe, where the C-Register may be sequentially loaded from the A-Register with parameters output with sequential EX instructions to load these sequential parameters into the interface register and/or to sequentially unload the interface register into the A-Register. The length of the interface register is virtually unlimited, where a sequence of many 16 bit words can be clocked into or clocked out of the interface register. This data pipe concept is further illustrated with the servo registers where the three servos channels, the common board and the A-Register are serially connected as a "data pipe", as illustrated in parent application, Ser. No. 101,881. Data passes from the A-Register and is input to a register of the X axis servo through I/O channel −2. Data then passes from the X axis servo to I/O channel −2 of the Y axis servo. Similarly, data passes out of the Y axis servo into the Z axis servo and out of the Z axis servo to the common board and back to the A-Register. Thus, communication is provided between the data processor, the three servos and the common board.

The interface registers are shown as shift registers, where the output states go through loading transitions as the register is asynchronously preloaded or synchronously shifted such as with the C-Register 460. Typically, the transient nature of these transitions are fast enough so that they will not effect electro-mechanical devices such as relays. If high response equipment senses these register outputs, such as solid state electronic circuits, it may be necessary to eliminate this transient condition. This can be accomplished with logic shown in conjunction with the Z-Register 568, where the bit time signals B0 through B11 gate the clocks to each flip-flop $Z_{11}$ through $Z_o$ so that the flip-flops will be clocked when the corresponding data bit (P4 or $A_oQ$) 486 is shifted out of the A-Register of the computer 112. Therefore, the Z-Register output lines YL1-YL5, XL1-XL5, and MFE will change only between the last commanded state and the new commanded state without going through transient preload or shift states.

It is thus clearly seen that the present invention provides a novel means and method of providing a system for controlling a machine.

From the above description it will be apparent that there is thus provided a device of the character described possessing the particular features of advantage before enumerated as desirable, but which obviously is susceptible to modification in its form, proportions, operation, detail implementation and arrangement of parts without departing from the principles involved or sacrificing its advantages.

While in order to comply with the statute, the invention has been described in language more or less specific as to structural features, it is to be understood that the invention is not limited to the specific features shown, but that the means and construction herein disclosed comprise the preferred form of several modes of putting the invention into effect and the invention is, therefore, claimed in any of its forms or modifications within the legitimate and valid scope of the appended claims.

What is claimed is:

1. A control system for controlling a physical system, said control system comprising:
   a stored program data processor for processing digital information in response to a stored program, said data processor including
   (a) a memory for storing the program,
   (b) means for generating a first output signal under control of the program stored in said memory,
   (c) means for generating a first time delay following generation of the first output signal under control of the program stored in said memory,
   (d) means for generating a second output signal following said first time delay under control of the program stored in said memory,
   (e) means for generating a second time delay following generation of the second output signal under control of the program stored in said memory, and
   (f) means for generating a third output signal following said second time delay under control of the program stored in said memory; and a controller for controlling a physical system, said controller including
(a) means for controlling a first operation of a physical system in response to the first output signal,
(b) means for controlling a second operation of a physical system in response to the second output signal, and
(c) means for controlling a third operation of a physical system in response to the third output signal.

2. The system as set forth in claim 1 above, wherein said first operation controlling means includes means for controlling starting of a motor, wherein said second operation controlling means includes starting of a machine cutting operation after said first time delay, and wherein said third operation controlling means includes means for controlling stopping of a motor after said second time delay; wherein said second time delay is related to an operation of a machine.

3. The system as set forth in claim 1 above, wherein said controller includes a programmable interface for performing different tasks in response to execution of different task defining programs executed by said data processor; said controller including a register for storing the first output signal, the second output signal, and the third output signal and a plurality of amplifiers for amplifying the first output signal, the second output signal, and the third output signal.

4. A control system for controlling a physical system, said system comprising:
a first feedback channel for generating a first feedback signal in response to a first condition of a physical system;
a second feedback channel for generating a second feedback signal in response to a second condition of a physical system;
a third feedback channel for generating a third feedback signal in response to a third condition of a physical system;
a data link for receiving data link commands from a remote computer;
an integrated circuit stored program computer for processing digital information in response to a stored program, said computer including
(a) an integrated circuit main memory for storing the computer program,
(b) means for generating a first time delayed signal in response to the first feedback signal,
(c) means for generating a first command signal in response to the first time delayed signal,
(d) means for generating a second time delayed signal in response to the second feedback signal,
(e) means for generating a second command signal in response to the second time delayed signal,
(f) means for generating a third command signal in response to the third feedback signal, and
(g) means for generating a fourth command signal in response to the data link commands from the remote computer; and
an interface for controlling a physical system in response to the command signals from said stored program computer; wherein said interface includes
(a) a first controller for controlling the physical system in response to the first command signal,
(b) a second controller for controlling the physical system in response to the second command signal, (c) a third controller for controlling the physical system in response to the third command signal, and
(d) a fourth controller for controlling the physical system in response to the fourth command signal.

5. The system as set forth in claim 4 above, wherein said three feedback channels are uncommitted discrete feedback channels, and wherein said computer further includes means for committing said uncommitted feedback channels to feedback operations of a physical system in response to execution of a stored program by said computer.

6. The system as set forth in claim 4 above, wherein said computer further includes means for defining the significance of said four command signal generating means in response to the stored program.

7. The system as set forth in claim 6 above, wherein said four command signal generating means are uncommitted to system operations, said computer including means for defining the significance of said uncommitted command signal generating means under control of the stored program to control said physical system.

8. The system as set forth in claim 1 above, wherein said system is a numerical control system for controlling a machine tool, wherein said controller includes interface storing means for storing a discrete command word, wherein said data processor includes means for packing the first output signal, the second output signal, and the third output signal into a discrete command word, wherein said controller further includes means for storing the discrete command word in said interface storing means.

9. A machine control system comprising:
input means for providing input command signals related to desired machine operations;
feedback means for providing a discrete feedback signal related to a discrete machine condition;
a stored program data processor for processing the input command signals from said input means under control of a stored program, said data processor including
(a) a program memory for storing a data processor program,
(b) receiving logic for receiving the discrete feedback signal from said feedback means under control of the program stored in said program memory, and
(c) processing logic for generating a plurality of discrete command signals in response to the discrete feedback signal under control of the program stored in said program memory, and
(d) output logic for outputting a sequence of two command signals having a timing interval therebetween under control of the program stored in said program memory in response to the plurality of discrete command signals generated with said processing logic; and
interface means for controlling a machine operation in response to a sequence of two discrete machine commands signals from said output logic; said interface means including
(a) an interface register for storing the sequence of two discrete machine command signals output with said data processor output logic,
(b) an amplifier for generating a sequence of control signals in response to the sequence of two discrete machine command signals stored in said interface register, and (c) means for controlling a machine in response to the control signals.

10. The system as set forth in claim 9 above, wherein said program memory is a monolithic read only memory for storing the plurality of instructions.

11. The system as set forth in claim 9 above, wherein said data processor processing logic includes means for packing the plurality of discrete command signals into a digital command word under control of the stored program.

12. The system as set forth in claim 9 above, wherein said interface means includes means for providing a sequence of control signals in response to the sequence of command signals to control a sequential machine operation, wherein said sequence of command signals is stored in said interface register with a time interval between command signals related to the time for said machine to perform a commanded operation, and wherein said data processor further includes means for defining the time interval under control of the stored program and means for storing one of the sequence of discrete command signals in said interface register after the time interval has elapsed under control of the stored program.

13. The system as set forth in claim 1 above, wherein said system is arranged for direct control of a machine operation in response to processing of the input command signals by said data processor operating under control of the stored program.

14. The system as set forth in claim 9 above, wherein said system is a numerical control system for controlling a machine tool and wherein said interface means is an elemental interface means dependent on data processor co-action for control of a machine.

15. The system as set forth in claim 9 above wherein said data processor includes means for providing the machine command signals in real time having a format related to the operating elements of said machine; said machine being responsive to the machine command signals without computational operations for providing the commanded machine operations.

16. A machine control system having a stored program data processor for providing magnetics computational operations to eliminate machine magnetic devices used for control of a machine; said system comprising:
input means for providing input command signals related to desired machine operations;
feedback means for providing a discrete feedback signal related to a discrete machine condition;
a stored progam data processor for processing the input command signals from said input means under control of a stored program, said data processor including
(a) a program memory for storing a data processor program,
(b) receiving logic for receiving the discrete feedback signal from said feedback means under control of the program stored in said program memory, and
(c) processing logic for generating a plurality of discrete command signals in response to the discrete feedback signals under control of the program stored in said program memory, and
(d) output logic for outputting a sequence of two command signals having a time interval therebetween under control of the program stored in said program memory in response to the plurality of discrete command signals generated with said processing logic; and
interface means for controlling a machine operation in response to a sequence of two discrete machine command signals from said output logic; and interface means including
(a) an interface register for storing the sequence of two discrete machine command signals output with said data processor output logic,
(b) an amplifier for generating a sequence of control signals in response to the sequence of two discrete machine command signals stored in said interface register, and
(c) means for controling a machine in response to the control signal.

17. A machine control system comprising:
a data link for communicating machine control information with a remote computer;
machine feedback means for generating a machine feedback signal related to a machine operation, said machine feedback means including
(a) a transducer for generating a transducer signal in response to a controlled machine operation and
(b) feedback interface circuitry for generating the machine feedback signal in response to the transducer signal from said transducer;
an integrated circuit stored program computer for generating a machine command signal in response to the machine feedback signal from said machine feedback means, said computer including
(a) an integrated circuit main memory for storing a program,
(b) an integrated circuit operand memory for storing machine control operands,
(c) integrated circuit data link input circuitry for loading machine control operands into said operand memory in response to the machine control information communicated with said data link,
(d) integrated circuit machine feedback input circuitry for generating a computer input signal in response to the machine feedback signal from said machine feedback means,
(e) integrated circuit processing circuitry for processing the machine control operands stored in said operand memory in response to the computer input signal from said machine feedback input circuitry and under control of the program stored in said main memory, and
(f) integrated circuit output circuitry for generating the machine command signal in response to the computer input signal responsive processing of the machine control operands with said processing circuitry;
interface circuitry for generating a machine control signal in response to the machine command signal from said computer output circuitry, said interface circuitry including
(a) means for storing an interface signal in response to the machine command signal from said computer output circuitry and
(b) means for generating the machine control signal in response to the interface signal stored with said interface signal storing means.

18. The system as set forth in claim 17 above, further comprising a lathe for performing a lathe operation in response to the machine control signal from said interface circuitry, wherein said machine control system is a lathe control system, wherein said lathe includes a translational member for translating a tool and a rotational spindle for rotating a workpiece, wherein said feedback means is a spindle feedback means for generating a machine spindle feedback signal related to a machine spindle rotational operation, and wherein said machine control signal responsive lathe operation is a translational operation for translating said tool in response to the machine control signal.

19. The system as set forth in claim 17 above, wherein said feedback means is a translational feedback means for generating the machine feedback signal related to a machine translational motion operation and wherein said interface circuitry further includes means for controlling a translational operation for translating said translational member in response to the machine control signal.

20. The system as set forth in claim 17 above, wherein said stored program computer main memory is an integrated circuit read only memory.

21. The system as set forth in claim 17 above, wherein said transducer includes a resolver for generating the transducer signal in response to motion of a machine element and wherein said machine control signal generating means includes a closed loop servo for generating the machine control signal in a closed loop manner in response to the interface signal stored with said interface signal storing means.

22. The system as set forth in claim 17 above, wherein said transducer includes a mechanical contact transducer having a mechanical bounce characteristic, wherein said transducer signal includes a signal bounce characteristic, and wherein said computer input circuitry includes means for compensating for the signal bounce characteristic of the machine feedback signal under control of the program stored in said main memory to generate the computer input signal in response to the machine feedback signal.

23. The system as set forth in claim 17 above, further comprising a machine having a rotary spindle for providing spindle rotation and a machine translation element for providing translation relative to spindle rotation in response to the machine control signal from said interface circuitry, wherein said interface circuitry further includes means for controlling a spindle rotation operation, wherein said transducer is a spindle rotation transducer, wherein the transducer signal is a spindle rotation transducer signal, and wherein the machine feedback signal is related to spindle rotation.

24. The system as set forth in claim 17 above, wherein said computer output circuitry includes means for generating the machine command signal having a time delay determined by the processing of operands with said computer processing circuitry under control of the program stored in said main memory and wherein said machine control signal generated with said interface circuitry includes a time delay related to a characteristic of said machine.

25. The system as set forth in claim 17 above, wherein said computer output circuitry includes means for packing a plurality of digital bits into a digital word to generate the machine command signal in response to the processing of operands with said processing circuitry, wherein said storing means in said interface circuitry includes a register for storing the digital word, and wherein said machine control signal generating means in said interface circuitry includes a plurality of amplifiers wherein each amplifier provides for amplifying a different digital bit in said digital word stored in said storing means to generate a plurality of discrete control signals.

26. The system as set forth in claim 17 above, wherein said storing means in said interface circuitry includes a closed loop servo for storing the interface signal in response to the machine command signal to provide closed loop control of a machine operation.

27. The system as set forth in claim 17 above, further comprising a disk memory for generating a disk memory machine command signal, wherein said stored program computer in said machine control system further includes integrated circuit disk memory input command circuitry for generating a disk memory input machine command signal in response to the disk memory machine command signal from said disk memory, and wherein said processing circuitry includes means for processing operands stored in said operand memory in response to the disk memory input machine command signal from said disk memory input command circuitry under control of the program stored in said main memory.

28. The system as set forth in claim 17 above, further comprising:
an input interface for generating a plurality of input signals, said input interface including,
  (a) a momentary switch for generating a momentary switch input signal,
  (b) a keyboard for generating a plurality of keyboard input signals,
  (c) a typewriter for generating a typewriter input signal,
  (d) an input converter for generating a digital input signal in response to an analog signal,
  (e) a machine for generating a machine input signal,
  (f) a tape reader for generating a tape input signal, and
  (g) a disk memory for generating a disk input signal;
wherein said computer includes means for generating digital control signals in response to the plurality of input signals from said input interface and an output interface for performing output operations in response to the control signals, said output interface including
  (a) a printer for printing information in response to the control signals,
  (b) an output converter for generating an analog signal in response to the control signals,
  (c) a machine servo controller for controlling a machine tool along a contour in response to the control signals,
  (d) a data link for communicating information to a remote location in response to the control signals,
  (e) a tape recorder for recording information on a tape in response to the control signals, and
  (f) a disk memory for storing information in response to the control signals.

29. A machine control system comprising:
a data link for communicating input machine command signals from a remote computer;
an input command memory for storing input machine command signals communicated from said remote computer with said data link;
machine feedback means for generating a machine feedback signal related to a machine operation, said machine feedback means including (a) a transducer for generating a transducer signal in response to a controlled machine operation and (b) feedback interface circuitry for generating the machine feedback signal in response to the transducer signal from said transducer;

an integrated circuit stored program computer for generating a machine command signal in response to the machine feedback signal from said machine feedback means, wherein said computer includes (a) an integrated circuit main memory for storing a program, (b) an integrated circuit operand memory for storing machine control operands, (c) edit means for editing the input machine command signals stored in said input command memory under control of the program stored in said main memory, (d) integrated circuit command memory input circuitry for loading machine control operands into said operand memory in response to the input machine command signals stored in said input command memory, (e) integrated circuit machine feedback circuitry for processing the machine control operands stored in said operand memory in response to the machine feedback signal from said machine feedback means, (f) integrated circuit processing circuitry for processing the machine control operands stored in said operand memory in response to the computer input command signals stored in said input command memory under control of the program stored in said main memory, and (f) integrated circuit output circuitry for generating the machine command signal in response to the processing of the machine control operands with said machine feedback circuitry and with said processing circuitry; and interface circuitry for generating a machine control signal in response to the machine command signal from said computer output circuitry, said interface circuitry including (a) means for storing an interface signal in response to the machine command signal from said computer output circuitry and (b) means for generating the machine control signal in response to the interface signal stored with said storing means.

30. A machine control system comprising:

a data link for communicating machine commands from a remote location;

machine feedback means for generating a machine feedback signal related to a machine operation, said machine feedback means including (a) a transducer for generating a transducer signal in response to a controlled machine operation and (b) feedback interface circuitry for generating the machine feedback signal in response to the transducer signal from said transducer;

a stored program computer for generating a machine command signal in response to the machine feedback signal from said machine feedback means, said computer including (a) a computer main memory for storing a program, (b) machine input circuitry for generating a machine input signal in response to the machine feedback signal from said machine feedback means, (c) data link input circuitry for generating a data link input signal in response to the machine commands communicated with said data link, (d) processing circuitry for processing the machine input signal from said machine input circuitry in response to the data link input signal from said data link input circuitry under control of the stored program from said main memory, and (e) control circuitry for generating the machine command signal in response to the processing of the machine input signal with said processing circuitry; and interface circuitry for generating a machine control signal in response to the machine command signal from said computer processing circuitry, said interface circuitry including (a) means for storing an interface signal in response to the machine command signal from said computer output circutry and (b) control means for generating the machine control signal in response to the interface signal stored with said storing means.

31. The system as set forth in claim 30 above, further comprising a machine for performing a machine operation in response to the machine control signal from said interface means.

32. The system as set forth in claim 31 above, wherein said machine includes a translational member for translating a tool and a rotational spindle for rotating a workpiece, wherein said feedback means is a spindle feedback means for generating a machine spindle feedback signal related to a machine spindle rotational operation, and wherein said interface circuitry further includes means for controlling a translational operation for translating said tool in response to the machine control signal.

33. The system as set forth in claim 31 above, wherein said feedback means is a translational feedback means for generating the machine feedback signal related to translation of a plurality of machine axes and wherein said interface circuitry further includes means for controlling a multi-axis translational operation for translating said plurality of machine axes in response to the machine control signal from said interface circuitry.

34. The system as set forth in claim 30, above, wherein said stored program computer memory is an integrated circuit read only memory.

35. The system as set forth in claim 30 above, wherein said computer is an integrated circuit computer, wherein said computer mean memory includes an integrated circuit read only memory for storing the program and an integrated circuit alterable memory for storing information processed with said processing circuitry, wherein said machine input circuitry is integrated circuit machine input circuitry, wherein said data link input circuitry is integrated circuit data link input circuitry, wherein said processing circuitry is integrated circuit processing circuitry, and wherein said control circuitry is integrated circuit control circuitry.

36. The system as set forth in claim 30 above, wherein said transducer is a synchro for generating the machine feedback signal in response to motion of a machine element and wherein said control means includes a closed loop servo for controlling a machine in a closed loop manner in response to the interface signal stored with said storing means.

37. The system as set forth in claim 30 above, wherein said transducer includes a mechanical contact transducer having contact bounce, wherein said transducer signal includes contact bounce, and wherein said machine input circuitry includes means for compensating for the contact bounce of the machine feedback signal under control of the program stored in said computer main memory to generate the machine input signal in response to the machine feedback signal.

38. The system as set forth in claim 31 above, wherein said machine includes a rotary spindle for providing spindle rotation and a machine translation element for providing translation relative to spindle rotation in response to the machine control signal from said interface circuitry, wherein the machine control signal responsive machine operation is a spindle rotation operation, wherein said transducer is a spindle rotation transducer, wherein the transducer signal is a spindle rotation transducer signal, and wherein the machine feedback signal is related to spindle rotation.

39. The system as set forth in claim 30 above, wherein said control circuitry includes means for generating the machine command signal having a time delay determined by the processing of operands with said processing circuitry under control of the program stored in said computer main memory, and wherein said machine control signal generated with said control means includes a time delay for providing a delayed machine operation.

40. The system as set forth in claim 30 above, wherein said control circuitry includes means for packing a plurality of digital command bits into a digital command word to generate the machine command signal under control of the program stored in said computer main memory, wherein said storing means in said interface circuitry includes a register for storing the digital command word, wherein said control means in said interface circuitry includes a plurality of amplifiers, and wherein each amplifier provides for amplifying a different digital bit in said digital command word stored in said storing means to generate a plurality of discrete control signals.

41. The system as set forth in claim 30 above, wherein said storing means in said interface circuitry includes a closed loop servo for generating the interface signal to provide closed loop control of a machine operation.

42. A machine control system comprising:
a data link for communicating machine commands from a remote location;
machine feedback means for generating a machine feedback signal related to a machine operation, said machine feedback means including
(a) a transducer for generating a transducer signal in response to a controlled machine operation and
(b) feedback interface circuitry for generating the machine feedback signal in response to the transducer signal from said transducer;
a machine command memory for storing machine commands communicated with said data link from said remote location;
a stored program computer for generating a machine command signal in response to the machine feedback signal from said machine feedback means, wherein said computer includes
(a) a computer main memory for storing a program,
(b) machine input circuitry for generating a machine input signal in response to the machine feedback signal from said machine feedback means,
(c) edit means for editing the machine commands stored in said machine command memory under control of the program stored in said computer main memory,
(d) processing circuitry for processing the machine input signal from said machine input circuitry in response to the machine commands stored in said machine command memory under control of the program stored in said main memory, and
(e) control circuitry for generating the machine command signal in response to the processing of the machine commands with said processing circuitry; and
interface circuitry for generating a machine control signal in response to the machine command signal from said computer processing circuitry, said interface circuitry including
(a) means for storing an interface signal in response to the machine command signal from said computer output circuitry and
(b) control means for generating the machine control signal in response to the interface signal stored with said storing means.

43. A machine control system comprising:
a data link for communicating machine commands from a remote location;
a disk memory for storing the machine commands communicated with said data link as a disk command signal;
machine feedback means for generating a machine feedback signal related to a machine operation, said machine feedback means including
(a) a transducer for generating a transducer signal in response to a controlled machine operation and
(b) feedback interface circuitry for generating the machine feedback signal in response to the transducer signal from said transducer;
a stored program computer for generating a machine command signal in response to the machine feedback signal from said machine feedback means, wherein said computer includes
(a) a computer main memory for storing a program,
(b) machine input circuitry for generating a machine input signal in response to the machine feedback signal from said machine feedback means,
(c) disk input circuitry for generating a disk input signal in response to the disk command signal from said disk memory,
(d) processing circuitry for processing the machine input signal from said machine input circuitry in response to the disk command signal from said disk input circuitry under control of the program stored in said main memory, and
(e) control circuitry for generating the machine command signal in response to the processing of the machine input signal with said processing circuitry; and
interface circuitry for generating a machine control signal in response to the machine command signal from said computer processing circuitry, said interface circuitry including
(a) means for storing an interface signal in response to the machine command signal from said computer output circuitry and
(b) control means for generating the machine control signal in response to the interface signal stored with said storing means.

44. A control system comprising:
a feedback device for generating a feedback signal related to a monitored condition;
an operator command device for generating an operator command signal in response to operator actuation;
a data link for communicating a remote command signal from a remote computer;
an integrated circuit stored program computer for generating an output command signal in response to the feedback signal from said feedback device and in response to the command signals from said operator command device and from said data link, said computer including
(a) an integrated circuit main memory for storing a program,
(b) an integrated circuit operand memory for storing control-related operands,
(c) integrated circuit feedback input circuitry for generating a computer input feedback signal in response to the feedback signal from said feedback device,
(d) integrated circuit operator command input circuitry for generating a computer input operator command signal in response to the operator command signal from said operator command device,
(e) integrated circuit data link input circuitry for generating a computer input data link command signal in response to the remote command signal from said data link,
(f) integrated circuit processing circuitry for processing the control related operands stored in said operand memory to generate a time delay in response to the computer input feedback signal from said feedback input circuitry and in response to the input command signals from said operator command input circuitry and said data link input circuitry under control of the program stored in said main memory, and
(g) integrated circuit output circuitry for generating the output command signal after a time delay in response to the processing of control-related operands with said processing circuitry; and
interface circuitry for generating a control signal in response to the output command signal from said computer output circuitry to initiate a controlled operation after a feedback signal related time delay, said interface circuitry including
(1) a register for storing the output command signal and
(2) amplifying means for generating the control signal in response to the output command signal stored in said register.

45. The system as set forth in claim 44 above, further comprising a machine for operating in response to the control signal from said interface circuitry.

46. The system as set forth in claim 45 above, wherein said machine is a lathe, wherein said lathe includes a translational member for translating a tool and a rotational spindle for rotating a workpiece, wherein said feedback means is a spindle feedback means for generating a machine spindle feedback signal related to a machine spindle rotational operation, and wherein said control signal responsive controlled operation in a translational operation for translating said tool in response to the machine control signal from said interface circuitry.

47. The system as set forth in claim 44 above, wherein said stored program computer main memory includes an integrated circuit read only memory.

48. The system as set forth in claim 45 above, wherein said machine includes a rotary spindle for providing spindle rotation and a machine translation element for providing translation relative to spindle rotation in response to the machine control signal from said interface circuitry, wherein the machine feedback sigal related condition is a spindle rotation condition, wherein said feedback device is a spindle rotation transducer, wherein the feedback signal is a spindle rotation feedback signal, and wherein the feedback signal is related to spindle rotation.

49. The system as set forth in claim 44 above, wherein said computer output circuitry includes means for generating a time delayed output command signal having a time delay determined by the processing of the control-related operands with said computer processing circuitry under control of the program stored in said main memory.

50. A control system comprising:
a feedback device for generating a feedback signal related to a monitored condition;
an operator command device for generating an operator command signal in response to operator actuation;
a data link for communicating remote command signals from a remote computer;
an input command memory for storing the remote command signals from said data link;
an integrated circuit stored program computer for generating an output command signal in response to the feedback signal from said feedback device and in response to the command signal free said opertor command device and the remote command signals stored in said input command memory, said computer includes
(a) an integrated circuit main memory for storing a program,
(b) an integrated circuit operand memory for storing control-related operands,
(c) means for editing the input commands stored in said input command memory under control of the program stored in said main memory,
(d) integrated circuit feedback input circuitry for generating a computer input feedback signal in response to the feedback signal from said feedback device,
(e) integrated circuit operator command input circuitry for generating a computer input operator command signal in response to the operator command signal from said operator command device,
(f) integrated circuit command memory input circuitry for generating a computer input command memory signal in response to the remote command signals stored in said input command memory, (g) integrated circuit processing circuitry for processing the control-related operands stored in said operand memory to generate a time delay in response to the computer input feedback signal from said feedback input circuitry and in response to the input command signal from said operator command input circuitry and to response to the input command memory signal under control of the program stored in said main memory, and (g) integrated circuit output circuitry for generating the output command signal after a time delay in response to the processing of control-related operands with said processing circuitry; and interface circuitry for generating a control signal in response to the output command signal from said computer output circuitry to initiate a controlled operation after a feedback signal related time delay, said interface circuitry including
  (1) a register for storing the output command signal and
  (2) amplifying means for generating the control signal in response to the output command signal stored in said register.

* * * * *